(12) United States Patent
Patra et al.

(10) Patent No.: US 10,288,894 B2
(45) Date of Patent: May 14, 2019

(54) OPTICAL COMPONENT FOR USE IN A RADIATION SOURCE MODULE OF A PROJECTION EXPOSURE SYSTEM

(71) Applicant: Carl Zeiss SMT GmbH, Oberkochen (DE)

(72) Inventors: Michael Patra, Oberkochen (DE); Alexander Wolf, Oberkochen (DE); Markus Schwab, Hannover (DE); Toralf Gruner, Aalen-Hofen (DE); Joachim Hartjes, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 53 days.

(21) Appl. No.: 15/626,977

(22) Filed: Jun. 19, 2017

(65) Prior Publication Data

US 2017/0293154 A1    Oct. 12, 2017

Related U.S. Application Data

(63) Continuation of application No. PCT/EP2015/081166, filed on Dec. 23, 2015.

(30) Foreign Application Priority Data

Dec. 23, 2014  (DE) .................. 10 2014 226 917
Dec. 23, 2014  (DE) .................. 10 2014 226 918
(Continued)

(51) Int. Cl.
*G02B 27/28*  (2006.01)
*G02B 5/09*   (2006.01)
(Continued)

(52) U.S. Cl.
CPC ............. *G02B 27/283* (2013.01); *G02B 5/09* (2013.01); *G02F 1/1333* (2013.01); *G02F 1/29* (2013.01);
(Continued)

(58) Field of Classification Search
CPC ...... G02B 5/08; G02B 5/0808; G02B 5/0816; G02B 5/0819; G02B 5/09; G02B 5/10;
(Continued)

(56) References Cited

U.S. PATENT DOCUMENTS 4,653,903 A   3/1987  Torigoe et al.
4,788,698 A   11/1988 Kimura et al.
(Continued)

FOREIGN PATENT DOCUMENTS

CN    1664704 A    9/2005
CN    101295141 A  10/2008
(Continued)

OTHER PUBLICATIONS

Chinese office action, with English translation thereof, for corresponding CN Appl No. 201580070811.1, dated Jun. 22, 2018.
(Continued)

*Primary Examiner* — Arnel C Lavarias
(74) *Attorney, Agent, or Firm* — Fish & Richardson P.C.

(57) ABSTRACT

An optical component for coupling out an individual output beam from a collective output beam includes a plurality of radiation-reflecting regions which are grouped in such a way that regions of the same group serve for guiding different partial beams of the individual output beam to the same scanner.

20 Claims, 49 Drawing Sheets

(30) Foreign Application Priority Data

Dec. 23, 2014 (DE) .................. 10 2014 226 920
Dec. 23, 2014 (DE) .................. 10 2014 226 921

(51) Int. Cl.
| | | |
|---|---|---|
| *G03F 7/20* | (2006.01) | |
| *G02F 1/1333* | (2006.01) | |
| *G02F 1/29* | (2006.01) | |
| *G02B 27/10* | (2006.01) | |
| *B29C 55/02* | (2006.01) | |
| *G02F 1/315* | (2006.01) | |

(52) U.S. Cl.
CPC .......... *G03F 7/702* (2013.01); *G03F 7/70033* (2013.01); *G03F 7/70208* (2013.01); *G03F 7/70558* (2013.01); *G03F 7/70991* (2013.01); *B29C 55/023* (2013.01); *G02B 27/10* (2013.01); *G02F 1/315* (2013.01)

(58) Field of Classification Search
CPC ........... G02B 27/0012; G02B 27/0025; G02B 27/0031; G02B 27/09; G02B 27/0905; G02B 27/0927; G02B 27/0938; G02B 27/0977; G02B 27/0983; G02B 27/10; G02B 27/106; G02B 27/14; G02B 27/143
USPC ....... 359/350, 351, 359, 360, 618, 619, 620, 359/625, 626, 627, 628, 636, 838, 850, 359/851, 854, 855, 864, 865, 866; 355/67
See application file for complete search history.

(56) References Cited

U.S. PATENT DOCUMENTS

| | | | | |
|---|---|---|---|---|
| 5,073,702 | A * | 12/1991 | Schuhmacher | G06K 7/10871 235/462.22 |
| 5,394,451 | A | 2/1995 | Miyake et al. | |
| 5,825,844 | A | 10/1998 | Miyake et al. | |
| 6,009,143 | A * | 12/1999 | Acosta | G03F 7/702 378/34 |
| 6,198,793 | B1 | 3/2001 | Schultz et al. | |
| 6,229,639 | B1 | 5/2001 | Ozarski et al. | |
| 9,541,839 | B2 * | 1/2017 | Hosier | G03F 7/70033 |
| 2004/0036037 | A1 | 2/2004 | Schulz et al. | |
| 2005/0146702 | A1 | 7/2005 | Eurlings et al. | |
| 2005/0195380 | A1 | 9/2005 | Sytsma et al. | |
| 2005/0200821 | A1 * | 9/2005 | Gui | G03F 7/70275 355/67 |
| 2006/0158288 | A1 | 7/2006 | Rossmanith et al. | |
| 2007/0152171 | A1 | 7/2007 | Goldstein et al. | |
| 2008/0055579 | A1 | 3/2008 | Cobb et al. | |
| 2008/0267248 | A1 | 10/2008 | Lee et al. | |
| 2010/0165318 | A1 | 7/2010 | Fiolka et al. | |
| 2010/0213070 | A1 | 8/2010 | Oki et al. | |
| 2012/0105818 | A1 * | 5/2012 | Van Schoot | G03F 7/70075 355/67 |
| 2012/0194794 | A1 * | 8/2012 | Tychkov | G03F 7/70116 355/67 |
| 2012/0287414 | A1 * | 11/2012 | Fiolka | G03F 7/70075 355/67 |
| 2014/0197140 | A1 | 7/2014 | Unrath | |
| 2016/0187785 | A1 * | 6/2016 | Deguenther | G03F 7/70075 355/67 |
| 2016/0225477 | A1 * | 8/2016 | Banine | G02B 27/0025 |
| 2016/0252823 | A1 | 9/2016 | Patra et al. | |

FOREIGN PATENT DOCUMENTS

| | | |
|---|---|---|
| CN | 102866600 A | 1/2013 |
| DE | 103 58 225 B3 | 6/2005 |
| DE | 10 2004 013 886 A1 | 10/2005 |
| DE | 10 2013 211 830 A1 | 6/2014 |
| DE | 10 2013 223 808 A1 | 12/2014 |
| DE | 10 2013 223 935 A1 | 5/2015 |
| EP | 1 072 957 A2 | 1/2001 |
| JP | 2000-021748 A | 1/2000 |
| WO | WO 2009/100856 A1 | 8/2009 |
| WO | WO 2009/121438 A1 | 10/2009 |
| WO | WO 2011/138259 A1 | 11/2011 |
| WO | WO 2012/130768 A2 | 10/2012 |
| WO | WO 2013/160256 A1 | 10/2013 |

OTHER PUBLICATIONS

German Examination Report, with translation thereof, for corresponding DE Appl No. 10 2014 226 917.2, dated Aug. 25, 2015.
German Examination Report, with translation thereof, for corresponding DE Appl No. 10 2014 226 918.0 dated Aug. 26, 2015.
German Examination Report, with translation thereof, for corresponding DE Appl No. 10 2014 226 921.0, dated Aug. 28, 2015.
Uwe Schindler, "Ein supraleitender Undulator mit elektrisch umschaltbarer Helizität," Karlsruhe Research Centre in the Helmholtz Association, scientific reports, FZKA 6997, Aug. 2004, English abstract at p. iii.
International Search Report and Written Opinion for corresponding PCT Appl No. PCT/EP2015/081166, dated Apr. 20, 2016.

* cited by examiner

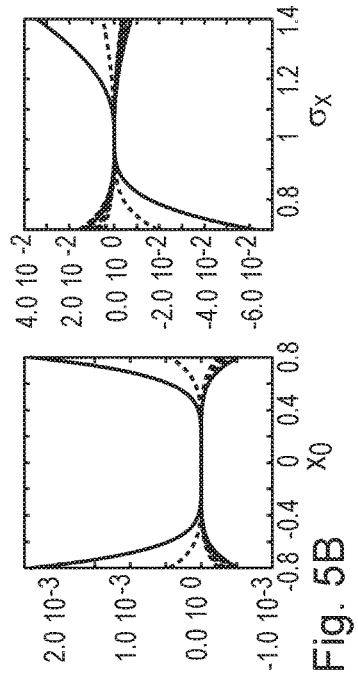
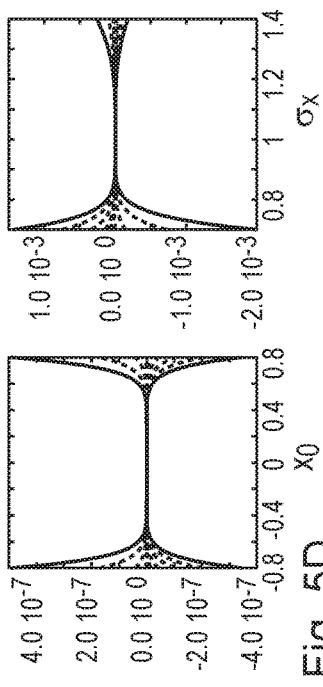
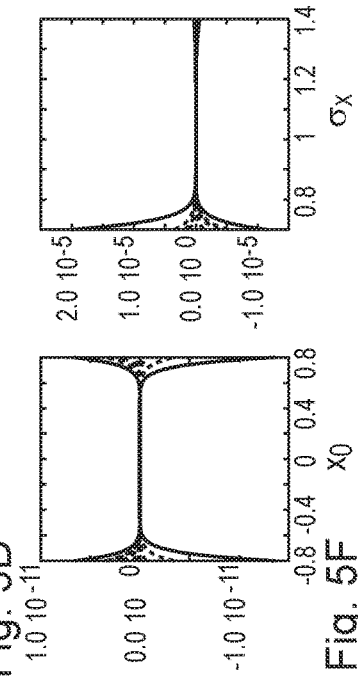
Fig. 5B  Fig. 5D  Fig. 5F
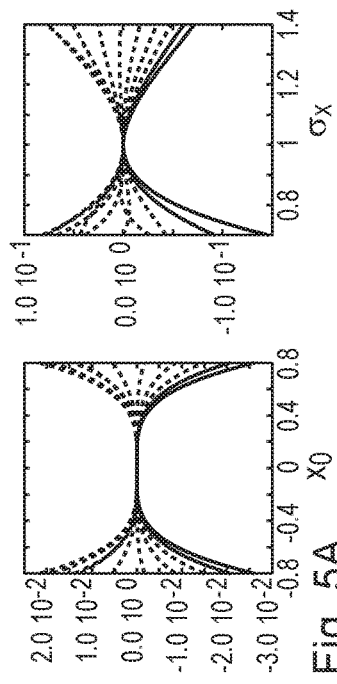
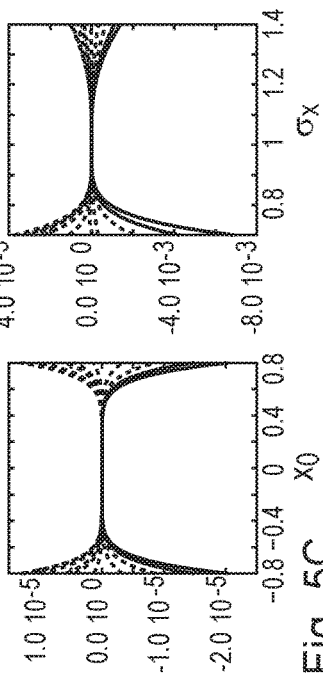
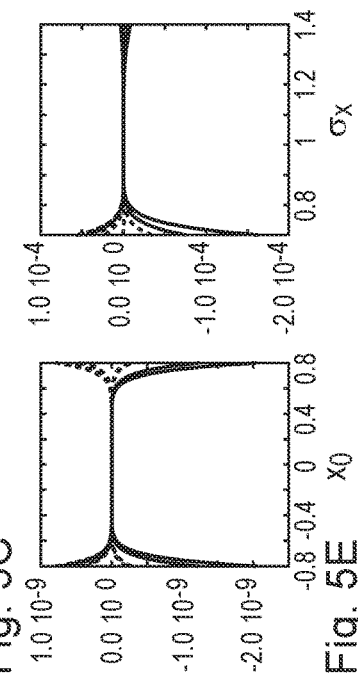
Fig. 5A  Fig. 5C  Fig. 5E

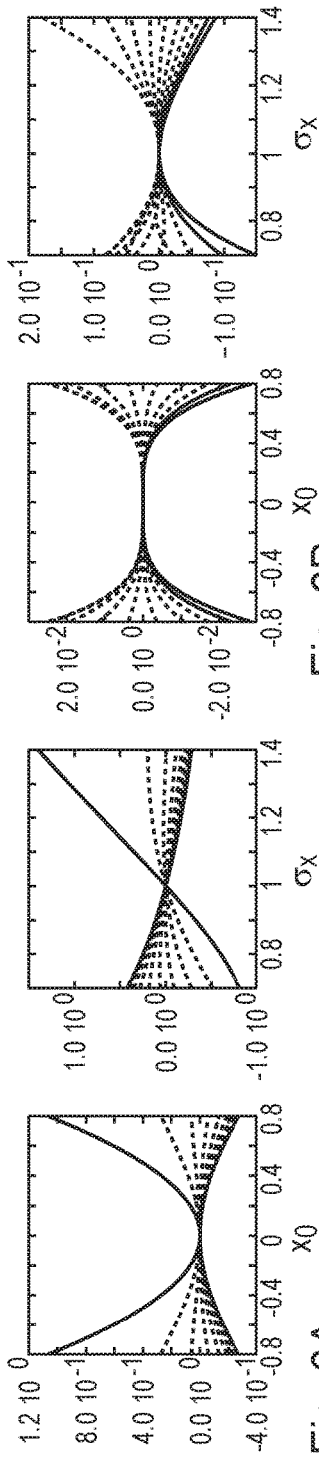
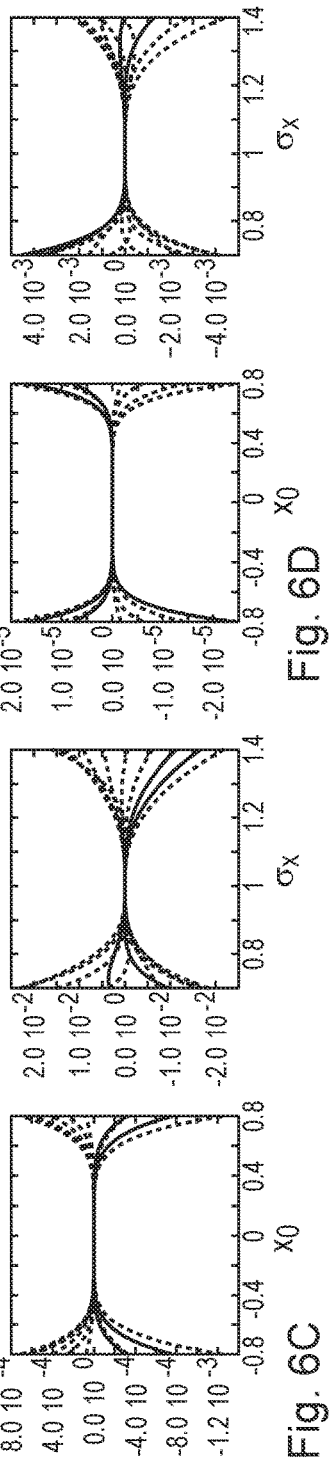
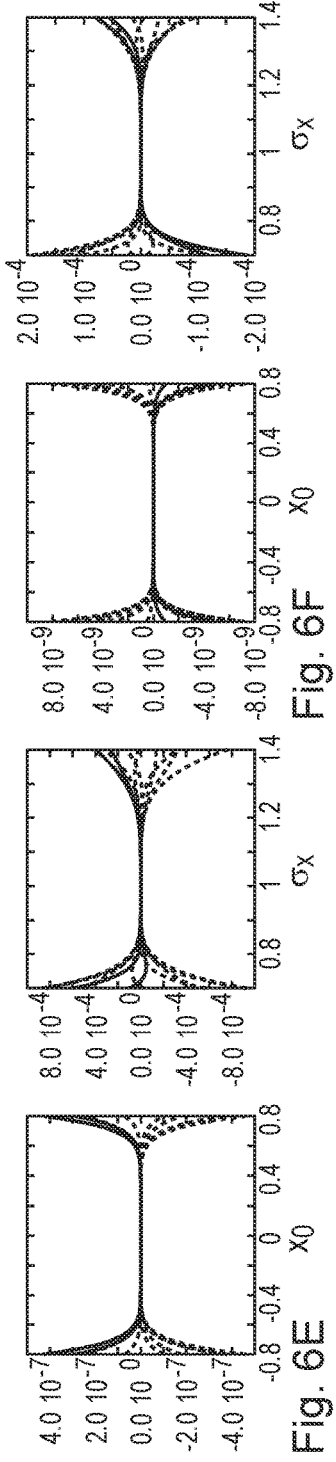
Fig. 6A  Fig. 6B  Fig. 6C  Fig. 6D  Fig. 6E  Fig. 6F

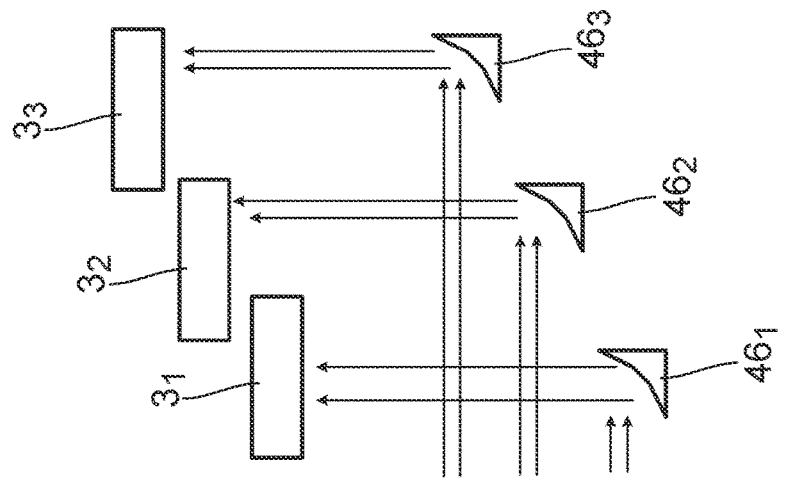
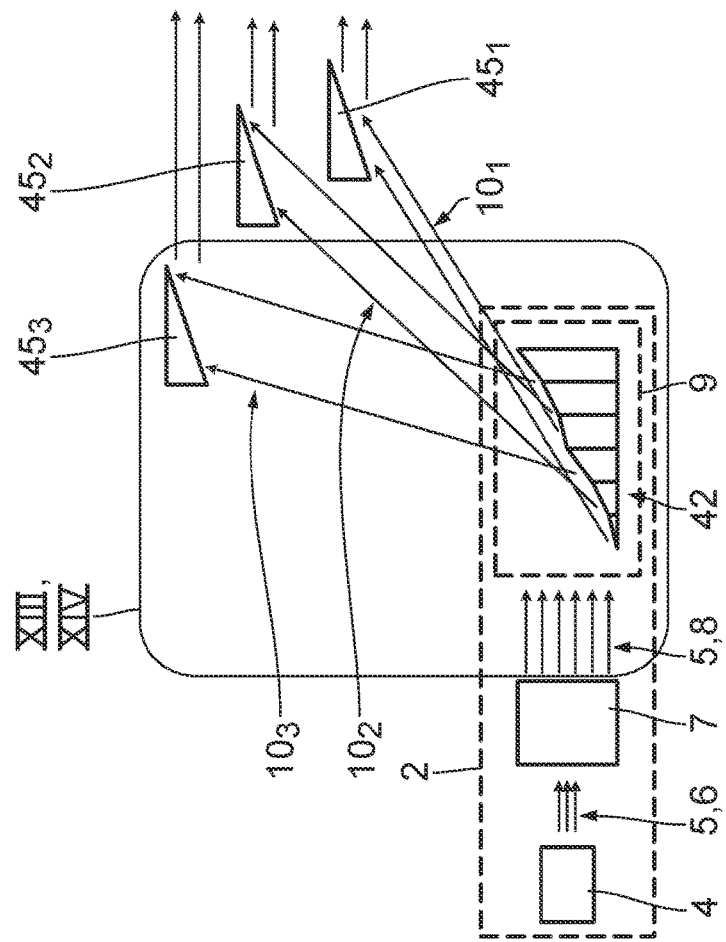
Fig. 10

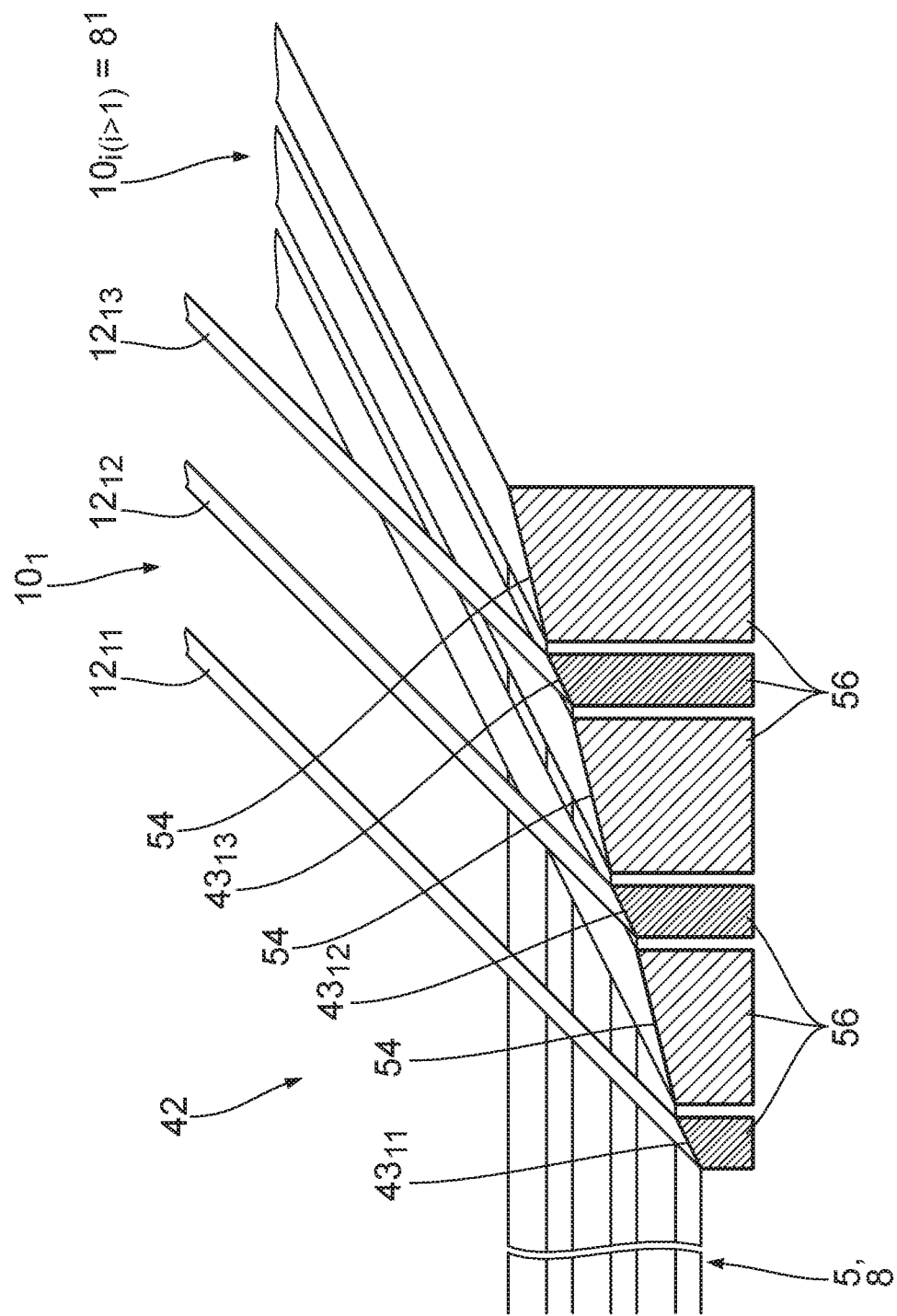

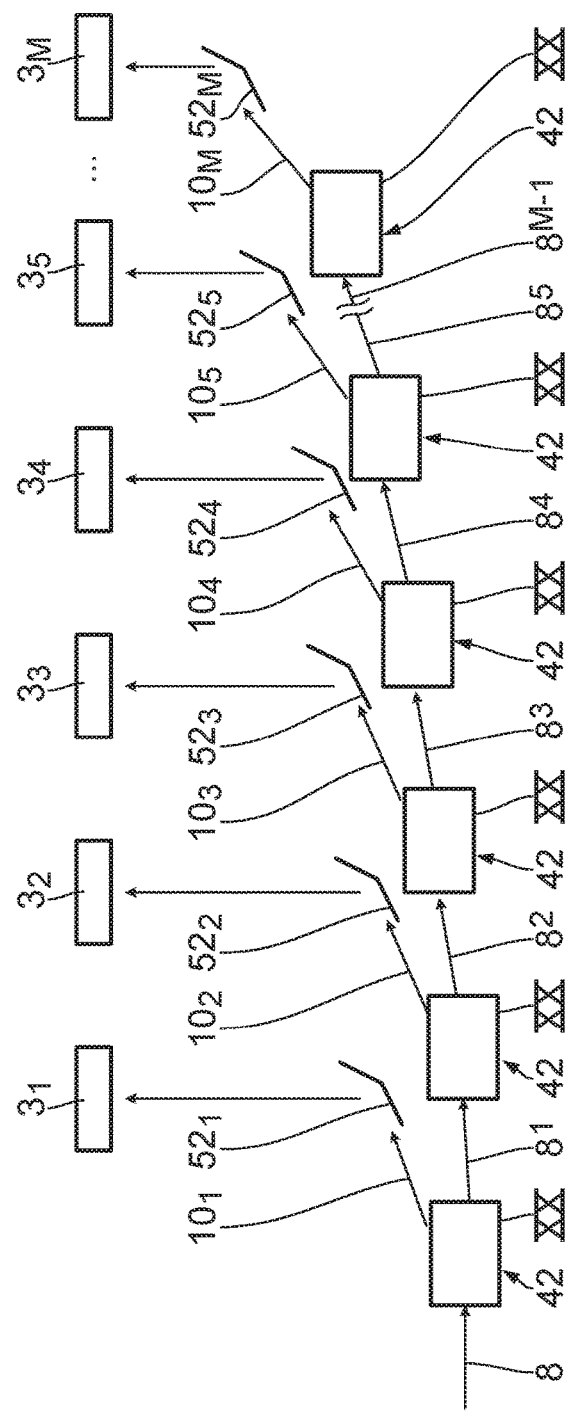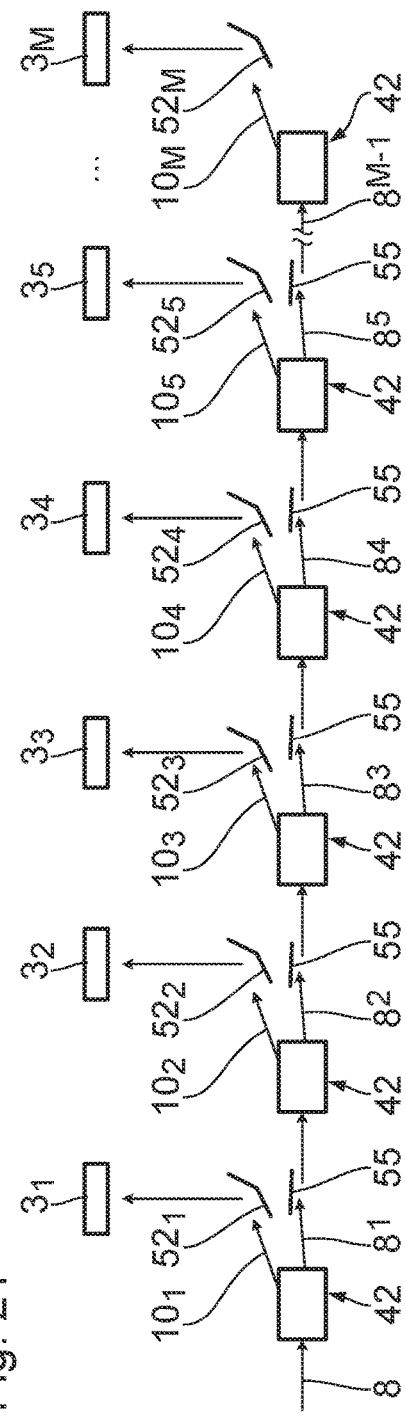

OPTICAL COMPONENT FOR USE IN A RADIATION SOURCE MODULE OF A PROJECTION EXPOSURE SYSTEM

CROSS-REFERENCE TO RELATED APPLICATIONS

The present application is a continuation of, and claims benefit under 35 USC 120 to, international application PCT/EP2015/081166, filed Dec. 23, 2015, which claims benefit under 35 USC 119 of German Application Nos. 10 2014 226 918.0, 10 2014 226 920.2, 10 2014 226 921.0, 10 2014 226 917.2, filed Dec. 23, 2014. The entire disclosure of these applications are incorporated by reference herein.

FIELD

The disclosure relates to an optical component for a radiation source module of a projection exposure system including a plurality of scanners. The disclosure relates, in particular, to an optical component which serves for coupling out from a collective output beam at least one individual output beam which is assigned to a specific one of the scanners. The disclosure additionally relates to an output coupling optical unit for coupling out individual output beams from a collective output beam. Furthermore, the disclosure relates to an illumination device for a projection exposure system including a plurality of scanners. Furthermore, the disclosure relates to a radiation source module for supplying a plurality of scanners of a projection exposure system with illumination radiation, and to an illumination system for a projection exposure system including such a radiation source module. Moreover, the disclosure relates to a projection exposure system including a plurality of projection optical units. Finally, the disclosure relates to a method for designing an optical component for coupling out at least one individual output beam from a collective output beam, to a method for producing nanostructured components, and to a component produced according to the method.

BACKGROUND

A free electron laser (FEL) can serve as a radiation source for a projection exposure system including a plurality of scanners. An FEL emits illumination radiation with an intensity profile which can be subject to fluctuations. Such fluctuations can have the effect that the energy proportion of the illumination radiation which is guided to a specific one of the scanners varies. This can lead, in particular, to dose fluctuations of the individual scanner.

SUMMARY

The disclosure to seeks reduce, in particular to prevent, such dose fluctuations.

In one aspect, the disclosure provides an optical component for a radiation source module of a projection exposure system including a plurality of scanners. The optical component serves for coupling out from a collective output beam at least one individual output beam including a plurality of spatially separated partial beams which is assigned to a specific one of the scanners. The optical element includes a plurality of separate radiation-reflecting regions grouped so that regions of the same group serve for guiding the different partial beams of one of the individual output beam to the same scanner. The radiation-reflecting regions of a group are embodied in each case in a mutually non-connected fashion.

The disclosure also provides an output coupling optical unit including such an optical component, an illumination device including such an output coupling optical unit, and a radiation source module including such an output coupling optical unit, and via an illumination system including such a radiation source module, and a projection exposure system including a corresponding illumination device. Moreover, the disclosure provides a method for controlling the division of illumination radiation emitted by a common radiation source among a plurality of scanners, and via a method for designing the abovementioned optical component.

According to the disclosure, it has been recognized that spatial or static and/or temporal or dynamic aspects can be used for reducing, in particular for avoiding, dose fluctuations. The spatial aspects can in particular be advantageously combined arbitrarily with the temporal aspects. Firstly, spatial and temporal aspects of the disclosure are described separately from one another below. This merely serves to reduce the complexity of the description.

In an aspect, the disclosure provides an optical component including a plurality of separate radiation-reflecting regions, wherein the regions are grouped in such a way that regions of the same group serve for guiding different partial beams of an individual output beam to a specific scanner, wherein the radiation-reflecting regions of a group are embodied in each case in a mutually non-connected fashion. The regions of a group are embodied, in particular, in such a way that they enable a variation of a division ratio of the collective output beam into the individual output beams. The optical component is improved as a result.

According to the disclosure, it has been recognized that dose fluctuations of the individual scanner on account of fluctuations of the intensity profile of the illumination radiation emitted by the radiation source can be reduced via such an embodiment of the optical component.

The heart of the disclosure is the insight that there is a systematic way of determining the arrangement and/or embodiment, that is to say the geometrical characteristic of the individual regions, if the radiation source has a fluctuation range which can be described by a small number of continuous parameters. Furthermore, it has been recognized that the design of the regions can be optimized via a corresponding systematic determination of the arrangement and/or embodiment of the regions. It is possible, in particular, to guarantee the minimum achievable dose fluctuations for a known, predefined fluctuation range of the radiation source, in particular of the FEL.

A variation of the division ratio of the collective output beam, in particular the total intensity thereof, into individual output beams having individual intensities is possible for example via a displacement of the optical component, in particular of the regions which serve for guiding the partial beams of the individual output beams, relative to the collective output beam. In this case, the optical component can be displaced. It may also be advantageous to displace the collective output beam, for example via a displaceable mirror, and to arrange the optical component in a stationary fashion. Details are described even more specifically below.

The regions are, in particular, separate mechanical elements, in particular separate mirror elements. Different geometrical regions of a single component, in particular separate radiation-reflecting regions of a single mirror element, can also be involved.

An individual output beam should be understood to mean that part of the illumination radiation emitted by the radiation source which is assigned in each case to a specific scanner. The individual output beam can include a multiplicity of partial beams, in particular a multiplicity of spatially separated partial beams.

The collective output beam should be understood to mean the entire beam including illumination radiation that is emitted by the radiation source, in particular before division into individual output beams. The collective output beam can be, in particular, the raw beam including illumination radiation which, if appropriate, is shaped in a beam shaping optical unit and is emitted by the radiation source.

The optical component according to the disclosure serves, in particular, for reducing dose fluctuations on account of fluctuations of the geometrical beam properties of the radiation source. The relevant geometrical beam properties of the radiation source in this case include, in particular, the pointing of the output beam, that is to say the direction in which the illumination radiation is emitted from the radiation source, and the divergence of the output beam.

The grouping of the regions is fixedly predefined, in particular. The optical component, in particular the embodiment and arrangement of the regions, is adapted in particular to the geometrical beam properties of the radiation source and the possible fluctuations thereof. A method for correspondingly designing the optical component is described in even more specific detail below.

The regions are radiation-reflecting regions, in particular. They each have an area of at least 100 $\mu m^2$, in particular at least 1000 $\mu m^2$, in particular at least 10 000 $\mu m^2$.

Between two regions of the same group, there can be arranged in each case a radiation-transmissive region or at least one region of at least one other group. To put it illustratively, the illumination radiation emitted by the radiation source is chopped into disjoint partial regions by the optical component according to the disclosure. Via the optical component, in particular that proportion of the illumination radiation which is guided to a specific scanner is divided into a plurality of disjoint partial beams. Consequently, a collective output beam generated via the radiation source is firstly divided into individual output beams which are guided to the individual scanners. Secondly, the individual output beams are divided into separate partial beams by the disjoint partial regions of the optical component. The partial regions are embodied and arranged in such a way that fluctuations of the beam properties of the radiation source on account of the grouping of the partial regions into groups in total precisely cancel one another out. The definition of which regions are intended to be guided to which scanner, that is to say which regions are intended to belong to which group, is carried out according to the method described in even more specific detail below.

According to the disclosure, it has been recognized that, via a suitable division of the phase space of the radiation source, in particular of the FEL, into separate regions and suitable combination, that is to say grouping, of these regions into groups, dose fluctuations during the exposure of a wafer on account of fluctuations of the geometrical beam properties of the radiation source can be reduced, in particular eliminated up to a predefined order. The phase space of a radiation source or of a radiation beam is spanned by two spatial coordinates and two direction coordinates and is therefore four-dimensional. The used region of the phase space is also referred to as the etendue. With the use of a radiation source having a low etendue, the used region of the phase space along two of the four dimensions can be so small that only dependencies along the other two dimensions are taken into account. In this case, it can be stated that the phase space shall effectively be only two-dimensional.

It has been found that with the aid of the optical component according to the disclosure it is possible for a plurality of scanners, in the case of predefined maximum direction and/or divergence fluctuations of the illumination radiation emitted by the radiation source, nevertheless to be supplied with illumination radiation uniformly and stably. In this case, in the design of the optical component, it is possible to predefine what should be understood by uniformly and stably, in particular what dose fluctuations are maximally allowed, or up to what order the direction and/or divergence fluctuations are intended to be compensated for.

Firstly, further aspects of the optical component will be described.

In accordance with one aspect of the disclosure, the regions of a group have at least in part, in particular in pairs, different surface areas. In each case at least two of the regions of a group have, in particular, surface areas which differ by a factor of at least 3, in particular at least 5, in particular at least 10. The surface areas of the regions of a group differ at most by a factor of 100.

Regions of different sizes can take account of the fact that different segments of the phase space contribute different proportions to the total energy of the output beams.

In accordance with a further aspect of the disclosure the number of regions in a group is in the range of 3 to 20, in particular in the range of 5 to 10. The total number of different regions results as the sum of the regions of the different scanners. The total number of regions can be more than 50. It can be up to 200, in particular up to 300. The number of regions in a group can in particular correspond in each case precisely to the maximum order of the divergence fluctuations up to which compensation is effected, or can be greater than the order by 1. It has been possible to show that this is sufficient for the compensation of divergence fluctuations up to this order.

The regions can be arranged symmetrically with respect to an axis of symmetry. The number of regions can then relate to the number of regions on each of the two sides of the axis of symmetry.

In accordance with one aspect of the disclosure, the individual regions are embodied monolithically. They can also be composed of a plurality of individual mirrors. The number of individual mirrors which form a specific region is in particular at most 20, in particular at most 10, in particular at most 5, in particular at most 3, in particular at most 2, in particular 1.

The mechanical complexity of the optical component is reduced by such an embodiment of the regions. In particular, the production of the optical component is simplified as a result.

In accordance with a further aspect of the disclosure, at least two of the regions of the optical component belong to different groups, wherein the regions of different groups serve for coupling out different individual output beams and for guiding the same to different scanners.

The optical component can include, in particular, regions for coupling out all the individual output beams. The number of groups of the optical component into which the individual regions are grouped is in particular in the range of 4 to 20, in particular in the range of 5 to 15, in particular in the range of 6 to 10. It corresponds, in particular, precisely to the number of different scanners of the projection exposure system.

In accordance with one alternative, all regions of the optical component belong to the same group. In other words, they serve for guiding partial beams of the same individual output beam to one and the same scanner.

In accordance to a further alternative, the optical component is embodied in such a way that in each case exactly one of the individual output beams is coupled out, while all of the remaining individual output beams are deflected jointly, that is to say by an identical deflection angle.

In accordance with a further aspect of the disclosure, between at least two regions of the optical component there is arranged an interspace which is transmissive to partial beams of at least one individual output beam.

In this case, the optical component serves in particular for coupling out exactly one of the individual output beams, while the remaining individual output beams are not influenced, in particular not deflected, by the component.

In accordance with a further aspect of the disclosure, the regions are embodied in each case in a strip-shaped fashion, wherein at least one of the regions, in particular one of the regions of each group, has an aspect ratio of at least 20:1, in particular at least 30:1, in particular at least 50:1, in particular, at least 100:1.

According to the disclosure, it has been recognized that in the case of a radiation source which emits illumination radiation having a Gaussian profile, it suffices to structure the phase space of the illumination radiation in a separating plane along an axis, that is to say to chop the separating plane into strips, in particular into parallel strips. This can be attributed, in particular, to the fact that a two-dimensional Gaussian function factorizes. Variations of the Gaussian parameters in the orthogonal direction in each case do not change the total energy on the individual strips, but rather only the energy distribution on the respective strips. A strip-shaped embodiment of the regions facilitates the production of the optical component.

The regions can be embodied, in particular, as rectangular strips. However, the strips can also have an extent that is variable with respect to one direction. This is advantageous, in particular, if the strips have in a direction perpendicular thereto such a large extent that only in each case a partial region of each strip is illuminated at a specific point in time. A displacement of the illumination region on the strips then makes it possible to control the division ratio of the collective output beam into the individual output beams. The aspects of the control of the division ratio of the collective output beam into the individual output beams are also referred to as temporal or dynamic aspects. They will be described in even more specific detail below.

In an aspect, the disclosure provides an output coupling optical unit including at least one optical component according to the description above. The output coupling optical unit is improved as a result. The advantages are evident from those of the optical component.

In accordance with one aspect of the disclosure, the output coupling optical unit includes exactly one optical component of this type. The latter then serves for coupling out all the individual output beams from the collective output beam.

In accordance with one alternative, the output coupling optical unit includes a plurality of optical components according to the description above. Provision can be made, in particular, for providing a dedicated corresponding optical component for each of the scanners. Here each of the optical components can serve in each case for coupling out a single individual output beam.

Intermediate stages in which the optical component includes regions of different groups, but the number of groups of one of the optical components of the output coupling optical unit is smaller than the number of scanners, are likewise possible.

In an aspect, the disclosure provides an output coupling optical unit in which the means for dividing the collective output beam into individual output beams includes a means for varying a division ratio of the total intensity of the collective output beam into the individual intensities of the individual output beams.

In this case, output coupling optical unit denotes the optical device which serves for dividing a raw beam including illumination radiation that is emitted by a common radiation source unit, if appropriate after the raw beam has been shaped to form a collective output beam, into individual output beams, wherein each of the individual output beams is assigned to a specific scanner, in particular to a specific beam guiding optical unit. Different individual output beams serve in each case for illuminating different object fields, in particular spatially separate object fields.

The collective output beam can be divided into at least two, in particular at least three, in particular at least five, in particular at least eight, in particular at least ten, individual output beams. The number of individual output beams corresponds, in particular, precisely to the number of scanners of the projection exposure system. The number is at most 30.

According to the disclosure, it has been recognized that the stability of the scan-integrated intensity of the illumination of the individual objects fields and thus the dose stability for illuminating the wafers can be improved via the variation of the division ratio of the total intensity of the collective output beam into individual intensities of the individual output beams.

The output coupling optical unit includes, in particular, a means for temporally varying the division ratio of the total intensity of the collective output beam into the individual intensities of the individual output beams. The division ratio can be varied in particular in a manner controlled in a targeted manner. It can also be varied periodically. According to the disclosure, it has been recognized that, for the dose stability during the exposure of the wafer, less importance is attached to the stability of the instantaneous illumination of the wafer, rather the stability of the scan-integrated total intensity during the exposure of the wafer is of importance. The dose stability overall can be significantly improved via a variation, in particular a temporal variation, of the division ratio of the total intensity into the individual intensities.

A variation of the division ratio of the total intensity can be achieved by targeted attenuation of one or a plurality, in particular a targeted selection, of the individual output beams. A variation of the division ratio of the total intensity can also include a redistribution of the intensities of the individual output beams, that is to say that part of the individual intensity of one of the individual output beams is fed to another of the individual output beams in a targeted manner.

The variation can be carried out in a temporally controlled manner, in particular. The corresponding aspects are therefore also referred to as temporal or dynamic aspects.

In accordance with one aspect of the disclosure, the means for dividing the collective output beam into individual output beams includes at least one beam guiding element which is embodied in such a way that, depending on its relative position with respect to the collective output beam, it leads to divisions of the collective output beam into individual output beams for which the distribution of the total intensity of the collective output beam among the individual output beams is different. The beam guiding element is in particular displaceable, in particular displaceable in an actuatable manner. It can also be displaceable periodically. Instead of the beam guiding element, the collective output beam can also be displaceable. Provision is made, in particular, for embodying the impingement position of the output beam on the beam guiding element in a variable fashion, in particular in a manner displaceable in a controlled fashion. With the aid of such a beam guiding element, a targeted variation of the division ratio of the total intensity of the collective output beam into the individual intensities of the individual output beams is possible in a simple manner. Such a beam guiding element additionally enables a simple control of the variation of the division ratio of the total intensity to the individual intensities.

The beam guiding element is also referred to as separating component. The separating component includes, in particular, at least one radiation-reflecting element. It additionally includes at least one displaceable element, in particular at least one element displaceable in an actuatable manner. The at least one displaceable element can be identical to the at least one radiation-reflecting element. Different, separate elements can also be involved.

The at least one displaceable element can be displaced via a piezo-actuator. Piezo-actuators allow a precise and very fast displacement. The displacement can be carried out more rapidly than 1 ms, in particular more rapidly than 100 μs, in particular more rapidly than 10 μs. A rotational displacement or tilting can be achieved via a piezo-actuator and an axis. A tilting can be achieved via two piezo-actuators driven oppositely. Via an electromagnetic actuator, for example a plunger coil drive, a displacement by large distances can be carried out. The displacement can be carried out in particular by at least 100 μm, in particular 1 mm, in particular 10 mm.

The actuator is preferably suitable for vacuum, that is to say that vacuum is not detrimental to its operation. Preferably, the actuator does not outgas, that is to say that it does not emit any gaseous substances, at least no gases which can react chemically or be activated under EUV radiation. Preferably, the movement of the actuator and/or of the component moved by the actuator has the effect that no small particles of a solid material are released, in particular no particles having sizes of between 1 nm and 1 μm.

The radiation-reflecting element of the separating component is larger in one direction than the instantaneous illumination on it that is brought about by the collective output beam. The collective output beam thus leads to the illumination of only a partial region of the radiation-reflecting element of the separating component. The partial region makes up in particular at most 50%, in particular at most 20%, in particular at most 10%, in particular at most 5%, of the entire reflection area of the radiation-reflecting element of the separating component.

That partial region of the radiation-reflecting element which is illuminated by the collective output beam includes, for its part, different radiation-reflecting regions which are assigned to the different scanners, that is to say which lead to the transfer of specific individual output beams to specific scanners.

Different partial regions of the radiation-reflecting element of the separating component differ for example in the relative size of the different regions assigned to the different scanners. Via a displacement of the collective output beam relative to the radiation-reflecting element of the separating component, the division ratio of the collective output beam to the individual output beams can therefore be varied in a simple manner. Details and particulars will become apparent from the description of different exemplary embodiments.

In an aspect, the disclosure provides an illumination device including an output coupling optical unit according to the description above. The illumination device is improved as a result.

The advantages are in turn evident from those of the optical component.

In an aspect, the disclosure provides a radiation source module including at least one radiation source for generating a collective output beam and at least one output coupling optical unit according to the description above. The radiation source module is improved as a result.

The radiation source module includes, in particular, at least one output coupling optical unit including at least one means for dividing a collective output beam into a plurality of individual output beams, wherein the means for dividing the collective output beam includes a means for varying a division ratio of the total intensity of the collective output beam into the individual intensities of the individual output beams.

The radiation source is, in particular, a free electron laser (FEL) or a synchrotron-based radiation source.

The radiation source emits, in particular, illumination radiation in the EUV range, in particular in the wavelength range of between 2 nm and 30 nm, in particular between 2 nm and 15 nm, in particular of 13.5 nm or 6.7 nm.

In accordance with one aspect of the disclosure, the output coupling optical unit of the radiation source module is designed in such a way that intensity distributions of all of the individual output beams which are guided in each case to different scanners, in particular to different object fields, given a known fluctuation range of the collective output beam emitted by the radiation source have fluctuations which are smaller than a predefined maximum value. The fluctuation amplitude of the divergence can be up to 70% of the nominal divergence. It is in particular at most 50%, in particular at most 25%, in particular at most 10%, of the nominal divergence. The fluctuation amplitude of the pointing, that is to say of the direction of the centroid ray, can be up to 70% of the nominal divergence. It is in particular at most 50%, in particular at most 25%, in particular at most 10%, of the nominal divergence.

The predefined maximum value for the fluctuations of the intensity, in particular of the total intensity, of the single individual output beams is in particular a maximum of 1%, in particular a maximum of 5%, in particular a maximum of 3%, in particular a maximum of 2%, in particular a maximum of 1%, in particular a maximum of 0.5%, in particular a maximum of 0.3%, in particular a maximum of 0.2%, and in particular a maximum of 0.1%.

The fluctuation range of the collective output beam emitted by the radiation source includes, in particular, fluctuations of the direction of the emitted collective output beam (pointing) and/or divergence fluctuations of the collective output beam.

In accordance with one aspect of the disclosure, the radiation source module includes a device for periodically varying the division ratio of the total intensity of the collective output beam into the individual intensities of the individual output beams. The variation of the division ratio has in particular a period $T_{Var}$ which is at most 10 ms, in particular at most 5 ms, in particular at most 3 ms, in particular at most 2 ms, in particular at most 1 ms, in particular at most 0.5 ms, in particular at most 0.3 ms, in particular at most 0.2 ms, in particular at most 0.1 ms, in particular at most 0.05 ms, in particular at most 0.03 ms, in particular at most 0.02 ms, in particular at most 0.01 ms.

The period $T_{Var}$ of the variation of the division ratio is in particular shorter than the time $T_{Scan}$ by a point on the wafer to pass through the scan slot. It holds true in particular that: $T_{Var}:T_{Scan} \leq 1$, in particular $T_{Var}:T_{Scan} \leq 0.5$, in particular $T_{Var}:T_{Scan} \leq 0.3$, in particular $T_{Var}:T_{Scan} \leq 0.3$, in particular $T_{Var}:T_{Scan} \leq 0.2$, in particular $T_{Var}:T_{Scan} \leq 0.1$, in particular $T_{Var}:T_{Scan} \leq 0.05$, in particular $T_{Var}:T_{Scan} \leq 0.03$, in particular $T_{Var}:T_{Scan} \leq 0.02$, in particular $T_{Var}:T_{Scan} \leq 0.01$.

This ensures that the scan-integrated dose for illumination an arbitrary point on the wafer can be kept constant.

Preferably, the time $T_{Scan}$ by a point on the wafer to pass through the scan slot is precisely an integral multiple of the period $T_{Var}$. As an alternative and/or in addition thereto, the scan time $T_{Scan}$ is significantly greater than the period $T_{Var}$, in particular $T_{Scan}:T_{Var} \geq 100$, in particular $T_{Scan}:T_{Var} \geq 1000$. This, too, achieves the effect that every region on the wafer is illuminated substantially with a dose averaged over the entire period of the variation of the division ratio.

In accordance with a further aspect of the disclosure, the radiation source module includes at least one means for controlling the total intensity of the collective output beam.

The absolute radiation dose for the exposure of the wafer can be controlled by a control of the total intensity. The control of the total intensity of the collective output beam is possible very rapidly. It can be controlled in particular with a frequency of at least 10 kHz, in particular at least 100 kHz, in particular at least 1 MHz, in particular at least 10 MHz, in particular at least 100 MHz, in particular 1 GHz. The absolute radiation dose is precisely controllable by closed-loop control. It is controllable by closed-loop control in particular with an accuracy of better than 1%, in particular better than 1%, in particular better than 0.1%. Such a high accuracy can be achieved in particular with the aid of a feedback loop.

The control of the total intensity of the collective output beam can be achieved with the aid of a beam shaping optical unit serving in particular for shaping the collective output beam from a raw beam including illumination radiation that is emitted by the radiation source unit.

In accordance with one aspect of the disclosure, the radiation source itself, in particular for generating the raw beam, is controllable. The radiation source, which can also be a radiation source unit including one or a plurality of radiation sources, serves in particular for generating a raw beam having a controllable total intensity $I_{SQ}$ of the radiation source, wherein the total intensity $I_{SQ}$ of the raw beam emitted by the radiation source is controllable with a frequency of at least 10 kHz, in particular at least 100 kHz, in particular at least 1 MHz, in particular at least 10 MHz, in particular at least 100 MHz, in particular 1 GHz.

The radiation source is, in particular, an EUV radiation source, that is to say a radiation source which emits illumination radiation in the EUV range, in particular in the wavelength range of 2 nm to 30 nm, in particular in the wavelength range of 2 nm to 15 nm, in particular illumination radiation having a wavelength of 13.5 nm or 6.7 nm.

The radiation source can be, in particular, a free electron laser (FEL) or a synchrotron-based radiation source. Such radiation sources are advantageous in particular for illumination systems for projection exposure systems including a plurality of scanners. They are suitable in particular for generating a collective output beam having a high total intensity. They are controllable in particular very rapidly.

In accordance with one aspect of the disclosure, the total intensity $I_{SQ}$ of the illumination radiation that is emitted by the radiation source unit, in particular by the radiation source, is controllable with a frequency $f_s$ which is at least of the same magnitude as the product of the number M of individual output beams and the reciprocal of the period $T_{Var}$ of the variation of the division ratio of the total intensity of the collective output beam into the individual output beams, $f_s \geq M \cdot 1/T_{Var}$.

This is possible in a particularly simple manner if the radiation source emits radiation pulses having at least one predefined pulse frequency. The pulse frequency $f_{Pulse}$ of the radiation source is in particular in the range of 100 kHz to 10 GHz. It is in particular at least 1 MHz, in particular at least 10 MHz.

With the designation $f_{Var} = 1/T_{Var}$ the following holds true in particular: $f_{Pulse}:f_{Var} \geq M$, in particular $f_{Pulse}:f_{Var} \geq 10$ M, in particular $f_{Pulse}:f_{Var} \geq 100$ M, in particular $f_{Pulse}:f_{Var} \geq 1000$ M, in particular $f_{Pulse}:f_{Var} \geq 10^4$ M, in particular $f_{Pulse}:f_{Var} \geq 10^5$ M, in particular $f_{Pulse}:f_{Var} \geq 10^6$ M.

In accordance with a further aspect of the disclosure, the radiation source module includes a beam shaping optical unit for shaping the collective output beam from the raw beam including illumination radiation that is emitted by the radiation source unit, in particular the radiation source. A collective output beam having a specific intensity profile, in particular a collective output beam having a specific cross section and/or a specific divergence, is generatable from the raw beam with the aid of the beam shaping optical unit. The collective output beam can be shaped in particular in such a way that it has an elongate, in particular a strip-shaped, in particular a rectangular, cross section whose longer side corresponds precisely to a side length of the separating component, while in a direction perpendicular thereto it has significantly smaller dimensions than the separating component in the corresponding direction. The shorter side is in particular at most 0.5 times the length, in particular at most 0.3 times the length, in particular at most 0.1 times the length, in particular at most 1/M times the length, of the corresponding direction of the separating component.

The beam shaping optical unit can include one or a plurality of means for influencing the intensity of the collective output beam, in particular for attenuating the collective output beam.

In accordance with a further aspect of the disclosure, the means for controlling the total intensity of the collective output beam is controllable, in particular controllable by closed-loop control, depending on the means for dividing the collective output beam into individual output beams.

According to the disclosure, it has been recognized that, for controlling the radiation dose which is used for the exposure of the wafer, in particular for ensuring the dose stability, it is advantageous to control the relative dose of the individual output beams, that is to say the ratio of the radiation doses in different scanners, and the absolute radiation dose separately. In this case, the control of the absolute radiation dose can be achieved in a simple manner via the control of the total intensity of the collective output beam. The total intensity can be controlled in particular temporally depending on the different divisions of the collective output beam into individual output beams. It is possible, in particular, to increase or to decrease the total intensity of the collective output beam during specific intervals of the period $T_{Var}$. What can thereby be achieved is that each of the scanners on average over time, that is to say averaged over a period $T_{Var}$, receives a predetermined radiation dose for the exposure of the wafer.

The radiation dose for the exposure of the wafer is connected directly with the individual intensity of the respective individual output beam. The control of the radiation dose thus corresponds directly to the control of the respective intensity.

The intensity of the illumination radiation emitted by the radiation source, given a constant pulse energy, is directly proportional to the pulse frequency of the radiation pulses emitted by the radiation source. The intensity of the illumination radiation emitted by the radiation source can be controlled particularly simply via the pulse frequency of the radiation source.

The means for controlling the total intensity of the collective output beam can be arranged in the beam path upstream or downstream of the beam shaping optical unit. It is possible, in particular, to control the total intensity of the collective output beam via the pulse frequency of the radiation source, that is to say via the pulse frequency of the emitted raw beam.

It is also possible to control, in particular to reduce, the intensity of the collective output beam after or during the shaping thereof in the beam shaping optical unit.

In accordance with a further aspect of the disclosure, the means for controlling the total intensity of the collective output beam is controllable, in particular controllable by closed-loop control, depending on a means for predefining setpoint intensities of the individual output beams. The total intensity $I_{SQ}$ of the raw beam emitted by the radiation source and/or of the collective output beam is controllable, in particular controllable by closed-loop control, in particular depending on the sum of all of the individual setpoint intensities.

In accordance with a further aspect of the disclosure, the means for varying the division ratio of the total intensity into the individual intensities is controllable, in particular controllable by closed-loop control, depending on a predefined ratio of the setpoint intensities of the individual output beams. For controlling the total intensity of the raw beam and/or of the collective output beam and/or for controlling the means for varying the division ratio, a separate control unit, in particular a computer-aided control unit, can be provided.

In accordance with a further aspect of the disclosure, a proportion of at least 50% of the individual output beams during at least 50% of the period $T_{Var}$ has individual intensities which are at least 10% of the average individual intensity of all the individual output beams.

In accordance with a further aspect of the disclosure, a proportion of at least 50%, in particular at least 70%, in particular at least 90%, in particular 100% of the individual output beams has a variance, determined over the period $T_{Var}$, which is less than one quarter of the squared average individual intensity of the relevant individual output beam, determined over the period $T_{Var}$.

The radiation source module is, in particular, part of an illumination system. This improves an illumination system for a projection exposure system including a plurality of scanners.

The illumination system includes, in particular, a radiation source module according to the description above and a plurality M of beam guiding optical units for guiding the individual output beams to different object fields, in particular to spatially separate object fields.

In accordance with one aspect of the disclosure, the regions of the optical component are embodied in such a way that fluctuations of the intensity of the individual output beams are compensated for up to a predefined order L.

According to the disclosure, it has been recognized that it is possible to compensate for fluctuations of a nominal illumination generated by the collective output beam on the optical component up to a predefined order via a suitable embodiment and/or arrangement of the regions. This should be understood to mean, in particular, that each of the integrals over one of the first L derivatives of the intensity distribution variation on the optical component is less than a value $|I_k|$, wherein $|I_k|<0.1 \cdot k! \cdot 2^k I_0$. In this case, $I_k$ denotes the integral of the k-th derivative over all the regions of a group. $I_0$ is a normalization constant which is dependent on the total size of the optical component, the number of scanners and the total power of the radiation source. In this case, the intensity distribution variation is a function of fluctuations of the collective output beam, in particular fluctuations of the direction and/or of the divergence of the collective output beam. The derivatives are derivatives with respect to one of these parameters.

The regions are embodied, in particular, in such a way that the integrals over the first L derivatives of the intensity distribution variation depending on the fluctuation parameters, in particular the scaling, that is to say the fluctuation of the divergence, and/or the displacement, that is to say fluctuations of the pointing, of the collective output beam over the totality of the regions of a group substantially eliminate one another, that is to say assume at most a predefined maximum value. In other words, the fluctuation effects are systematically eliminated in a power series expansion with respect to the fluctuation parameters. An optical component embodied in this way can be used to compensate for fluctuations of the radiation source, in particular fluctuations of the divergence and/or the pointing of the collective output beam, up to the substantially arbitrary predefinable order L. The illumination radiation which is guided to the individual scanners, that is to say the individual output beams, are substantially stable, in particular have at most fluctuations which are less than a predefined maximum value.

In an aspect, the disclosure provides a method including the following steps:

providing an illumination system according to the description above, predefining setpoint intensities of the individual output beams, determining a temporal profile of the division ratio of the total intensity of the collective output beam into the individual intensities of the individual output beams depending on a periodically variable setting of the means for varying the division ratio, determining the average actual intensities of each of the individual output beams, in particular determining the average actual intensities at the input of each of the scanners and/or determining the average actual intensities with which the different object fields are illuminated, wherein the average actual intensity should be understood to mean in each case the intensity averaged over a period $T_{Var}$, determining correction factors for adapting the average actual intensities of each of the individual output beams to the predefined setpoint intensities, and controlling the total intensity $I_{SQ}$ of the collective output beam depending on the correction factors and depending on the periodic variation of the means for varying the division ratio. In this case, the total intensity $I_{SQ}$ of the collective output beam can be achieved in particular by the control of the radiation source, in particular by the control of the pulse frequency of the radiation source.

A method for controlling the division of illumination radiation of a common radiation source among a plurality of scanners is improved as a result.

The total intensity of the collective output beam, in particular the total intensity of the raw beam emitted by the radiation source, can in particular be controlled by closed-loop control, in particular continuously controlled by closed-loop control.

The total intensity of the collective output beam can in particular also be controlled periodically. It can in particular be temporally controlled periodically with the period $T_{Var}$ and/or within the period $T_{Var}$. It is possible, in particular, to divide the period $T_{Var}$ into a sequence of disjoint time intervals in which the total intensity $I_{SQ}$ of the collective output beam is constant. The total intensity $I_{SQ}$ of the collective output beam can be different in the different sub-intervals of the period $T_{Var}$.

In an aspect, the disclosure provides a method in which the actual intensities of each of the individual output beams are determined depending on the variable setting of the means for varying the division ratio, then one or a plurality of settings of the means for varying the division ratio are determined in order to achieve a desired division ratio of the total intensity of the collective output beam to the individual output beams, and then at least one of the settings in particular a sequence of the settings, is set. This last can take place in a controlled manner, in particular in a manner controlled by closed-loop control.

In this method, too, provision can be made for controlling the total intensity $I_{SQ}$ of the collective output beam, in particular depending on the setting of the means for varying the division ratio of the total intensity of the collective output beam into the individual intensities of the individual output beams.

In an aspect, the disclosure provides a projection exposure system including a plurality of scanners and an output coupling optical unit according to the description above. The projection exposure system is improved as a result.

The advantages are evident in turn from those described for the optical component.

The projection exposure system includes, in particular, an illumination system according to the description above and a plurality M of scanners. The projection optical units are, in particular, in each case part of a scanner.

The projection exposure system according to the disclosure makes it possible, in particular, to supply a plurality of scanners with a single radiation source, in particular an FEL, stably with illumination radiation. The projection exposure system according to the disclosure leads, in particular, to an improved dose stability during the exposure of wafers in a plurality of independent, separate scanners which are supplied with illumination radiation by a common radiation source unit.

In an aspect, the disclosure provides a method for designing an optical component according to the description above.

In an aspect, the disclosure provides a method including the following steps:
  providing an intensity profile of a collective output beam,
  determining the nominal intensity distribution associated with the intensity profile in the region of the optical component,
  predefining maximum possible fluctuations of the intensity profile,
  determining the changes in the intensity distribution that are associated with the maximum possible fluctuations of the intensity profile in the region of the optical component,
  determining the embodiment of the regions of the groups depending on the changes in such a way that for each group the fluctuation of the total intensity reflected by the group, even upon the occurrence of the maximum possible fluctuations of the intensity profile, is at most of the same magnitude as a predefined permissible maximum value.

An optical component designed in this way makes it possible reliably to reduce dose fluctuations, in particular to compensate for them up to a predefined order, in particular to avoid them.

The intensity profile of the collective output beam can be predefined, calculated, simulated or measured. Combinations of these possibilities are likewise possible.

The nominal intensity distribution associated with the intensity profile in the region of the optical component can be calculated, simulated or measured. Here, too, combinations of these alternatives are possible.

The changes in the intensity distribution that are associated with the maximum possible fluctuations of the intensity profile in the region of the optical component can be calculated, simulated or measured. Combinations of these possibilities are likewise possible.

Maximum possible fluctuations of the intensity profile can be understood to mean maximum allowed fluctuations and/or maximum expected fluctuations. They can be predefined or, given knowledge of the radiation source, determined, in particular calculated, simulated or measured.

The fluctuations can be, in particular, fluctuations of the divergence and/or of the pointing of the collective output beam.

The method includes, in particular, a systematic determination of the embodiment and/or arrangement of the regions. The regions are determined, in particular, in such a way that, for a known fluctuation range of a radiation source, dose fluctuations up to a predefined degree, in particular up to a predefined order L, are compensated for, in particular eliminated.

The intensity profile of the collective output beam, which is also designated as the radiation profile, is Gaussian, in particular. It is parameterizable, in particular. It has, in particular, a known, parameterizable fluctuation range.

In particular, predefined boundary conditions are taken into account when determining the embodiment of the regions. In particular, a uniform distribution of the intensity guided to the individual scanners can be demanded. Moreover, a predefined stability can be demanded. This can be expressed by the intensity fluctuations being developed with respect to disturbances. Variations of the pointing and/or variations of the divergence can be taken into account in this case. The variations can in each case be taken into account and compensated for up to a predefined order.

Further boundary conditions can be made in respect of the arrangement of the regions. By way of example, it can be demanded that the arrangement of the regions has an axis of symmetry.

Furthermore, it can be demanded that the order of the regions is chosen in such a way that the assignment to the scanners is repeated periodically.

In an aspect, the disclosure provides a method including the following steps:

providing an intensity profile of a collective output beam, determining the nominal intensity distribution associated with the intensity profile in the region of the optical component, determining changes in the intensity distribution that are associated with possible fluctuations of the intensity profile in the region of the optical component, defining an order L which is to be corrected and up to which changes in the intensity distribution are to be corrected, determining the first L derivatives of the intensity distribution in the region of the optical component depending on the fluctuations, determining a disjoint set of regions of the groups, such that for each group the integral over each of the L derivatives over the set of regions is at most of the same magnitude as a predefined limit value, $|I_k|$, where $|I_k| < 0.1 \cdot k! \cdot 2^k I_0$, wherein $I_k$ denotes the integral of the k-th derivative over all the regions of the i-th group. $I_0$ is the integral of the intensity distribution over all the regions of the i-th group.

The fluctuations are once again, in particular, fluctuations of the divergence, that is to say of a scaling, of the collective output beam and/or fluctuations of the pointing, that is to say of a displacement, of the collective output beam. The scaling and/or displacement parameters for determining the functional dependence of the intensity distribution in the region of the optical component depending on the fluctuations of the collective output beam can be determined in particular relative to a radius of a cross section of the collective output beam. If appropriate, a suitable coordinate transformation can be provided for this purpose.

The derivatives of the intensity distribution depending on the fluctuation parameters are calculated, in particular. A computing unit, in particular an external computing unit, in particular in the form of a computer, can be provided for this purpose.

By predefining the order L up to which fluctuations are intended to be corrected, it is possible to predefine the permitted magnitude of the maximum allowed fluctuations. The order L can be predefined by the user as desired. The optical component, in particular the regions of the different groups, can then be determined accordingly depending on the value L. Conversely, it is possible to determine, from the embodiment of the regions of the different groups, the order L up to which fluctuations of the collective output beam are compensated for with the aid of the respective optical component.

Further details will become apparent from the description of the exemplary embodiments.

Further features of the disclosure are to improve a method for producing micro- or nanostructured components and components produced according to the method. The disclosure provides a projection exposure system according to the description above. The advantages are evident from those described above.

A further aspect of the present disclosure is to develop an illumination system and components therefor such that an illumination with coherent EUV light in particular of a synchrotron-radiation-based light source, which illumination satisfies desired high resolution properties, is made possible.

For this purpose, provision is made of an illumination system for EUV projection lithography including a beam shaping optical unit for generating an EUV collective output beam from an EUV raw beam of a synchrotron-radiation-based light source, including an output coupling optical unit for generating a plurality of EUV individual output beams from the EUV collective output beam, and including a respective beam guiding optical unit for guiding the respective EUV individual output beam towards an object field, in which a lithography mask is arrangeable, wherein an optical surface of at least one output coupling element of the output coupling optical unit is embodied as an oscillation surface that is operatively connected to an oscillation drive.

The beam guiding of EUV light or EUV radiation, provided by a synchrotron-radiation-based light source, involves a specific conditioning on account of the properties of the EUV raw beam emitted by such a light source. This conditioning is ensured by the beam shaping optical unit according to the disclosure, the output coupling optical unit and the beam guiding optical unit and also by a beam homogenizing effect of the oscillation surface of the at least one output coupling element of the output coupling optical unit. The synchrotron-radiation-based light source can be a free electron laser (FEL), an undulator, a wiggler or an x-ray laser. The synchrotron-radiation-based light source have an etendue of less than 0.1 mm$^2$ or an even smaller etendue. The optical units according to the disclosure can generally operate with the emission of a light source having such a small etendue, independently of whether a synchrotron-radiation-based light source is involved. The beam shaping optical unit provides for a preshaping of a collective output beam from the raw beam in order to prepare for subsequent output coupling via the output coupling optical unit in individual output beams. The latter are guided to the respective object field by the beam guiding optical unit. This results in the possibility of illuminating a plurality of object fields using one and the same synchrotron-radiation-based light source, which in turn affords the possibility of supplying a plurality of projection exposure apparatuses which can be used to produce micro- or nanostructured components, for example semiconductor chips, in particular memory chips, via one and the same synchrotron-radiation-based light source. Via the output coupling optical unit and the downstream beam guiding optical unit, it is possible to ensure a variable intensity distribution for the proportions of the radiation power in the different EUV individual output beams. It is thereby possible to carry out an adaptation to the number of projection exposure apparatuses to be supplied and an adaptation to the light power demanded by the respective projection exposure apparatus. Different desired properties which, for producing specific structures, are made of the light power respectively desired therefor can then also be fulfilled by corresponding adaptation of the illumination system. The oscillation surface provides for homogenizing the EUV individual output coupling beam respectively coupled out and thus for avoiding disturbing density inhomogeneities, in particular for avoiding speckle. Oscillation frequencies of the oscillation drive can be in the range of between 50 Hz and 10 kHz.

An embodiment of the optical surface as a reflection surface results in efficient output coupling. Alternatively, the optical surface embodied as an oscillation surface can also be embodied as a refractive surface, for example as a partial reflection surface of a beam splitter, in which a proportion of the illumination light that passes through the refractive surface is also still used, for example as EUV individual output beam. The optical surface can be embodied as a plane surface. Alternatively, the optical surface can be fashioned with a beam shaping effect, for example as a spherical surface, as an aspherical surface, as a toric surface, as a cylindrical surface or as a freeform surface. The optical surface can have different deflecting effects and in particular different refractive powers in the two principal directions, that is to say in particular in a plane of incidence and perpendicular to a plane of incidence. These different deflecting effects and different refractive powers can have different signs. The optical surface can therefore be embodied as a saddle surface.

An embodiment of the output coupling element as a GI mirror (grazing incidence mirror) increases the reflection efficiency thereof.

Embodiments of the oscillation drive including a piezo-component or an acousto-optical modulator enable a targeted formation of standing and/or travelling oscillation waves on the optical surface having a predefined amplitude. Resonances of the output coupling element can be used in a targeted manner or else avoiding in a targeted manner.

An oscillation drive including a hydraulic drive can elegantly combine the functions of "oscillation excitation" and "cooling". The oscillation drive can be embodied overall as a hydraulic drive.

In accordance with a further aspect of the disclosure, the oscillation drive is embodied in such a way that it brings about a tilting of the oscillation surface about a tilting axis.

An oscillation drive which brings about a tilting of the oscillation surface about a tilting axis constitutes a variant of the oscillation drive in which the optical surface per se does not oscillate, but rather is displaced overall in an oscillating fashion.

In accordance with a further aspect of the disclosure, as an alternative or in addition to this displacement overall with the oscillation drive it is possible to bring about an oscillating deformation within the oscillation surface, that is to say in particular a standing and/or travelling wave.

The optical surface of the output coupling element can be embodied as a mirror array including a multiplicity of individual mirrors. The individual mirrors can be embodied as actuatable and can be connected to corresponding displacement actuators. The individual mirrors can be embodied such that they are displaceable by actuators independently of one another. The oscillation drive of the optical surface can be realized via the displacement actuators of the individual mirrors. The entire mirror array can be drivable via a single oscillation drive for realizing the oscillation surface. Alternatively or additionally, at least one partial surface of the mirror array, including exactly one individual mirror or a group of individual mirrors, can be connected to the oscillation drive. In so far as a plurality of partial surfaces form the oscillation surface, they can be driven in an oscillating manner independently of one another.

Such a mirror array can be embodied in the manner of an MEMS (microelectromechanical system) array. Such MEMS arrays and suitable concepts for displacement actuators of the MEMS individual mirrors which can be used as an oscillation drive are known from WO 2013/160 256 A1, from WO 2012/130 768 A2 and from WO 2009/100 856 A1.

A design including at least one oscillating partial surface enables a selection of a segment of the respective EUV individual output beam which is influenced in terms of its etendue by reflection at the at least one oscillating partial surface. Generation of a plurality of EUV individual output beams from the EUV collective output beam is also possible via independent displacement of partial surfaces of the mirror array.

The light source of the illumination system can be a free electron laser (FEL), an undulator, a wiggler or an x-ray laser.

The EUV collective output beam can have within a used cross section an intensity distribution that deviates from a homogeneous intensity by less than 10% at every point of the used cross section. A respective EUV individual output beam can have a corresponding homogeneity downstream of the deflection optical unit.

All the mirrors of the illumination system can bear highly reflective coatings.

All details and claim features can also be combined with one another in any other combination.

BRIEF DESCRIPTION OF THE DRAWINGS

Further details and advantages of the disclosure will become apparent from the description of exemplary embodiments with reference to the drawings. In detail:

FIGS. 5A to 5F show illustrations corresponding to FIGS. 4A to 4F for the case of a division of the collective output beam to ten individual output beams, FIGS. 6A to 6F show illustrations corresponding to FIGS. 5A to 5F for the case where only a part of the total intensity of the collective output beam is divided to the individual output beams, FIG. 10 shows an illustration corresponding to FIG. 9 in the case of an alternative embodiment of the illumination system, FIG. 20 shows a further embodiment of an optical component for coupling out a individual output beam from a collective output beam, FIGS. 21 and 22 show schematic illustrations of arrangements of the optical component in the beam path of an illumination system of a projection exposure system including a plurality of scanners.

DESCRIPTION OF EXEMPLARY EMBODIMENTS

Figure 1:
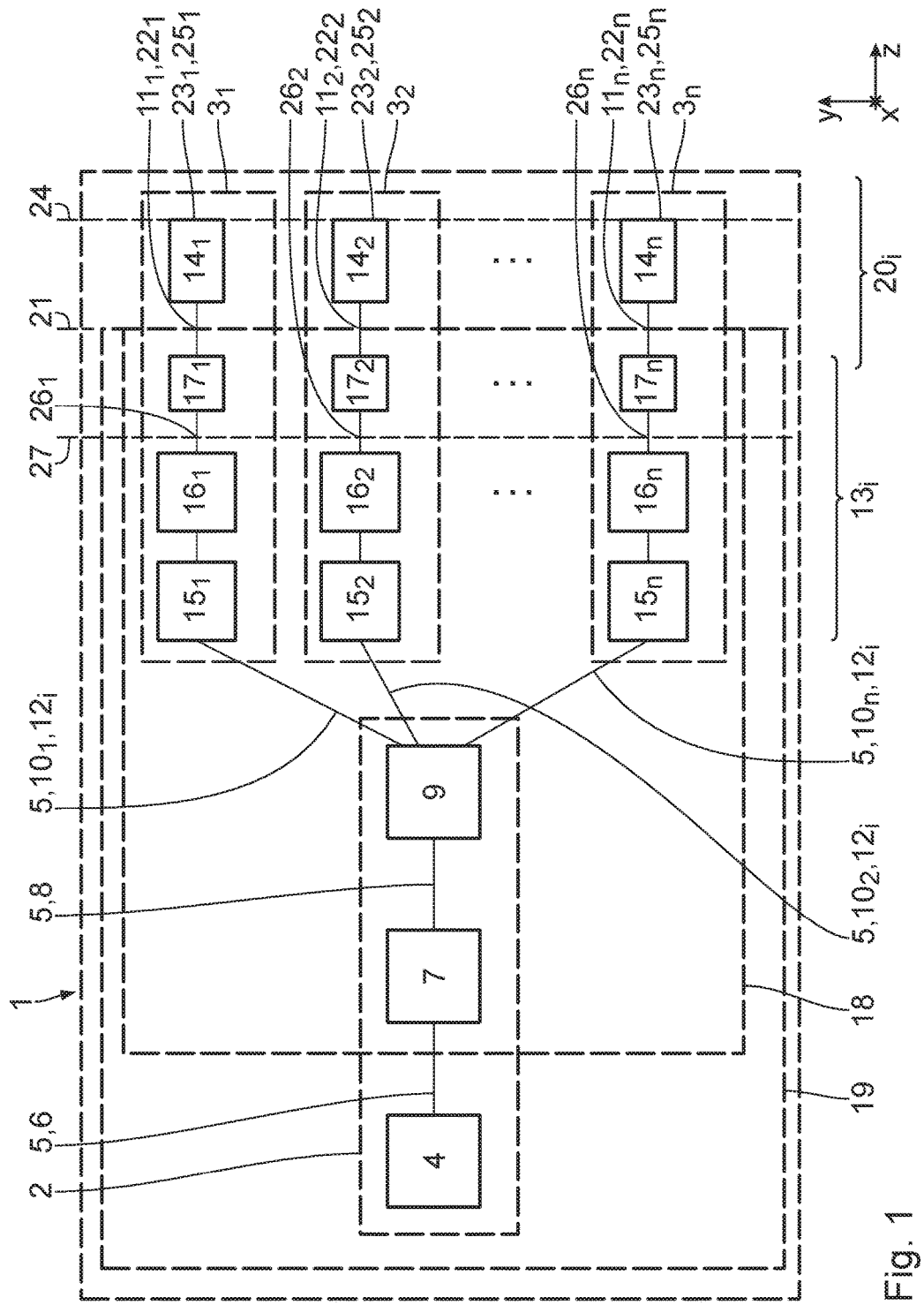
FIG. 1 shows a schematic illustration of the constituent parts of a projection exposure system including a plurality of scanners.

Firstly, constituent parts of a projection exposure system 1 will be described below with reference to FIG. 1.

The subdivision of the projection exposure system 1 into subsystems that is carried out below serves primarily for the conceptual demarcation thereof. The subsystems can form separate structural subsystems. However, the division into subsystems need not necessarily be reflected in a structural demarcation.

The projection exposure system 1 includes a radiation source module 2 and a plurality of scanners $3_i$.

The radiation source module 2 includes a radiation source 4 for generating illumination radiation 5.

The radiation source 4 is a free electron laser (FEL), in particular. A synchrotron radiation source or a synchrotron-radiation-based radiation source which generates coherent radiation having very high brilliance can also be involved. By way of example, for such radiation sources, reference should be made to US 2007/0152171 A1 and DE 103 58 225 B3.

The radiation source 4 has for example an average power in the range of 1 kW to 25 kW.

It has a pulse frequency in the range of 10 MHz to 10 GHz. Each individual radiation pulse can amount to an energy of 83 µJ, for example. Given a radiation pulse length of 100 fs, this corresponds to a radiation pulse power of 833 MW.

The radiation source 4 can also have a repetition rate in the kilohertz range, for example of 100 kHz, or in the low megahertz range, for example at 3 MHz, in the medium megahertz range, for example at 30 MHz, in the upper megahertz range, for example at 300 MHz, or in the gigahertz range, for example at 1.3 GHz.

The radiation source 4 is an EUV radiation source, in particular. The radiation source 4 emits in particular EUV radiation in the wavelength range of, for example between 2 nm and 30 nm, in particular between 2 nm and 15 nm.

The radiation source 4 emits the illumination radiation 5 in the form of a raw beam 6. The raw beam 6 has a very small divergence. The divergence of the raw beam 6 can be less than 10 mrad, in particular less than 1 mrad, in particular less than 100 µrad, in particular less than 10 µrad. To facilitate the description of positional relationships, coordinates of a Cartesian xyz-coordinate system are used below. The x-coordinate together with the y-coordinate regularly spans a beam cross section of the illumination radiation 5. The z-direction regularly runs in the radiation direction of the illumination radiation 5. In the region of the object plane 21 and of the image plane 24, respectively, the y-direction runs parallel to a scan direction. The x-direction runs perpendicular to the scan direction. The raw beam 6 is emitted in a specific direction by the radiation source 4. The direction is also designated hereinafter as pointing P.

The raw beam 6 can have an etendue that is less than 0.1 $mm^2$, in particular less than 0.01 $mm^2$. The etendue is the smallest volume of a phase space which contains 90% of the energy of the illumination radiation 5 emitted by the radiation source 2. Definitions of the etendue corresponding thereto can be found for example in EP 1 072 957 A2 and U.S. Pat. No. 6,198,793 B1.

The radiation source module 2 furthermore includes a beam shaping optical unit 7 disposed downstream of the radiation source 4. The beam shaping optical unit 7 serves for generating a collective output beam 8 from the raw beam 6. The collective output beam 8 has a very small divergence. The divergence of the collective output beam 8 can be less than 10 mrad, in particular less than 1 mrad, in particular less than 100 µrad, in particular less than 10 µrad.

In particular, the diameter of the raw beam 6 or of the collective output beam 8 can be influenced via the beam shaping optical unit 7. In particular, an expansion of the raw beam 6 can be achieved by the beam shaping optical unit 7. The raw beam 6 can be expanded via the beam shaping optical unit 7 in particular by a factor of at least 1.5, in particular at least 2, in particular at least 3, in particular at least 5, in particular at least 10. The expansion factor is in particular less than 1000. It is also possible to expand the raw beam 6 to different extents in different directions. In particular, it can be expanded to a greater extent in an x-direction than in a y-direction. In this case, the y-direction in the region of the object field $11_i$ corresponds to the scanned direction The divergence of the collective output beam 8 can be less than the divergence, in particular less than half the divergence, of the raw beam 6.

Further details of the beam shaping optical unit 7, reference should be made to DE 10 2013 223 935.1, which is hereby incorporated into the present application. The beam shaping optical unit 7 can include, in particular, one or two beam shaping mirror groups each having two mirrors. The beam shaping mirror groups serve, in particular, for the beam shaping of the collective output beam 8 in mutually perpendicular planes which run parallel to the propagation direction of the collective output beam 8.

The beam shaping optical unit 7, can also include further beam shaping mirrors.

The beam shaping optical unit 7 can include in particular cylindrical mirrors, in particular at least one convex and at least one concave cylindrical mirror. It can also include mirrors having a freeform profile. Such mirrors have in each case a height profile which is not representable as a conic.

In addition, the intensity profile of the raw beam 6 can be influenced via the beam shaping optical unit 7.

Moreover, the radiation source module 2 includes an output coupling optical unit 9 disposed downstream of the beam shaping optical unit 7, the output coupling optical unit being described in even greater detail below. The output coupling optical unit 9 serves for generating a plurality of, namely n, individual output beams $10_i$ (i=1 to n) from the collective output beam 8. The individual output beams $10_i$ in each case form beams for illuminating an object field $11_i$. The individual output beams $10_i$ are in each case assigned to one of the scanners $3_i$. The beams of the individual output beams $10_i$ can in each case include a plurality of separate partial beams $12_i$.

The radiation source module 2 is arranged in an evacuatable housing, in particular.

The scanners $3_i$ in each case include a beam guiding optical unit $13_i$ and a projection optical unit $14_i$.

The beam guiding optical unit $13_i$ serves for guiding the illumination radiation 5, in particular the respective individual output beams $10_i$, to the object fields $11_i$ of the individual scanners $3_i$.

The projection optical unit $14_i$ serves in each case for imaging a reticle $22_i$ arranged in one of the object fields $11_i$ into an image field $23_i$, in particular onto a wafer $25_i$ arranged in the image field $23_i$.

The beam guiding optical unit $13_i$ includes, in the order of the beam path of the illumination radiation 5, in each case a deflection optical unit $15_i$, an input coupling optical unit $16_i$, in particular in the form of a focusing assembly, and an illumination optical unit $17_i$. The input coupling optical unit $16_i$ can in particular also be embodied as a Wolter type III collector.

The deflection optical unit $15_i$ can also be integrated into the output coupling optical unit 9. The output coupling optical unit 9 can be embodied in particular in such a way that it already deflects the individual output beams $10_i$ in a desired direction. In accordance with one variant, the deflection optical units $15_i$ in their entirety can also be dispensed with. Generally, the output coupling optical unit 9 and the deflection optical units $15_i$ can form an output coupling-deflection device.

For different variants of the deflection optical units $15_i$, reference should be made to DE 10 2013 223 935.1, for example, which is hereby incorporated in the present application as part thereof The input coupling optical unit $16_i$ serves in particular for coupling in the illumination radiation 5, in particular one of the individual output beams $10_i$ generated by the output coupling optical unit 9, into a respective one of the illumination optical units $17_i$.

The beam guiding optical unit $13_i$ together with the beam shaping optical unit 7 and the output coupling optical unit 9 form constituent parts of an illumination device 18.

The illumination device 18, just like the radiation source 4, is part of an illumination system 19.

Each of the illumination optical units $17_i$ is respectively assigned one of the projection optical units $14_i$. Together the illumination optical unit $17_i$ and the projection optical unit $14_i$ assigned to one another are also referred to as an optical system $20_i$.

The illumination optical unit $17_i$ serves in each case for transferring illumination radiation 5 to a reticle $22_i$ arranged in the object field $11_i$ in an object plane 21. The projection optical unit $14_i$ serves for imaging the reticle $22_i$, in particular for imaging structures on the reticle $22_i$, onto a wafer $25_i$ arranged in an image field $23_i$ in an image plane 24.

The projection exposure system 1 includes in particular at least two, in particular at least three, in particular at least four, in particular at least five, in particular at least six, in particular at least seven, in particular at least eight, in particular at least nine, in particular at least ten, scanners $3_i$. The projection exposure system 1 can include up to twenty scanners $3_i$.

The scanners $3_i$ are supplied with illumination radiation 5 by the common radiation source module 2, in particular the common radiation source 4.

The projection exposure system 1 serves for producing micro- or nanostructured components, in particular electronic semiconductor components.

The input coupling optical unit $16_i$ is arranged in the beam path between the radiation source module 2, in particular the output coupling optical unit 9, and a respective one of the illumination optical units $17_i$. It is embodied in particular as a focusing assembly. It serves for transferring a respective one of the individual output beams $10_i$ into an intermediate focus $26_i$ in an intermediate focal plane 27. The intermediate focus $26_i$ can be arranged in the region of a through opening of a housing of the optical system $20_i$ or of the scanner $3_i$. The housing is evacuatable, in particular.

The illumination optical unit $17_i$ in each case includes a first facet mirror and a second facet mirror, the function of which corresponds in each case to that of the facet mirrors known from the prior art. The first facet mirror can be a field facet mirror, in particular. The second facet mirror can be a pupil facet mirror, in particular. However, the second facet mirror can also be arranged at a distance from a pupil plane of the illumination optical unit $17_i$. This general case is also referred to as specular reflector.

The facet mirrors in each case include a multiplicity of first and second facets, respectively. During the operation of the projection exposure system 1, each of the first facets is respectively assigned one of the second facets. The facets assigned to one another in each case form an illumination channel of the illumination radiation 5 for illuminating the object field $11_i$ at a specific illumination angle.

The channel-by-channel assignment of the second facets to the first facets is carried out depending on a desired illumination, in particular a predefined illumination setting. The facets of the first facet mirror can be embodied such that they are displaceable, in particular tiltable, in particular with two degrees of freedom of tilting in each case. The facets of the first facet mirror are switchable in particular between different positions. In different switching positions they are assigned to different second facets from among the latter. At least one switching position of the first facets can in each case also be provided in which the illumination radiation 5 impinging on them does not contribute to the illumination of the object field $11_i$. The facets of the first facet mirror can be embodied as virtual facets. This should be understood to mean that they are formed by a variable grouping of a plurality of individual mirrors, in particular a plurality of micromirrors. For details, reference should be made to WO 2009/100856 A1, which is hereby incorporated in the present application as part thereof.

The facets of a second facet mirror can correspondingly be embodied as virtual facets. They can also correspondingly be embodied such that they are displaceable, in particular tiltable.

Via the second facet mirror and, if appropriate, via a downstream transfer optical unit (not illustrated in the figures), which includes three EUV mirrors, for example, the first facets are imagined into the object field $11_i$ in the reticle or object plane 21.

The individual illumination channels lead to the illumination of the object field $11_i$ at specific illumination angles. The totality of the illumination channels thus leads to an illumination angle distribution of the illumination of the object field $11_i$ by the illumination optical unit $17_i$. The illumination angle distribution is also referred to as illumination setting.

In a further embodiment of the illumination optical unit $17_i$, in particular given a suitable position of the entrance pupil of the projection optical unit $14_i$, it is also possible to dispense with the mirrors of the transfer optical unit upstream of the object field $11_i$, which leads to a corresponding increase in transmission for the used radiation beam.

The reticle $22_i$ having structures that are reflective to the illumination radiation 5 is arranged in the object plane 21 in the region of the object field $11_i$. The reticle $22_i$ is carried by a reticle holder. The reticle holder is displaceable in a manner driven via a displacement device.

The projection optical unit $14_i$ in each case images the object field $11_i$ into the image field $23_i$ in the image plane 24. The wafer $25_i$ is arranged in the image plane 24 during the projection exposure. The wafer $25_i$ has a light-sensitive coating that is exposed during the projection exposure via the projection exposure system 1. The wafer $25_i$ is carried by a wafer holder. The wafer holder is displaceable in a manner controlled via a displacement device.

The displacement device of the reticle holder and the displacement device of the wafer holder can be signal-connected to one another. They are synchronized, in particular. The reticle $22_i$ and the wafer $25_i$ are displaceable in particular in a synchronized manner with respect to one another.

One advantageous embodiment of the illumination system 19 is described below.

It has been recognized that a free electron laser (FEL) or a synchrotron-based radiation source can advantageously be used as the main radiation source 4. An FEL scales very well, that is to say that it can be operated particularly economically in particular if it designed to be large enough to supply a plurality of scanners $3_i$ with illumination radiation 5. The FEL can supply in particular up to eight, ten, twelve or even twenty scanners with illumination radiation 5.

It is also possible for more than one radiation source 4 to be provided.

One desire made of the projection exposure system 1 is that the radiation intensity that reaches the individual reticles $22_i$ and in particular the radiation dose that reaches the wafers $25_i$ can be regulated very exactly and very rapidly. The radiation dose that reaches the wafers $25_i$ is intended to be able to be kept as constant as possible, in particular.

Fluctuations of the illumination radiation 5 impinging on the reticle $22_i$, in particular of the total intensity of the illumination radiation 5 impinging on the reticles $22_i$, and thus of the radiation dose impinging on the wafers $25_i$ can be attributable to intensity fluctuations of the main radiation source and/or to geometric fluctuations, in particular to fluctuations of the direction of the raw beam 6 emitted by the main radiation source 4 and/or fluctuations of the cross-sectional profile, in particular in the region of the output coupling optical unit 9, of the raw beam. Fluctuations of the cross-sectional profile can be attributable in particular to divergence fluctuations of the raw beam 6 emitted by the radiation source 4 and/or of the collective output beam 8.

Details of the output coupling optical unit 9 will be described more specifically below.

As already mentioned, the radiation source 4 embodied as an FEL emits illumination radiation 5 having a specific intensity profile. The radiation source 4 emits, in particular, illumination radiation 5 having a Gaussian profile. The illumination radiation 5, in particular the raw beam 6 or the collective output beam 8, is emitted in a specific direction 37. The direction 37 of the raw beam 6 or of the collective output beam 8 should be understood to mean, in particular, the direction of the centroid ray thereof. The raw beam 6 or the collective output beam 8 has a specific, low divergence 38. On account of the low divergence 38 of the raw beam 6 or of the collective output beam 8 of the FEL, the phase space thereof can be regarded as practically two-dimensional.

The direction 37 of the centroid ray is also referred to as pointing P of the collective output beam 8. It is also described with the variable $x_0$. The variable $x_0$ is normalized in particular by a value of a nominal divergence of the collective output beam 8. In particular, the variable $\sigma_x$ also serves for describing the divergence 38 of the collective output beam 8.

Figure 2:
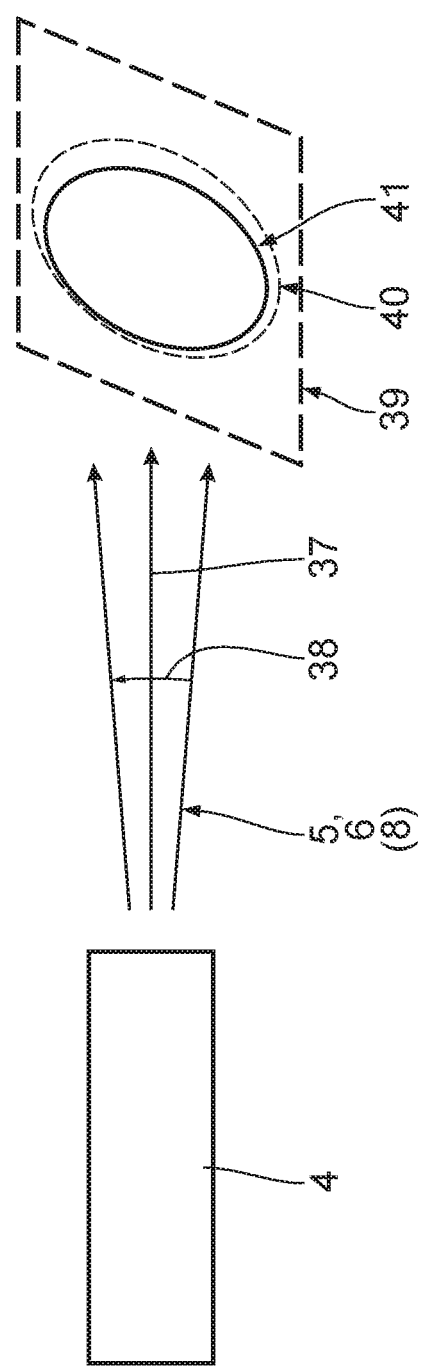
FIG. 2 shows a schematic illustration of a radiation source and of the illumination radiation generated thereby with a specific direction and divergence.

As is illustrated schematically in FIG. 2, the collective output beam 8 leads to an illumination 40 of a separating plane 39. The separating plane 39 need not necessarily be a concrete geometrical plane. The separating plane 39 generally denotes a surface in the phase space of the illumination radiation 5 at which the division of the collective output beam 8 into individual output beams $10_i$ is performed.

The actual illumination 40 can deviate from a nominal illumination 41, which is also referred to as design illumination. The actual illumination 40 can deviate from the nominal illumination 41 on account of fluctuations of the direction 37 and/or of the divergence 38. This can have the effect that the radiation energy which impinges on a specific region of the separated plane 39 is subject to fluctuations.

According to the disclosure, it has been recognized that the direction 37 of the FEL is permitted to fluctuate by less than 0.1% relative to its divergence 38 in order to achieve a dose fluctuation of better than 0.1%. For a realistic FEL divergence 38 of 50 μrad, the direction 37 would therefore have to be stabler than 25 nrad. According to the disclosure, it has furthermore been recognized that the desired properties relating to the stability of the radiation source 4 can be considerably reduced by dividing the separating plane 39 into different regions in such a way that the intensity fluctuations of the regions which contribute to the supply of the individual scanners $3_i$ with illumination radiation 5, in the case of fluctuations of the radiation source 4, in particular of the collective output beam 8, precisely compensate for one another. It has been found that it is possible to divide the separating plane 39 into disjoint regions, in such a way that the supply of the different scanners $3_i$ with illumination radiation 5 is decoupled against fluctuations of the FEL parameters. The individual disjoint regions of the separating plane 39 serve, in particular, in each case for guiding illumination radiation 5 to a specific one of the scanners $3_i$. According to the disclosure, it has been recognized that a reduction of dose fluctuations can be achieved by the illumination radiation 5 guided to a specific one of the scanners $3_i$, that is to say the individual output beam $10_i$, being divided into a plurality of separate partial beams which are guided in each case from one of the disjoint regions of the separating plane 39 to the respective scanner $3_i$. It holds true quantitatively here that a larger number of disjoint regions which serve for guiding the illumination radiation 5 of a specific output beam $10_i$ to one of the scanners $3_i$ leads to a better compensation possibility for dose fluctuations, that is to say to an improved dose stabilization for the respective scanner $3_i$.

Firstly, an abstract description will be given of how a division of the separating plane 39 is possible, in principle, in order to achieve the effect that fluctuations of the FEL parameters lead to no alteration of the energy division ratio to the different scanners $3_i$ of the projection exposure system 1 or at most an alteration thereof which is less than a predefined, maximum permissible limit value. After that, different concrete realizations of a corresponding optical component 42 and of a corresponding output coupling optical unit 9, respectively, will be described by way of example.

It shall firstly be assumed hereinafter that the illumination in the separating plane 39 has a Gaussian profile. This is correct to a sufficient approximation. The disclosure can be applied without any problems to alternative, known intensity profiles of the collective output beam 8, in particular if their fluctuations are parameterizable.

The object according to the disclosure is to supply M scanners with illumination radiation 5 as uniformly and stably as possible. For this purpose, the separating plane 39 is divided into M disjoint sets $A_k$, k=1, . . . , M.

For reference parameters $\hat{x}_0$ (direction 37) and $\sigma_x$ (divergence 38), which are chosen for the further derivation without restriction of generality as $x_0=0$ and $\sigma_x=1$, the uniform distribution yields the mathematical condition:

$$\int_{A_k} I(x)dx = \frac{1}{M}, k = 1, \ldots, M$$

The stability can be formulated mathematically by expanding the function with respect to the disturbance. For the direction 37 of the collective output beam 8, the following arises for fluctuations around the reference value $x_0$:

$$I(x) = \sum_{l=0} \frac{1}{l!} \frac{d^l I(x)}{dx_0^l}\bigg|_{x_0=\hat{x}_0} (x_0 = \hat{x}_0)^l$$

These two properties lead to the following sequence of equations:

$$\int_{A_k} \frac{d^l I(x)}{dx_0^l}\bigg|_{x_0=\hat{x}_0} dx = 0, k = 1, \ldots, M, l = 1, \ldots, L$$

In this case, L indicates the maximum order of the disturbance up to which compensation is effected. The larger L is chosen to be, the smaller the effect of a deviation of $x_0$ relative to the reference value $\hat{x}_0$.

$A_k$ is a union of disjoint intervals. In order to simplify the further configurations, it was assumed that $A_k$ has mirror symmetry, that is to say that under the assumption $\hat{x}_0=0$ with (a; b)∈$A_k$ also (−b; −a)∈$A_k$. The presence of this symmetry is helpful, but not absolutely necessary.

In order to be able to establish the equations represented above, knowledge of the corresponding derivatives of the intensity profile with respect to the direction and knowledge of the integrals over intervals (a, b), are desired.

The derivation of the functions $$\frac{d^l I(x)}{dx_0^l}\bigg|_{x_0=\hat{x}_0} \text{ and } \frac{d^l I(x)}{d\sigma_x^l}\bigg|_{\sigma_0=\hat{\sigma}_0}$$

and the derivation of the integrals are dispensed with at this juncture. These derivatives and integrals can be determined given knowledge of the radiation profile of the radiation source 4. They can be determined analytically particularly in the case of a Gaussian function. They can also be determined numerically or experimentally, if appropriate. For an analytical determination of the derivatives and the integrals, it is advantageous if the radiation profile is present in parameterized form, in particular as a function of $x_0$ and $\sigma_x$.

Proceeding from the corresponding derivatives of the Gaussian function, the result found was that in the case of a compensation of fluctuations of the divergence 38 up to the order L, fluctuations of the direction 37 up to the order 2L are automatically compensated for as well. This result generally holds true if the arrangement has the mirror symmetry mentioned above.

A further analysis of the formulae revealed that a compensation of fluctuations of the divergence 38 up to a predefined order $L_1$ also suffices for the compensation of combined, simultaneous fluctuations of divergence 38 up to the order $L_2$ and direction 37 up to the order $L_3$ if it holds true that: $L_1 \geq L_2 + 2L_3$.

The used region of the separating plane 39 can be large enough to take up substantially the entire profile of the radiation source 4, in particular the entire profile of the radiation source. This case is referred to hereinafter as separating plane 39 of infinite size. The opposite case, in which the entire profile of the radiation source 4 is not taken up, is referred to hereinafter as separating plane of finite size. It should be remembered that the separating plane 39 need not necessarily correspond to a real plane in position space, but rather can correspond to an arbitrary two-dimensional area in phase space. Accordingly, the case referred to as separating plane 39 of infinite size does not necessarily result in an extremely large component.

Firstly, a division of the separating plane 39 into different regions 43, is described below, under the assumption that the separating plane 39 is of infinite size. A corresponding result for an embodiment of the separating plane 39 of finite size is presented subsequently. In this regard, it should be remembered that the separating plane 39 need not represent a real plane in the projection exposure system 1, but rather represents an abstract area in the phase space of the FEL radiation.

According to the disclosure, it has been recognized that it suffices to structure the separating plane 39 along an axis, in particular along the x-axis, since a two-directional Gaussian function factorizes. To put it illustratively, it suffices to chop the separating plane 39 into disjoint, strip-shaped regions $43_i$. A variation of the Gaussian parameters in the orthogonal direction thereto does not change the entire energy of the illumination radiation impinging on the strip-shaped regions $43_i$, but rather only the energy distribution on the respective region $43_i$.

If the order of the strips is defined, then the design is uniquely determined by the cutting positions $x_1, \ldots, x_N$.

On account of the assumed mirror symmetry relative to the axis 44 of symmetry, only the cutting positions on one side of the axis 44 of symmetry are independently selectable. Given N cutting positions, the number of regions $43_i$ is 2N+1.

An explanation is given below of how it is possible to optimize the N cutting positions $x_i$ in such a way that the energy of the FEL is distributed among M scanners $3_i$ as uniformly and stably as possible. If the stabilization is intended to be carried out up to the order L, according to the disclosure the following equations are to be fulfilled:

$$\sum_k g_0(a_k^{(m)}, b_k^{(m)}) = \frac{1}{M}, m = 1, \ldots, M$$

$$\sum_k g_l(a_k^{(m)}, b_k^{(m)}) = 0, m = 1, \ldots, M \ l = 1, \ldots, L,$$

wherein $$g_l(a, b) = \int_a^b g_l(x)dx + \int_{-b}^{-a} g_l(x)dx, \text{ where } g_l(x) = \frac{d^l I(x)}{d\sigma_x^l}\bigg|_{\sigma_0=\hat{\sigma}_0}$$

In this case, the summation is over all the intervals ($a_k^{(m)}$; $b_k^{(m)}$), which are assigned to the m-th scanner.

In other words, the equations represent (L+1)M conditions which are intended to be fulfilled together with the boundary condition $0 \leq x_i \leq x_{i+1}$, i=1, N−1.

As was found, solving the system of equations using numerical methods can be difficult. It can be advantageous to reduce the problem to a minimization problem. Such a reformulation proved to be possible. Solving the system of equations is equivalent to minimizing the following function:

$$h(x_1, \ldots, x_N) = \sum_{m=1}^{M} \sum_{l=0}^{L} \left[ \sum_k g_l(a_k^{(m)}, b_k^{(m)}) - \frac{\delta_{l,0}}{M} \right]^2$$

On account of the structure function $h(x_1, \ldots, x_N)$, the Levenberg-Marquardt algorithm can be used for solving the minimization problem.

A further boundary condition demanded that the sequence of the regions $43_i$, $43_j$, $43_k$, . . . adjoining one another is repeated in each case. This boundary condition can also be dispensed with, in principle.

In the course of the numerical optimizations it was revealed that the number N of cutting positions $x_i$ is given by N=(M−1)(L+1). In this regard, it should be noted that the system of equations presented above is not linearly independent. The number of independent equations corresponds precisely to the above-indicated number N of cutting positions $x_i$.

Figure 3:
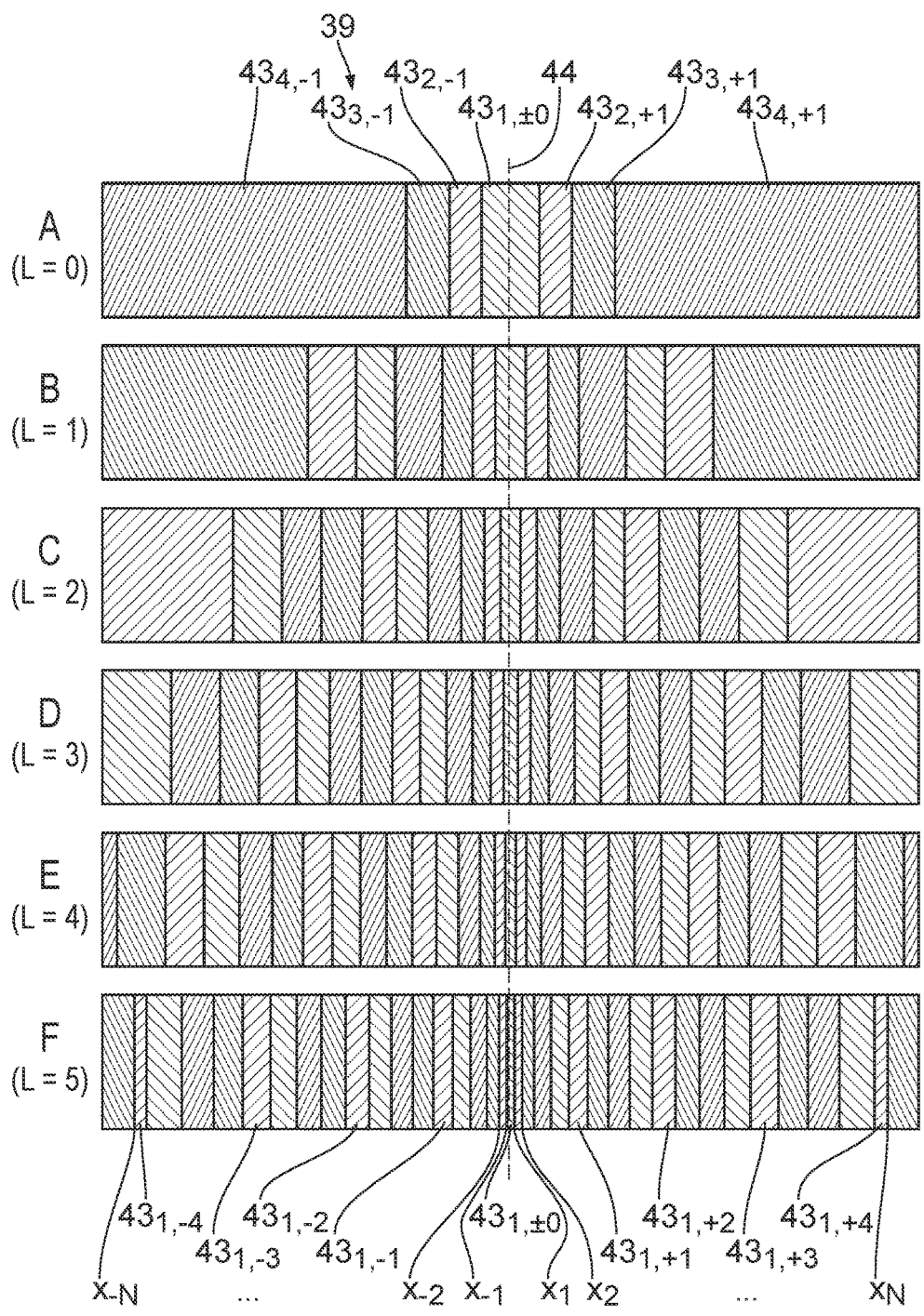
FIGS. 3A to 3F show exemplary illustrations of the division of a separating plane into a number of disjoint regions for dividing a collective output beam into four individual output beams, wherein the different sub-Figures A to F represent different divisions for compensating for fluctuations up to different orders.
Figure 4A:
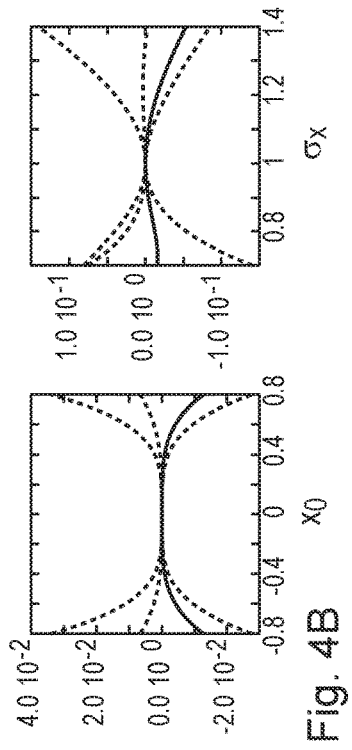
FIGS. 4A to 4F show exemplary illustrations for elucidating the effect of the division of the separating plane in accordance with FIGS. 3A to 3F on intensity fluctuations of the individual output beams depending on direction fluctuations (left column) and divergence fluctuations (right column)
Figure 4C:
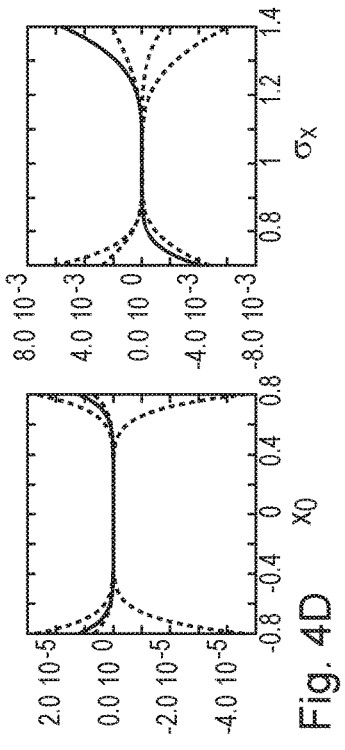
Figure 4E:
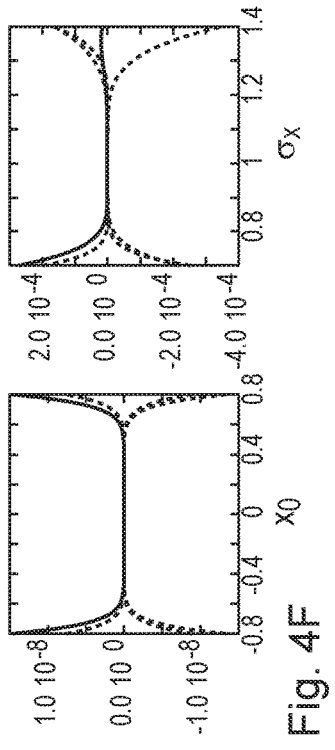
Figure 4B:
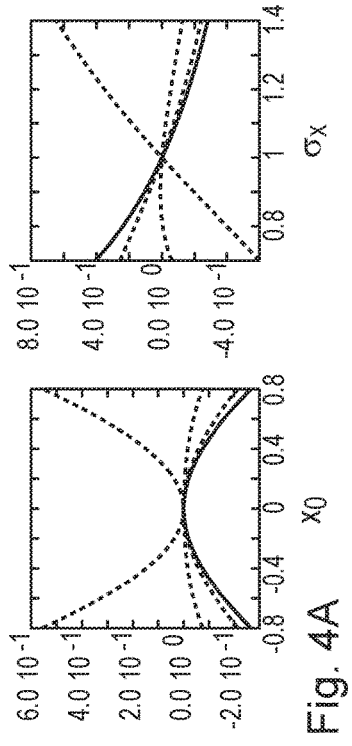
Figure 4D:
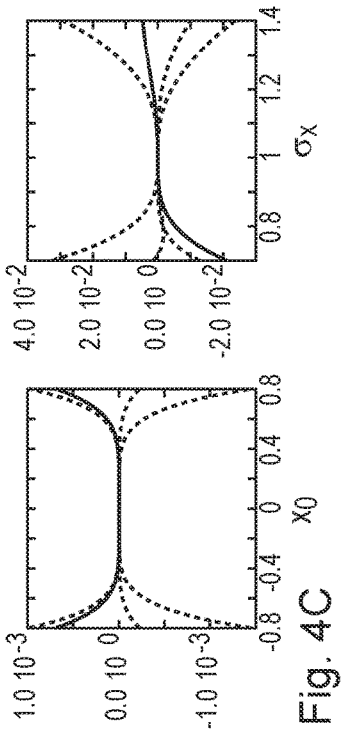
Figure 4F:
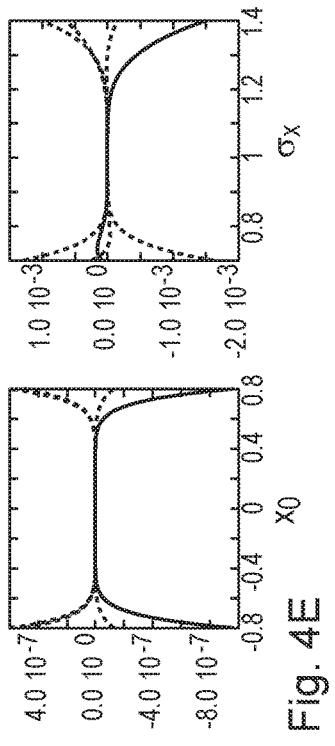

FIGS. 3A to 3F illustrate by way of example the determined divisions of the separating plane 39 into regions $43_i$ for M=4 scanners $3_1$ to $3_4$. In this case, FIG. 3A shows a division of the separating plane 39 for L=0, that is to say for a homogeneous division of the energy in the ideal state without compensation of fluctuations. FIGS. 3B to 3F show divisions in the case of a compensation of fluctuations up to the first order (FIG. 3B: L=1), up to the second order (FIG. 3C: L=2), up to the third order (FIG. 3D: L=3), up to the fourth order (FIG. 3E: L=4) and up to the fifth order (FIG. 3F: L=5).

The figures illustrate by way of example in each case divisions for a projection exposure system 1 including four different scanners $3_1$ to $3_4$. However, the number of scanners $3_i$ can be more than four. It is, in particular, five, six, seven, eight, nine, ten or more. It can be in particular at least twelve, in particular at least fifteen, in particular at least twenty. This results in a correspondingly larger number of different regions $43_i$, which is not illustrated in the figures for reasons of clarity.

As is illustrated qualitatively in the figures, the regions $43_i$ are embodied in a strip-shape fashion, in particular in a rectangular fashion. The illustrated embodiments should be understood to be by way of example. A strip-shaped embodiment of the regions $43_i$ is a particularly simple variant, in particular one that can be produced particularly simply. The regions $43_i$ can also have more complex shapes. They can be embodied in particular in a non-rectangular fashion. They can in particular also have curved or jagged boundaries at least in sections. A division of the separating plane 39 in both dimensions, in particular in the form of a checkered pattern, is also possible. Moreover, it is possible to combine different divisions of the separating plane 39 into the regions $43_i$ with one another. It is possible, in particular, to combine different alternatives of the optical component 42 with one another, for example in order to form a composite optical component 42.

Further properties of the division of the separating plane 39 into the regions $43_i$ are described below on the basis of the strip-shaped embodiment of the regions $43_i$. The corresponding properties can be applied without any problems to alternative embodiments of the regions $43_i$.

The regions $43_i$ are grouped in groups. In this case, the regions $43_i$ of the same group are identified by the same hatching. Regions $43_i$ of different groups are hatched differently. Regions $43_i$ of the same group serve for guiding the different partial beams $12_i$ of one of the individual output beams $10_i$ to the same one of the scanners $3_i$. Regions $43_i$ of different groups serve for guiding the individual output beams $10_i$ to different scanners $3_i$.

The regions $43_i$ of the same group are embodied in a mutually non-connected fashion. Between two regions $43_i$ of the same group i there lie in each case M−1 regions which belong to other groups. An exception is possibly the axis 44 of symmetry, since a different number of regions which belong to other groups can lie between two adjacent regions $43_i$ lying on opposite sides of the axes of symmetry.

The regions $43_i$ are numbered for clarification in such a way that the first index, i, indicates the group to which the region belongs. In other words, the first index serves precisely for consecutively numbering the scanners $3_i$.

The second index serves to enumerate the regions of the same group proceeding from the axis 44 of symmetry in the positive and negative directions. For reasons of space, only a selection of the regions $43_i$ is correspondingly identified in the figures.

The number of regions $43_i$ in a group can be up to 30 for practical applications. It is in particular in the range of 3 to 20, in particular in the range of 5 to 10. The number of regions $43_i$ in a group is dependent, in particular, on the maximum order L of the divergence fluctuation up to which compensation is effected.

The number of groups corresponds precisely to the number of scanners $3_i$.

At least some of the regions $43_i$ can have a large aspect ratio. The maximum aspect ratio of the regions $43_i$ can be in particular at least 10:1, in particular at least 20:1. The aspect ratio of the regions $43_i$ is in particular in each case at most 200:1, in particular at most 100:1.

The geometrical width of the regions $43_i$ depends on the illumination 40 of the separating plane 39 and thus, for a given radiation source 4, on the presence and, if appropriate, the configuration of a beam shaping optical unit 7 between the radiation source 4 and separating plane. Given the presence of a beam shaping optical unit 7 that does not just use a pure magnification of the raw beam 6 for generating a collective output beam 8, the figure should not be understood as a direct geometrical representation of a component, but rather as a division specification of the phase space of the radiation source 4.

If the illumination 40 in the region of the separating plane 39 is substantially Gaussian, then regions $43_i$ in the vicinity of the axis 44 of symmetry tend to be smaller than regions that are far away from the axis 44 of symmetry. It holds true, in particular, that at least one group i of the regions $43_i$ has a distribution of the widths of the regions $43_i$, such that the average width of the regions $43_i$ of the inner half is less than the average width of the regions $43_i$ in the outer half. This holds true, in particular, if the number of cutting positions corresponds precisely to the above-described minimum number of cutting positions for the order L to be corrected. The average width of the regions $43_i$ in the inner half can be in particular at most 90%, in particular at most 80%, in particular at most 70%, of the average width of the regions $43_i$ in the outer half.

If, when a corresponding beam shaping optical unit 7 is used, the separating plane 39 is provided in such a way that the illumination 40 is substantially homogeneous, then regions $43_i$ in the vicinity of the axis 44 of symmetry tend to be larger than regions which are far away from the axis of symmetry. It holds true, in particular, that at least one group i of the regions $43_i$ has a distribution of the widths of the regions $43_i$, such that the average width of the regions $43_i$ of the inner half is greater than the average width of the regions $43_i$ in the outer half. This holds true, in particular, if the number of cutting positions corresponds precisely to the above-described minimum number of cutting positions for the order L to be corrected. The average width of the regions $43_i$ in the inner half can be in particular at least 110%, in particular at least 120%, in particular at least 130% of the average width of the regions $43_i$ in the outer half.

FIGS. 4A to 4F illustrate, for the divisions of the separating plane 39 in accordance with FIGS. 3A to 3F, the effect of fluctuations of the direction 37 (left-hand figure in each case) and fluctuations of the divergence 38 (right-hand figure in each case), for the different compensation orders L after the correction. FIGS. 4A to 4F illustrate a respective curve for each of the different scanners. The vertical axis indicates in each case the relative change in the total energy of the individual scanners $3_i$. The horizontal axis represents the change in the direction 37 and in the divergence 38 relative to the given nominal divergence 38. The curve profile for the compensation order L is in the lowest order a polynomial of order L+1.

It can easily be gathered from the figures up to what order L compensation has to be effected for a predefined possible maximum fluctuation of the direction 37 and/or of the divergence 38. The budget for the allowed changes in the total energy is in the range of 0.1‰ to 5‰. This budget is achievable without any problems in the case of fluctuations of the direction 37 and/or of the divergence 38 of up to 20% of the nominal divergence with a compensation order of at most 6, in particular at most 5.

FIGS. 5A to 5F illustrate corresponding curves for a system including M=10 scanners $3_i$. It is qualitatively discernible that the corrections in this case are even more effective still.

The case of a separating plane 39 of finite size is described in greater detail below.

If a separating plane of infinite size is considered, then the following holds true:

$$\int_{-\infty}^{\infty} g_l(x)dx = \delta_{l,0}$$

That means, in particular, that even in the case of an alteration of the FEL parameters, the entire illumination radiation 5 is still fed to the totality of the scanners $3_i$. If only a region (−a; a) of the separating plane 39 is used for coupling out the individual output beams $10_i$ from the collective output beam 8, then this no longer holds true. Since $g_m(a; \infty) \neq 0$, any alteration of the FEL parameters leads to an alteration of the entire quantity of energy which passes to the scanners $3_i$.

According to the disclosure, it has been recognized that for a dose stability it is not necessary for a change in the FEL parameters to result in no alteration of the quantities of energy which are fed to the individual scanners $3_i$. Rather, it can suffice if the quantities of energy change identically. The total energy of the FEL can be suitably controlled by closed-loop control for the compensation of such a change.

The system of equations described above is replaced in this case by the following system of equations:

$$\sum_k g_0[a_k^{(m)}, b_k^{(m)}] = \frac{\alpha}{M},$$

$$m = 1, \ldots, M$$

$$\sum_k g_l[a_k^{(m_1)}, b_k^{(m_1)}] = \sum_k g_l[a_k^{(m_2)}, b_k^{(m_2)}],$$

$$1 \leq m_1 < m_2 \leq M, l = 1, \ldots, L$$

The parameter α here indicates what proportion of the total energy in the separating plane 39 is intended to be fed to the scanners $3_i$. The greater α is, the larger is in principle the region in the separating plane 39 which is used overall for coupling out the individual output beams $10_i$ from the collective output beam 8. The parameter α is usually in the range of 0.5 to 1. It is in particular at least 0.6, in particular 0.7, in particular at least 0.8, in particular at least 0.9, in particular at least 0.95, in particular at least 0.97, in particular at least 0.98 and in particular at least 0.99.

It has furthermore been recognized that it can be advantageous or even necessary for the regions $43_i$ no longer to adjoin one another closely, in particular no longer to adjoin one another without gaps. It can be advantageous or even necessary to arrange or leave free interspaces, that is to say gaps, between adjacent regions $43_i$. This in turn means that the used energy proportion α and the size, in particular the outer edge, of the region of the separating plane 39 that is used overall can no longer be uniquely converted into one another. Furthermore, it has been recognized that, under certain circumstances, there is a very large number of different solutions of the system. The individual solutions can differ very greatly in the size of the gaps. It may therefore be expedient, in the optimization, to demand additional conditions of the form $a_L \leq d$ and $b_L \leq d$ with a predefined constant d.

In the numerical determination of solutions of the system of equations it was found that the number N of cutting positions $x_i$ is given by N=(L+1)M. This number is greater than the number of independent equations of condition. This has the effect that there are no uniquely determined solutions for the cutting positions $x_i$ of the regions $43_j$ on the separating plane, rather that a plurality of different solutions can exist.

Apart from the interspaces between adjacent regions $43_i$, $43_j$, the division of the separating plane 39 qualitatively corresponds to those illustrated in FIGS. 3A to 3F.

With regard to the gaps, that is to say the regions of the separating plane 39 which are not used for transferring illumination radiation 5, it should be noted that an unused region in the region of the axis 44 of symmetry can lead to a considerable extent of the region used overall towards the outside. This is associated with the fact that the intensity of the Gaussian distribution is particularly high in the centre, that is to say in the region of the axis 44 of symmetry, and decreases towards the edge.

FIGS. 6A to 6F correspond to FIGS. 5A to 5F for the case α=0.97, that is to say that only a proportion of 97% of the FEL radiation is guided to the scanners $3_i$.

It should again be noted that in the case of the above-depicted divisions of the separating plane 39 into different regions $43_i$, predefined boundary conditions were that the arrangement of the regions $43_i$ is mirror-symmetrical with respect to the axis 44 of symmetry, and that the order of the assignment is periodic.

Neither of the two boundary conditions is absolutely necessary. They served firstly to simplify the finding of solutions or the optimization problem. Secondly, specific fluctuations of the radiation source 4 are automatically reduced if the division of the separating plane 39 has symmetries. For example, a division of the separating plane 39 into different regions $43_i$ in which the arrangement of the regions $43_i$ is mirror-symmetrical with respect to the axis 44 of symmetry automatically compensates in the lowest order in relation to fluctuations of the direction at which the raw beam 6 leaves the radiation source 4.

Some specific embodiments of an optical component for implementing the above-described division of the separating plane 39 into different regions $43_i$ are described by way of example below. The embodiments illustrated in the figures are purely schematic, in particular not true to scale. In particular the arrangement and size distribution of the regions $43_i$ serve merely for illustration purposes.

Figure 7A:
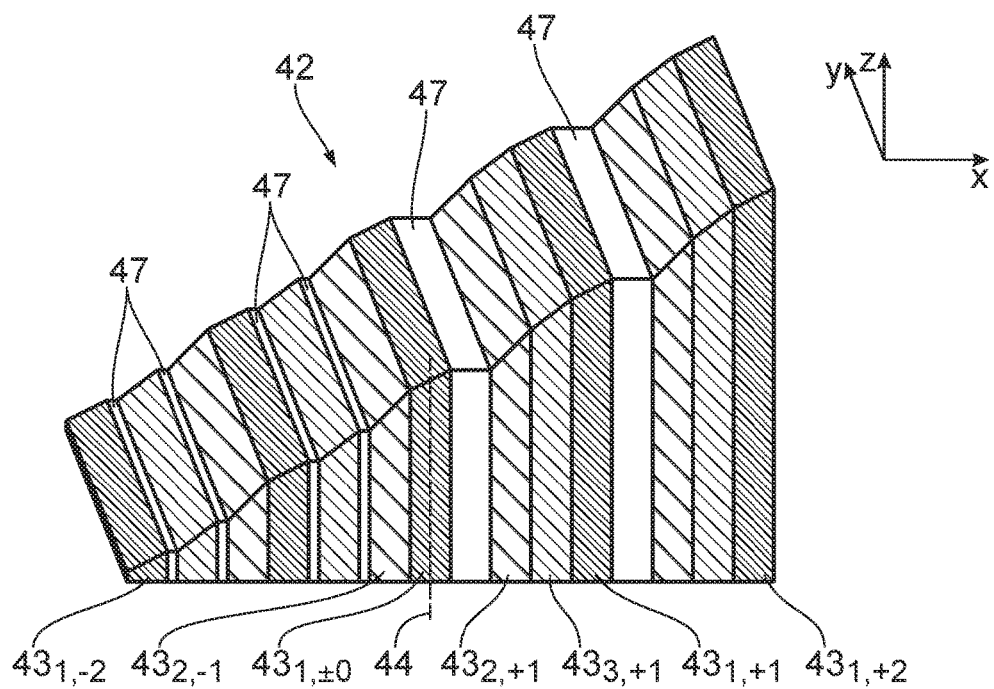
FIG. 7A shows a schematic illustration of one exemplary embodiment of an optical component for coupling out individual output beams from a collective output beam.
Figure 7B:
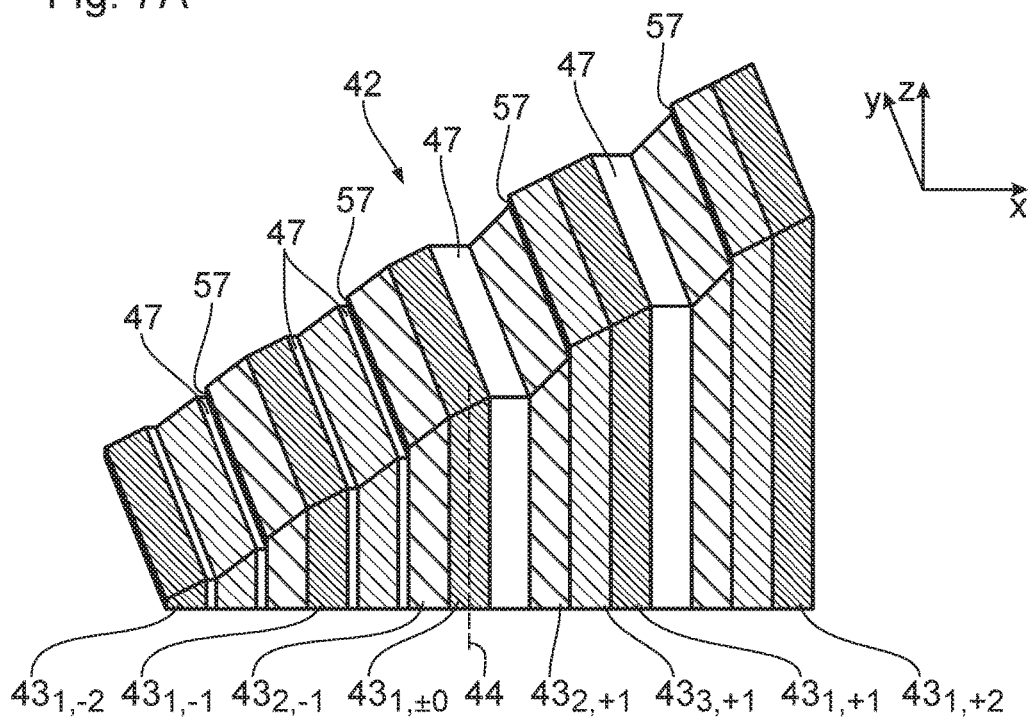
FIG. 7B shows a schematic illustration of an alternative to the embodiment illustrated in FIG. 7A.

A first possibility for embodying a corresponding optical component 42, which is also referred to as separating component hereinafter, is illustrated in FIGS. 7A and 7B. This embodiment involves a solid optical component 42. It is constructed monolithically, in particular. This enables a relatively simple cooling. The optical component 42 is arranged in the beam path of the illumination radiation 5 in such a way that the illumination radiation 5, in particular the collective output beam 8, impinges on the optical component 42 in a manner coming from the left in FIGS. 7A and 7B. Regions of identical hatching are guided to the same scanner $3_i$. A component for coupling out three individual output beams $10_i$ is illustrated by way of example.

Figure 8:
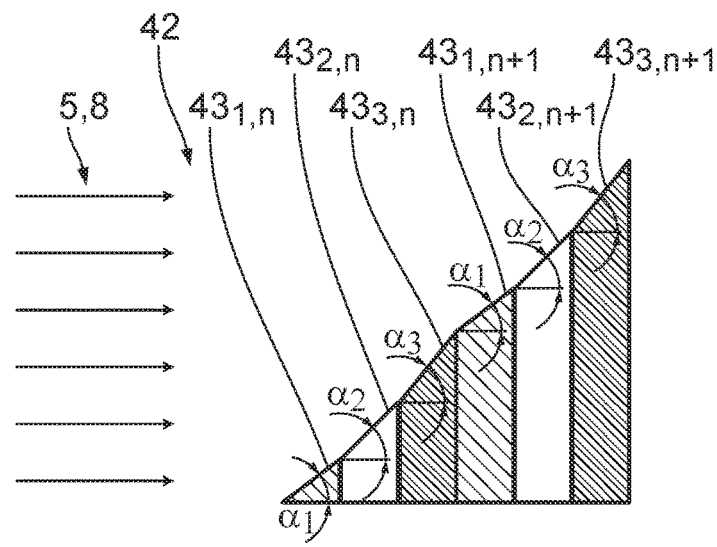
FIG. 8 shows a side view of an excerpt from a variant of a component in accordance with FIG. 7A.

An alternative view of an excerpt from the component 42 is illustrated in FIG. 8. FIG. 8 indicates that the regions $43_i$ which belong to the same group i have an identical gradient $\alpha_i$. They have at least very similar gradients. The gradients $\alpha_i$ of the same group differ in particular by a maximum of 10 mrad.

The gradient here corresponds in each case to the angle of incidence of the illumination radiation 5, in particular of the collective output beam 8, in the individual regions $43_i$.

If horizontally incident rays of the collective output beam 8 impinge on a region $43_i$ which is inclined by an angle $\alpha_i$ relative to the horizontal, then the corresponding ray runs at an angle $2\alpha_i$ relative to the horizontal after a reflection at the region $43_i$. According to the disclosure, it has been recognized that a vignetting-free propagation of the reflected rays means that the region $43_{i+1}$ which is adjacent in the direction of incidence of the collective output beam 8 is tilted relative to the horizontal by an angle $\alpha_{i+1}$ which is less than the angle $2\alpha_i$ at which the reflected ray runs, $\alpha_{i+1} < 2\alpha_i$.

For a completely vignetting-free reflection, in particular for a completely vignetting-free output coupling of all the individual output beams $10_i$ from the collective output beam, this condition is desirably fulfilled for all regions adjoining one another.

A vignetting-free output coupling of all the individual output beams $10_i$ from the collective output beam 8 is possible, in particular, if the largest of the angles $\alpha_i$ is less than twice as large as the smallest of the angles $\alpha_j$, $\max(\alpha_i: \alpha_j) \leq 2$.

It has furthermore been recognized that these angle conditions are no longer achievable for all pairs of adjacent regions $43_i$, $43_j$ if the illumination radiation 5 of the FEL is intended to be divided along a multiplicity of scanners $3_i$. In this case, the disclosure provides for introducing optically non-used intermediate regions 47 between the optically used regions $43_i$, that is to say between the regions $43_i$ which are used for coupling out the individual output beams $10_i$. Corresponding embodiments are illustrated for example in an exemplary fashion in FIGS. 7A and 7B, 11 and 12.

The desirability of intermediate regions 47 is based in particular on the angles at which the individual output beams $10_i$ leave the component 42, and thus on the relative geometrical arrangement of the various constituent parts of the projection exposure system 1 with respect to one another. Therefore, the presence of unused intermediate regions 47 is not a necessary property of the component 42. Furthermore, the presence of unused intermediate regions 47 does not lead to a loss of illumination radiation 5 since the latter impinges on the component 42 from the left in the figure.

Unused regions 57 in the separating plane 39, which occur if only a separating plane 39 of finite size is used, are fundamentally different from the intermediate regions 47. The unused regions 57 are of fundamental natural and lead to a loss of illumination radiation 5. FIG. 7B shows in an illustration similar to FIG. 7A, a configuration in which unused regions 57 also occur in addition to unused intermediate regions 47.

In the case of the embodiment in accordance with FIG. 7B, the illumination radiation 5 is reflected by the unused regions 57 back to the beam shaping optical unit 7 or else absorbed. This was chosen in this way owing to the simpler pictorial illustration. Advantageously, however, this proportion of the illumination radiation is reflected by a suitable inclination of the surface to an absorption unit (beam dump), where the radiation energy can be dissipated.

Figure 11:
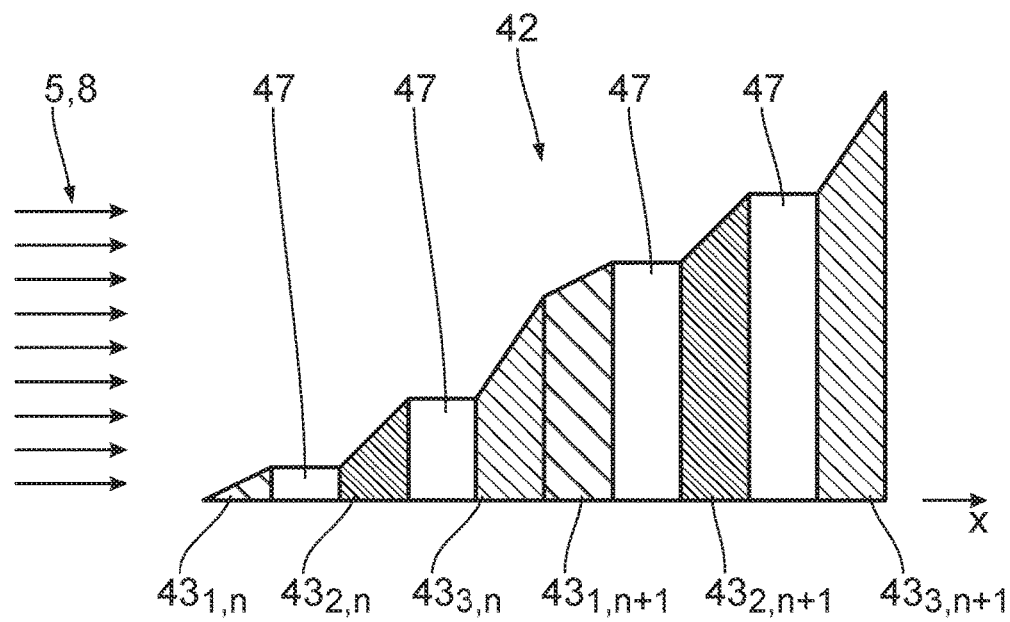
FIGS. 11 and 12 show alternative embodiments of optical components in accordance with FIG. 8, FIGS. 13 and 14 show the region XIII, XIV in FIG. 10 as enlarged excerpts.
Figure 12:
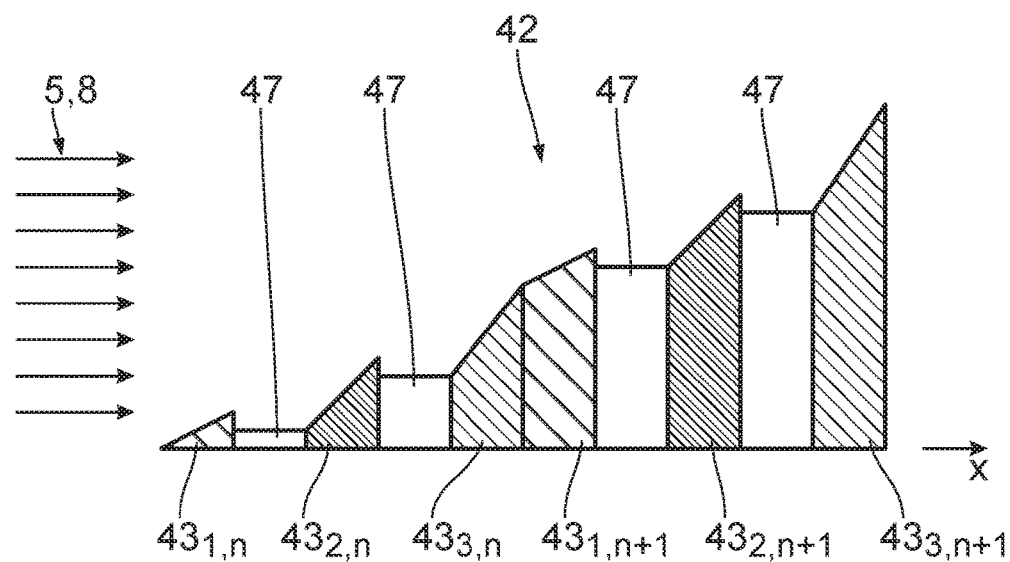

FIG. 11 schematically illustrates a side view of a component 42 similar to the component 42 illustrated in FIG. 7A. It can be discerned that the surface of the intermediate regions 47 runs parallel to the centroid ray of the incident collective output beam 8. Even if the collective output beam 8 has only a very small divergence, nevertheless an, albeit very small, proportion of the energy can be incident on the intermediate regions 47 and be reflected from there in an uncontrolled manner. This can be avoided if, as illustrated in FIG. 12, the intermediate regions 47 are arranged in a manner set back slightly in the direction perpendicular to the x-direction, such that the collective output beam 8 does not impinge on them.

Figure 9:
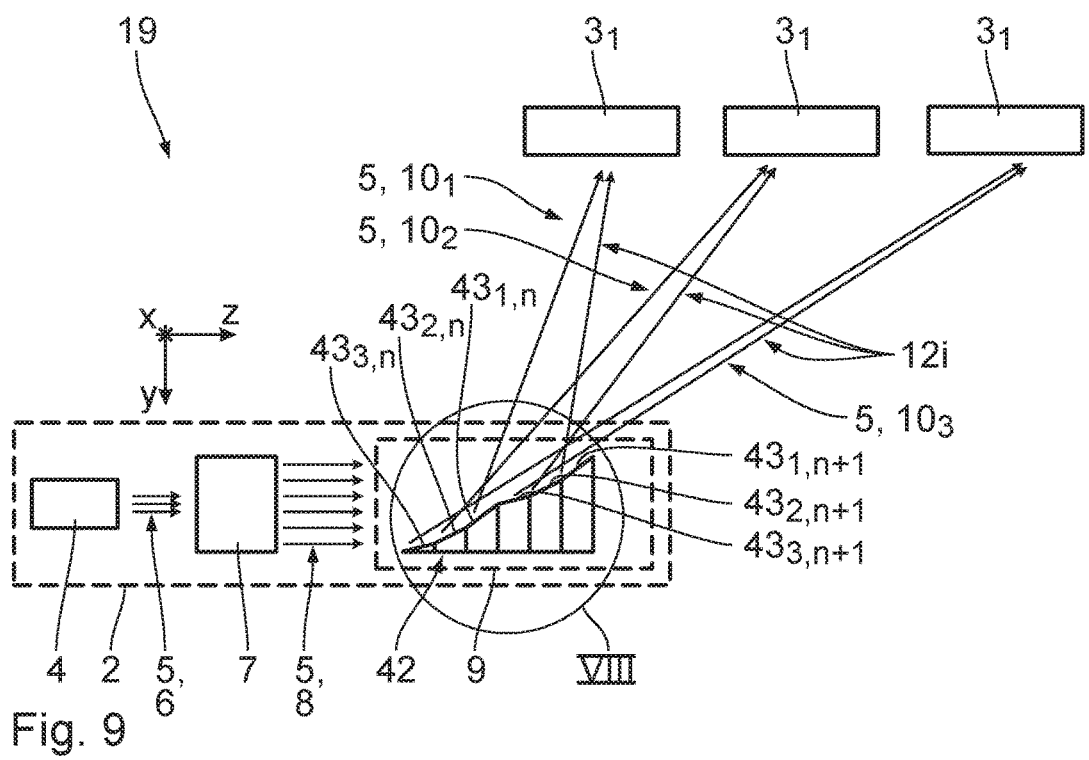
FIG. 9 shows a schematic illustration of the arrangement of the component in accordance with FIG. 8 in the beam path of an illumination system.

FIG. 9 schematically illustrates the arrangement of the optical component 42 in the beam path of the illumination system 19. The optical component 42 serves for coupling out the individual output beams $10_i$ from the collective output beam 8. It serves, in particular, to guide the individual output beams $10_i$ to the individual scanners $3_i$.

The deflection angles at the optical component 42 are illustrated in a greatly enlarged manner in the figures for illustration reasons. They are usually significantly shallower in practice. The illumination radiation 5 is typically incident in the scanners $3_i$ from the side, in particular substantially parallel to the horizontal direction.

As is indicated schematically in FIG. 9, the gradient of different regions $43_i$ of the optical component 42 which belong to the same group can also be slightly different. The regions $43_i$ of one and the same group can in particular be inclined relative to the direction of incidence of the collective output beam 8 in such a way that the individual output beam $10_i$ respectively coupled out by them arrives at the scanner $3_i$ in a focused fashion, rather than in a parallel fashion. In this case, in the design of the optical component 42, it is desired already to know something about the distance between the optical component 42 and the scanner $3_i$.

FIG. 10 illustrates a development of the embodiment in accordance with FIG. 9. In this embodiment, additional deflection elements $45_i$, $46_i$ are arranged in the beam path between the optical component 42 and the scanners $3_i$. The deflection elements can be mirrors, in particular. They can in each case form parts of the deflection optical units $15_i$. They can also in each case form part of the output coupling optical unit 9 and/or of the input coupling optical units $16_i$.

The deflection elements $45_i$, $46_i$ can be arranged in each case in pairs. The two deflection elements $45_i$, $46_i$ assigned to one another can be at a distance of a plurality of meters, in particular a distance of more than 10 m, in particular more than 20 m, in particular more than 50 m, in particular more than 100 m. The distance is usually less than 300 m.

The additional deflection elements $45_i$, $46_i$ serve for avoiding an oblique path of the illumination radiation 5 over large distances. This can be advantageous in particular for the overall construction of the projection exposure system 1, in particular of the illumination device 18 thereof.

In the case of the alternative in accordance with FIG. 10, the individual output beams $10_i$ run horizontally in each case after the deflection at the first deflection element $45_i$. The individual output beams $10_i$ run vertically after the deflection at the second deflection element $46_i$. The individual output beams $10_i$ enter the individual scanners $3_i$ in particular in a direction parallel to the vertical direction.

The additional deflection elements $45_i$, $46_i$ lead only to a relatively small additional light loss if the scanners $3_i$ are designed such that the illumination radiation 5 enters them vertically from below or in a manner deviating at least significantly from the horizontal. Only two additional reflections occur, wherein the additional reflections take place at grazing incidence with a relatively shallow angle. In the case of beam deflection by a specific total angle via grazing incidence, the total transmission is all the greater, the higher the number of individual reflections among which the total deflection is distributed. The two additional deflections at the deflection elements $45_i$, $46_i$ reduce the angle by which the deflection optical unit $15_i$ has to deflect the illumination radiation. Accordingly, the transmission of the deflection optical unit $15_i$ is increased, which compensates for the absorption at the deflection elements $45_i$, $46_i$.

Figure 13:
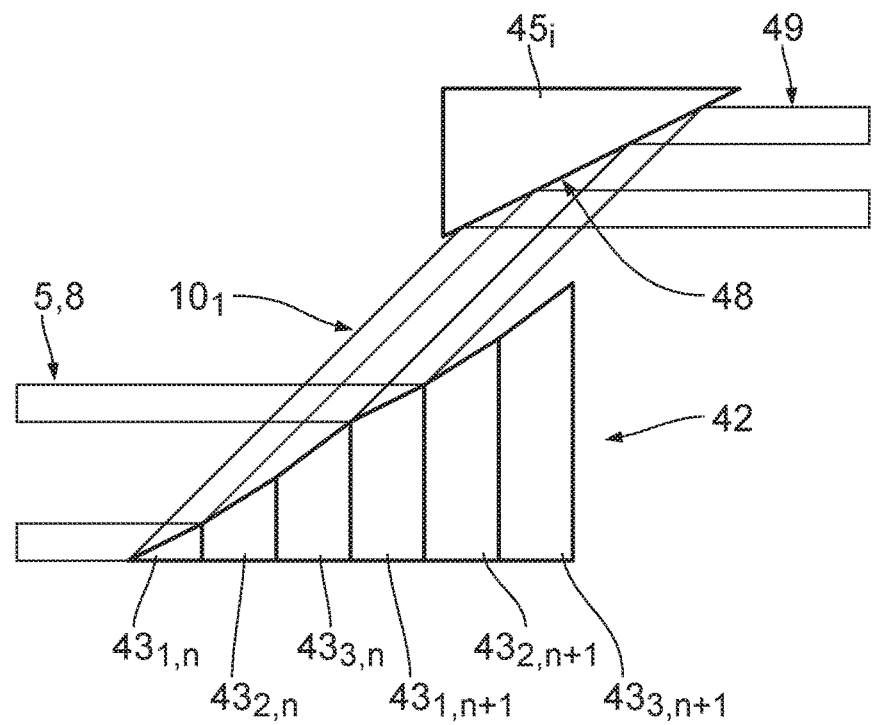
Figure 14:
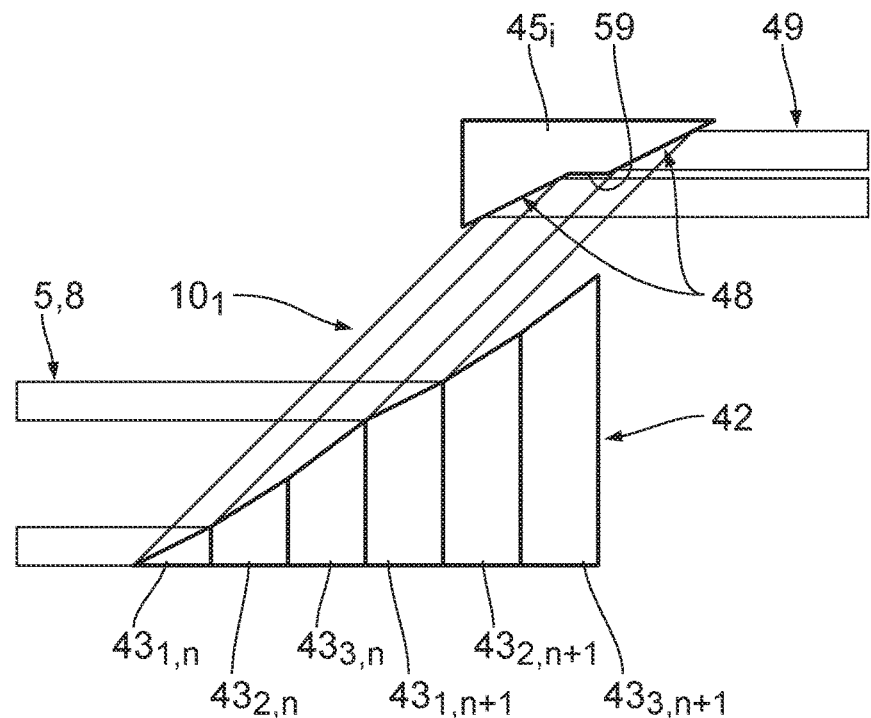

Possible embodiments of the deflection elements $45_i$ are illustrated schematically in FIGS. 13 and 14. In the case of the alternative illustrated in FIG. 13, the deflection element $45_i$ has a plane reflection surface 48. The reflection surface 48 is embodied in particular in a continuous fashion, in particular in a simply connected fashion. The alternative of the deflection element $45_i$ as illustrated in FIG. 13 can be produced particularly simply.

In the case of the alternative as illustrated in FIG. 14, the reflection surface 48 has a plurality of regions offset parallel to one another. In this case, the reflection surface 48 is embodied in particular in a discontinuous fashion. It has steps 59. As a result, it is possible to decrease the dimensions of a light tube 49 reflected by the deflection element $45_i$.

Figure 15:
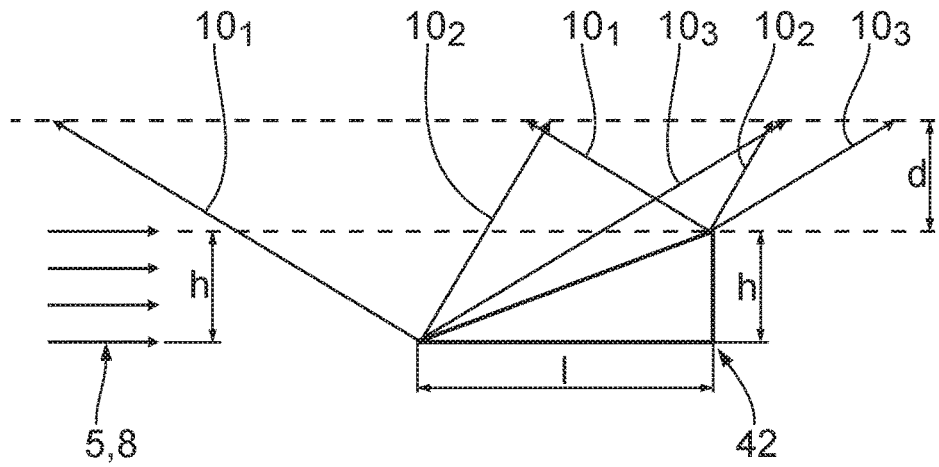
FIG. 15 shows a greatly simplified illustration of the optical component for elucidating geometrical relationships.

Some general details concerning the dimensions of the optical component 42 are described below with reference to FIGS. 15 and 16. The optical component 42 has overall a length l and a height h. The height h of the optical component 42 or the height h of the optically used region thereof is precisely equal to the extent of the collective output beam 8. The height h scales all further occurring dimensions.

At a distance d above the optical component 42, the individual output beams $10_i$ assigned differently to the scanner $3_i$ are intended to be completely spatially separated. At the distance d, which is illustrated as a dashed line in FIG. 15, the beam paths of the illumination beams guided to the individual scanners $3_i$ are non-overlapping.

All of the regions $43_i$ and the optically non-used intermediate regions 47 is desirably accommodated over the length l. This results in a minimum length $l_{min}$ for the length l.

It has furthermore been recognized that for every length l there is a minimum distance d in order to completely separate the individual output beams $10_i$ from one another. Conversely, for a given distance d there is a maximum length $l_{max}$ which the optical component 42 is permitted to have.

Figure 16:
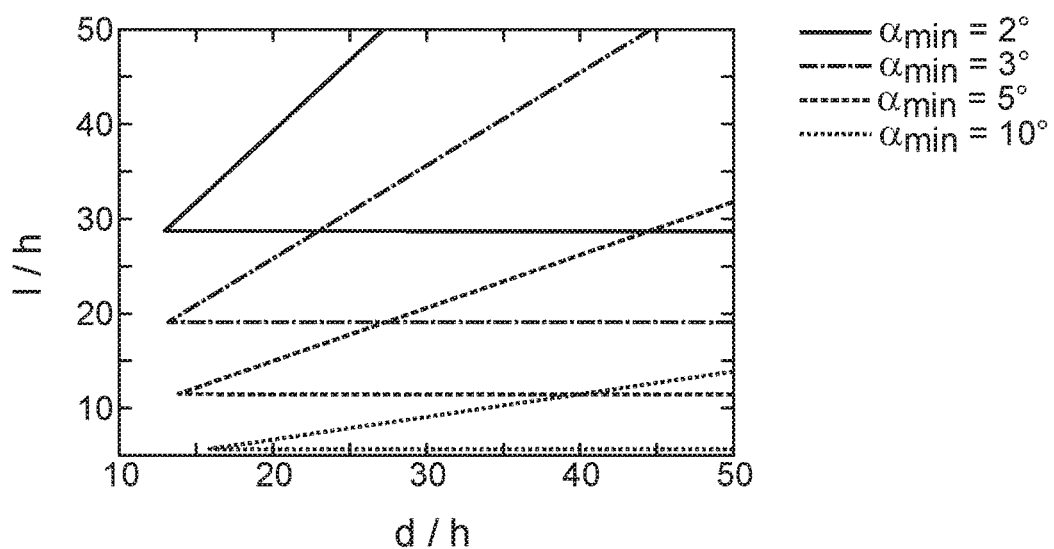
FIG. 16 shows a diagram for illustrating geometrical relationships with regard to the optical component in accordance with FIG. 15.

FIG. 16 illustrates allowed parameter ranges for different minimum angles $\alpha_{min}$ in the case of M=10 scanners $3_i$. The allowed parameter range is in each case the range between the two delimiting lines.

The delimitations of the allowed parameters ranges depend firstly on the number of scanners $3_i$ among which the illumination radiation is intended to be divided, that is to say the number of individual output beams $10_i$ into which the collective output beam 8 is intended to be divided. They additionally depend on the angle $\alpha_{min}$, by which the illumination radiation 5 which is subjected to the greatest grazing reflection is reflected.

A further embodiment of the optical component 42 is described below with reference to FIGS. 17 to 19. In the case of the embodiment of the optical component 42 in accordance with FIGS. 17 to 19, the radiation-reflecting regions $43_i$ for coupling out the partial beams $12_i$ of an individual output beam $10_i$ from the collective output beam 8 are embodied in a lamellar fashion. They are held in each case by two holding structures 50 situated opposite one another.

A radiation-transmissive region 51 is in each case arranged between the regions $43_i$. The optical component 42 has a staircase-like shape, in particular. It is embodied in particular in the manner of an open staircase, that is to say without risers. In this case, the steps of the staircase are inclined relative to the horizontal.

The holding structures 50 are embodied in a stringboard-like fashion. The holding structures 50 can have a substantially arbitrary cross section in a direction perpendicular to the longitudinal extent y of the radiation-reflecting regions $43_i$. The cross section is polygonal, in particular. It can be, in particular, parallelogram-shaped, non-rectangular or rectangular.

By virtue of a parallelogram-shaped, non-rectangular or generally an irregularly polygonal or free cross section of the holding structures 50, the radiation-reflecting regions $43_i$ of a group can be arranged at different locations in the z-direction of the beam path of the illumination radiation 5. This makes it possible to reduce the diameter of the light tube 49 including the partial beams $12_i$ of one of the individual output beams $10_i$.

The regions $43_i$ of a group have, in particular, in each case identical tilting angles with respect to the direction of incidence of the collective output beam 8. The dimensions of the regions $43_i$ in the x-direction are in turn determined by the method described above.

Figure 17:
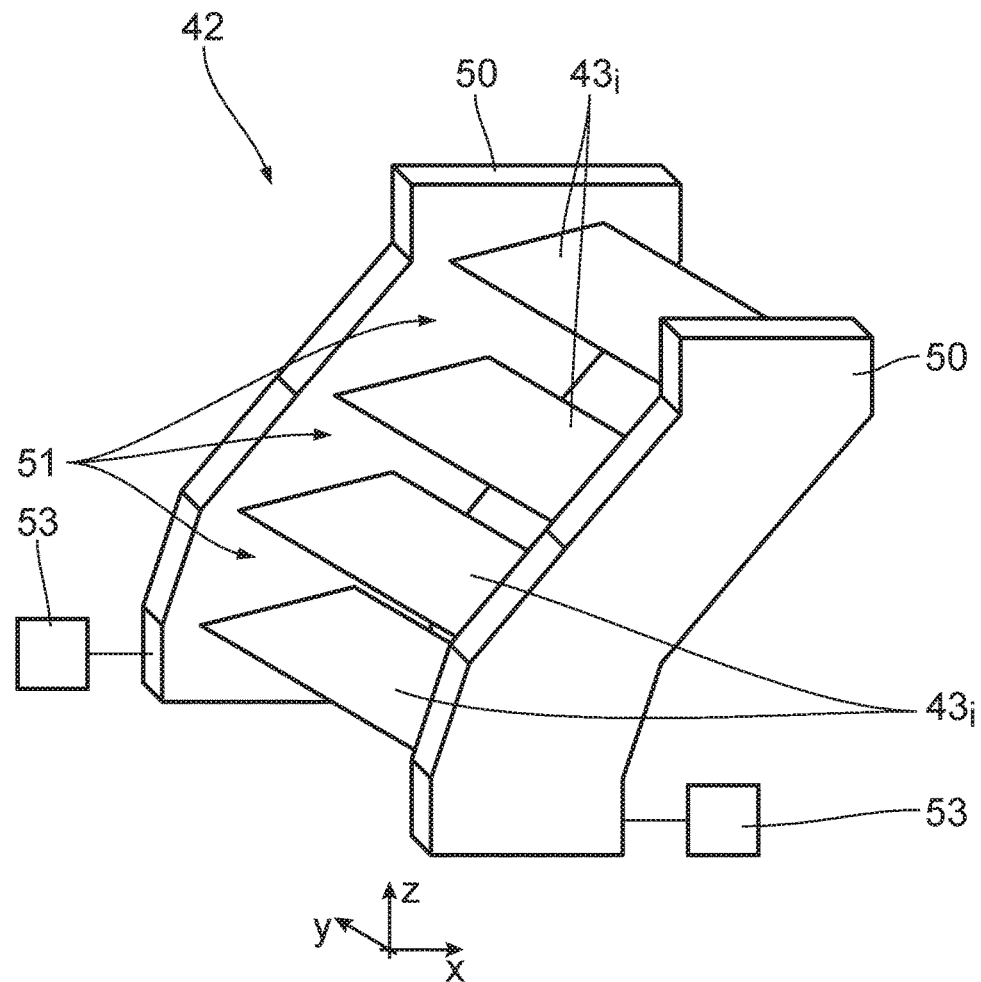
FIG. 17 shows a schematic illustration of an alternative embodiment of an optical component for coupling out an individual output beam from a collective output beam.
Figure 18:
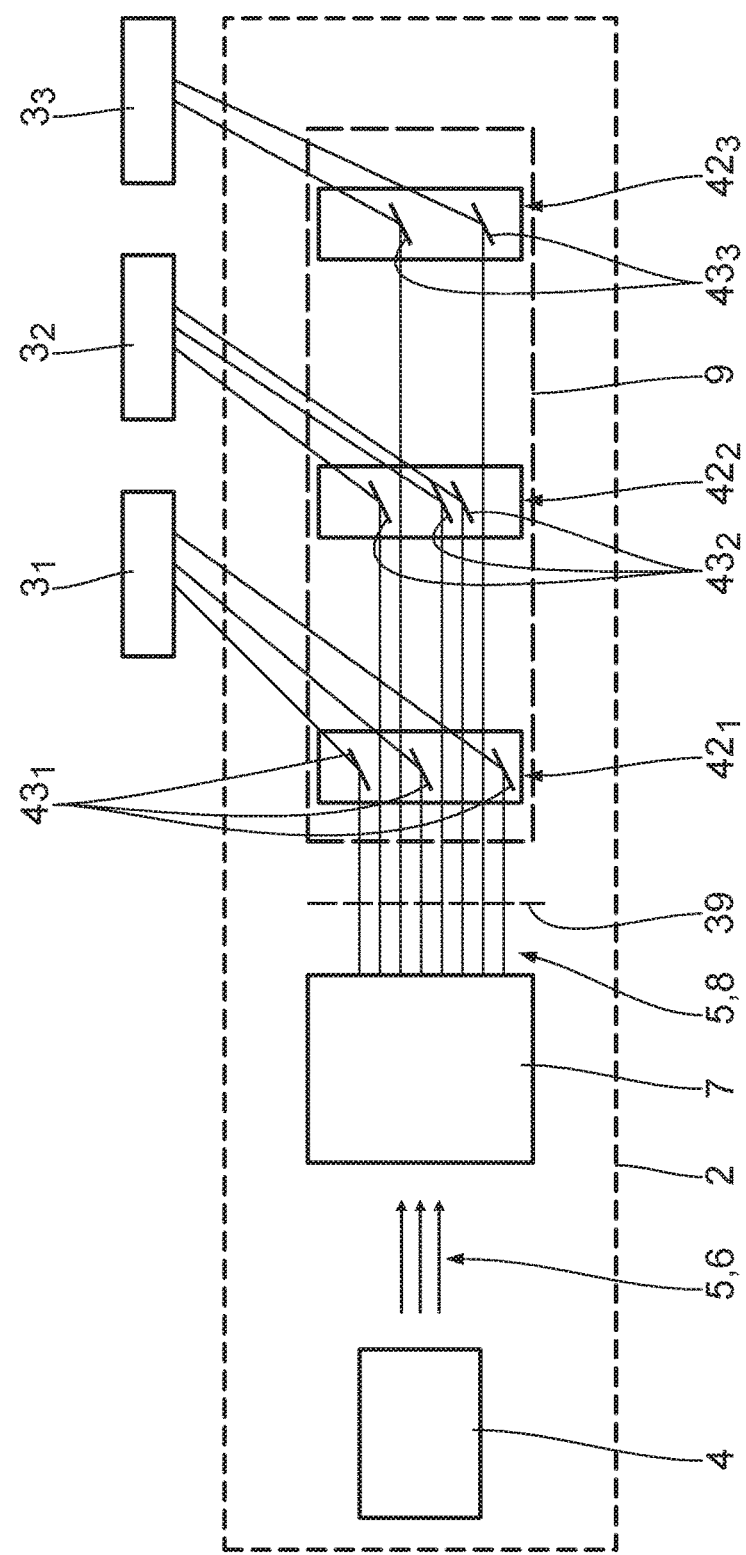
FIGS. 18 and 19 show different alternatives for elucidating the arrangement of the optical component in accordance with FIG. 17 in the beam path of an illumination system of a projection exposure system including a plurality of scanners.
Figure 19:
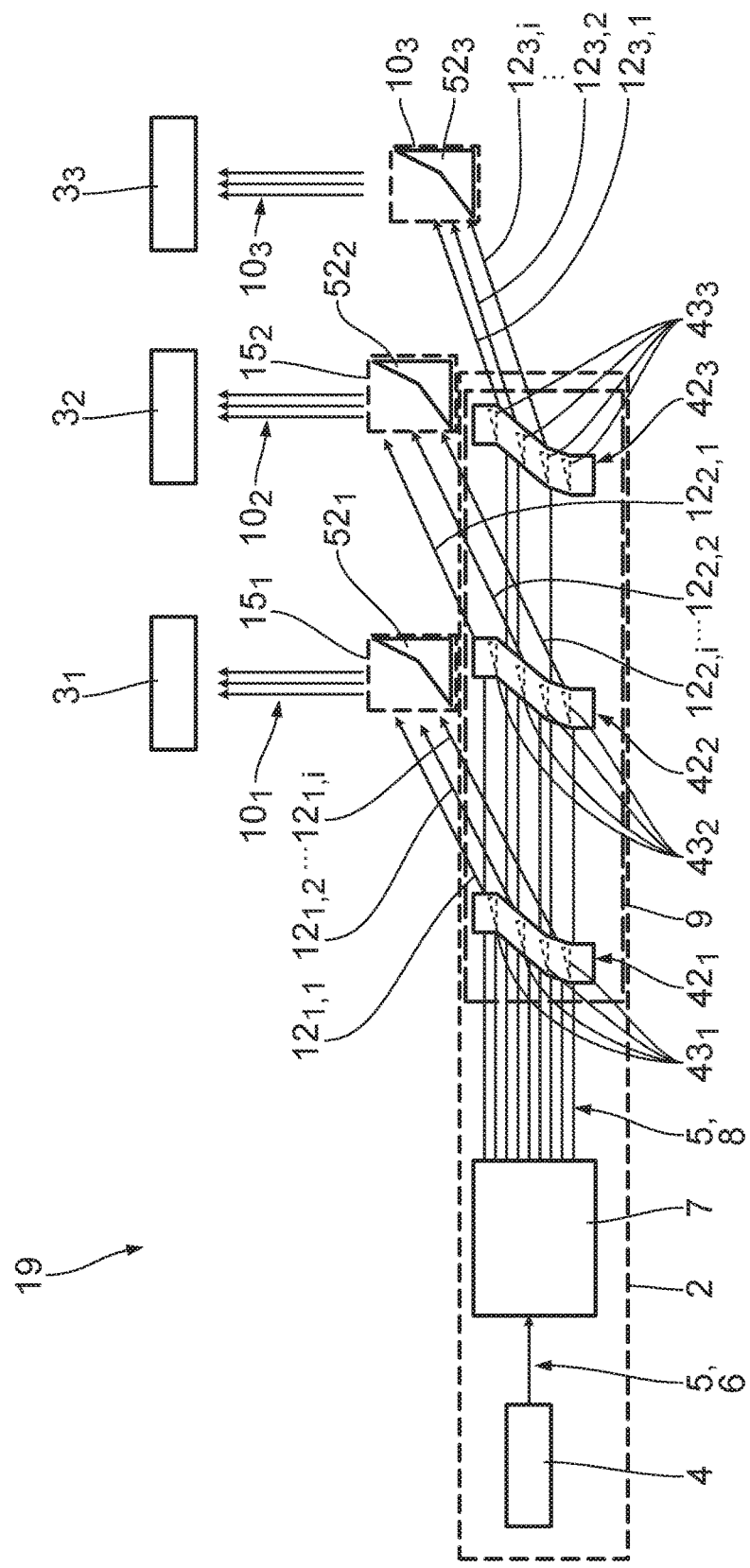

In the case of the embodiment illustrated in FIGS. 17 to 19, the optical component 42 serves for coupling out a single one of the individual output beams $10_i$ from the collective output beam 8. The individual output beam $10_i$ in turn includes a plurality of partial beams $12_i$. The remaining individual output beams $10_i$ pass through the optical component 42 without being impeded, in particular without being influenced, through the radiation-transmissive interfaces 51.

In accordance with an alternative which is not illustrated in the figures, in this embodiment of the optical component 42 as well, provision can be made for it to include regions $43_i$, $43_j$ of different groups i, j. In principle, it is also possible to embody the optical component 42 in accordance with the alternative illustrated in FIG. 17 in such a way that it is suitable for coupling out all the individual output beams $10_i$ from the collective output beam 8.

FIG. 19 illustrates one possible arrangement of three of the optical components 42 in accordance with FIG. 17 in the beam path of the illumination radiation 5. In this arrangement, each of the optical components $42_i$ couples out in each case a specific individual output beam $10_i$ having a plurality of partial beams $12_{ij}$ from the collective output beam 8. The individual output beams $10_i$ are guided in each case to a specific one of the scanners $3_i$. They can be deflected here in each case by a deflection optical unit $15_i$, in particular by a deflection element $52_i$.

In the embodiment in accordance with FIG. 19, the individual output beam $10_i$ enters the scanner $3_i$ in each case in the vertical direction. For this purpose, the individual output beam $10_i$ is deflected at the deflection element $52_i$. It is deflected in particular by almost 90°. It is deflected in particular by at least 60°, in particular at least 70°, in particular at least 80°. The deflection element $52_i$ can in each case be dispensed with if the individual output beam $10_i$ is intended to enter the respective scanner $3_i$ from a direction which deviates from the horizontal by less than 30°, in particular less than 20°, in particular less than 10°.

FIG. 18 schematically illustrates a corresponding embodiment. In this case, the deflection angles of the partial beams $12_{ij}$ at the regions $43_i$ are shown significantly larger than is actually the case, for illustration reasons.

As is indicated schematically in FIG. 17, the holding structures 50 are in each case thermally conductively connected to a cooling device 53. The lamellar regions $43_i$ are in thermal contact with the holding structures 50. They can dissipate heat via the holding structures 50 in particular by heat conduction. In this case, it is found that the maximum temperature in the regions $43_i$ when illumination radiation 5 impinges thereon is attained in each case in the centre region. According to the disclosure, it has been possible to show that the maximum temperature in the regions $43_i$ for a given total heat input increases with their extent in the y-direction. A distribution of the incident illumination radiation 5 over a largest possible area can therefore be disadvantageous. In order to ensure a sufficient cooling of the regions $43_i$ via the cooling device 53 and the holding structures 50, provision can therefore be made for the regions $43_i$ to have at most a maximum extent in the y-direction.

A further alternative of the optical component 42 is described below with reference to FIG. 20. In the case of the alternative in accordance with FIG. 20, the individual output beam $10_1$ is coupled out from the collective output beam 8, while the remaining individual output beams $10_i$ (i>1) are guided further together, that is to say parallel to one another. In this alternative, the individual output beams $10_i$ which are not coupled out, but rather guided further jointly, are also deflected by radiation-reflecting regions 54.

The further guidance of the individual output beam $10_1$ to the scanner $3_1$ corresponds to that of the alternatives described above, to which reference is hereby made.

The remaining individual output beams $10_i$ (i>1) still form a collective output beam $8^1$, decreased by the individual output beam $10_1$. A description is given below of two different variants of how the individual output beams $10_i$ (i>1) are coupled out from the collective output beam $8^1$ and guided to the respective scanner $3_i$ (i>1).

An embodiment of the optical component 42 in accordance with FIG. 20 can facilitate the cooling of the optical component 42. In this embodiment, in particular, a cooling device (not illustrated in FIG. 20) can be provided in the region of the mirror bodies 56.

In accordance with the variant illustrated schematically in FIG. 21, a multiplicity of the optical component 42 illustrated in FIG. 20 are arranged one behind another in the beam path of the illumination radiation 5. The number M of optical components 42 precisely corresponds to the number of scanners $3_i$. Such a component 42 can be dispensed with for the last scanner $3_M$ and so the number of optical components 42 can also be M-1.

The optical component 42 serves in each case for coupling out one of the individual output beams $10_i$ from the collective output beam $8^i$ that remains, if appropriate, after a number of individual output beams $10_j$ (j<i) have been coupled out. Moreover, the component 42 leads in each case to a deflection of the collective output beam $8^i$ that remains after the individual output beam $10_i$ has been coupled out.

One advantage of this embodiment is that no transmission loss occurs if the radiation upstream of the respective scanner $3_i$ has to be deflected even further anyway. When a ray is deflected by a given angle via grazing reflection, the total transmission is all the higher, the higher the number of individual reflections among which the total deflection is distributed. The transmission loss as a result of the deflection at the component 42 is therefore compensated for or even overcompensated for by the higher transmission of the residual deflection.

As an alternative thereto, provision can be made for deflecting the collective output beam $8^i$ that remains after a number of individual output beams $10_i$ have been coupled out back into the horizontal or even beyond that in each case via an additional reflection at a mirror element 55.

Further details of different embodiments of the radiation source module 2, in particular of the output coupling optical unit 9, are described below. The details of the embodiments described below, in particular the details of the controllable division of the collective output beam 8 into the controllable individual output beams $10_i$, in particular temporal details of the control of the division, can be combined arbitrarily with the details of the above-described embodiments, in particular the details of the optical components 42 and/or of the division of the separating plane 39 into the regions $43_i$.

The radiation source module 2 is, in particular, a constituent part of the illumination system 19. The illumination system 19 additionally includes a plurality M of beam guiding optical units $13_i$ for guiding the individual output beams $10_i$ to the different object fields $11_i$ of the different scanners $3_i$.

The output coupling optical unit 9 is, in particular, a constituent part of the illumination device 18. The illumination device 18 together with the radiation source 4 or generally with a radiation source unit, which in principle can also include a plurality of different radiation sources 4, forms the illumination system 19.

Figure 23:
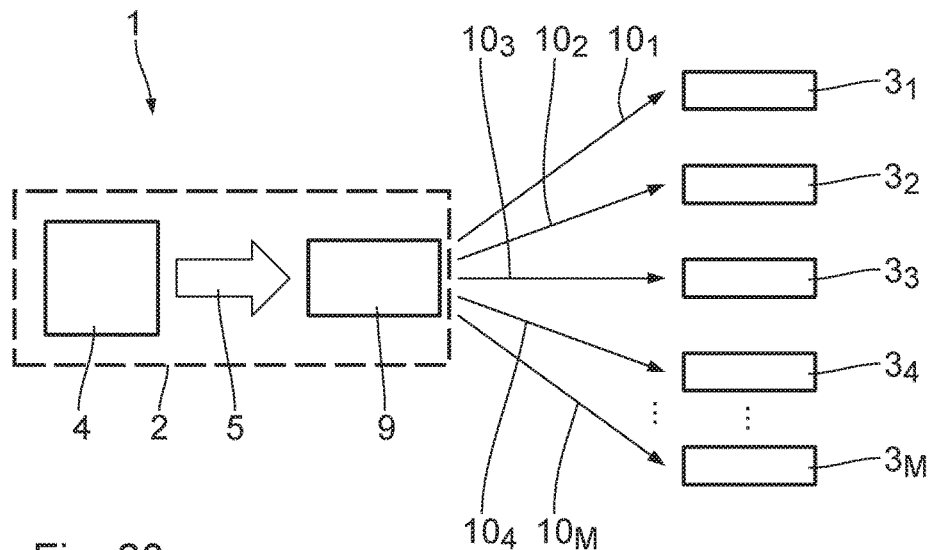
FIG. 23 shows an alternative schematic illustration of the projection exposure system including a plurality of scanners.

The basic construction of the projection exposure system 1 is illustrated once again highly schematically in FIG. 23. In the case of the projection exposure system 1, a plurality M of the scanners $3_i$ are supplied with illumination radiation 5 by the radiation source module 2, in particular by the single radiation source 4. In particular, a single, high-power free electron laser (FEL) serves as the radiation source 4. The total power of the illumination radiation 5 which is emitted by such a radiation source 4 can be in the range of 1 kW to 35 kW, in particular in the range of 10 kW to 25 kW.

Figure 24:
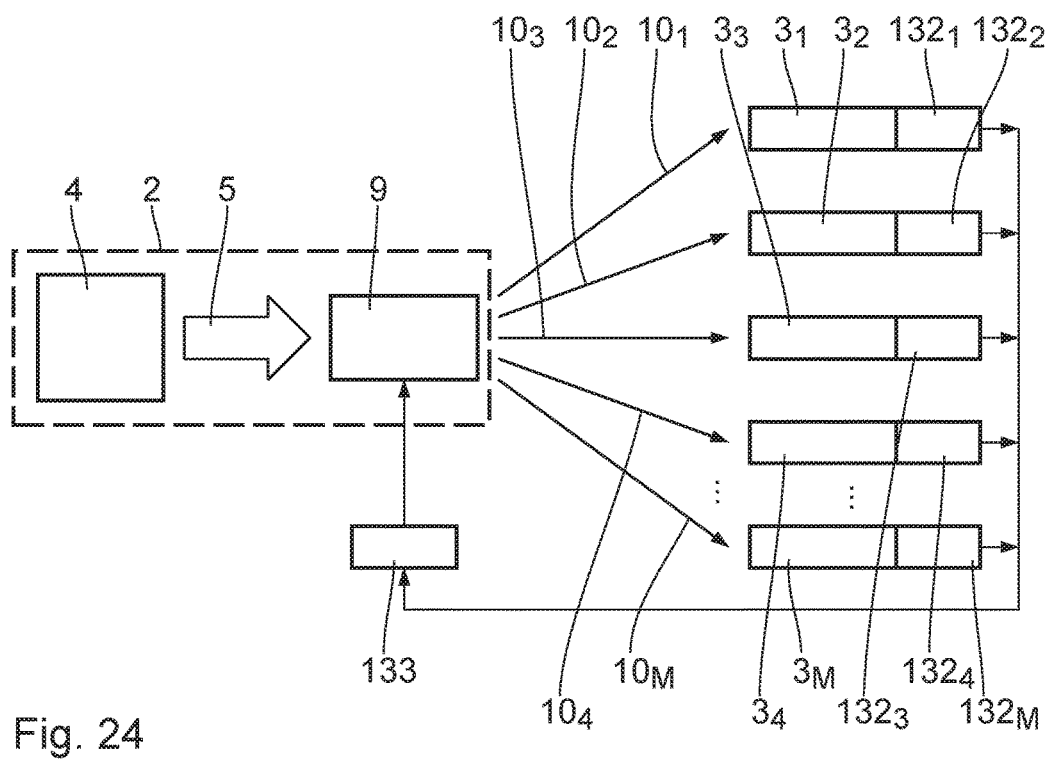
FIG. 24 shows a further alternative of the projection exposure system.

In accordance with the variant illustrated in FIG. 24, a sensor $132_i$ is assigned to each of the scanners $3_i$. The sensor $132_i$ is an energy sensor, in particular. The intensity or dose of the illumination radiation 5 that is transferred to the individual object fields $11_i$, in particular to the individual image fields $23_i$, can be determined with the aid of the sensors $132_i$. The sensors $132_i$ enable, in particular, a continuous determination of the intensity or dose of the illumination radiation 5. They enable, in particular, a determination of the intensity or dose of the illumination radiation 5 in real time.

The sensors $132_i$ are connected to a control device 133 in a signal-transmitting manner. For its part, the control device 133 is connected to the output coupling optical unit 9 in a signal-transmitting manner.

With the aid of the sensors $132_i$ and the control device 133, the output coupling optical unit 9 can be controlled with feedback, that is to say controlled by closed-loop control.

The control device 133 can include a computing unit. The control device 133 can also be connected to the radiation source 4 in a signal-transmitting manner. It can serve in particular for controlling the intensity of the illumination radiation 5 that is emitted by the radiation source 4. A separate control device can also be provided for this purpose.

An FEL is suitable, in particular, for a projection exposure system 1 including a multiplicity of scanners $3_i$ since the costs for an FEL rise only slowly with the power thereof, such that the costs per power are significantly lower for a high-power FEL than for an FEL having lower power.

According to the disclosure, it has been recognized that the radiation dose that reaches the individual scanners $3_i$ has to be controlled very accurately. The allowed errors or the allowed fluctuations of the radiation dose that reaches the individual scanners $3_i$ is in particular at most 1%, in particular at most 0.5%, in particular at most 0.3%, in particular at most 0.2%, in particular at most 0.1%, in particular at most 0.05%.

The dose has to be controlled in particular on a timescale which is faster than the time during which a point on the reticle $22_i$ passes through that region of the object field $11_i$ which is illuminated by the illumination optical unit $17_i$. The time is identical to the time by the point optically conjugate with respect thereto on the wafer $25_i$ in order to pass through the corresponding region of the image field $23_i$. The region is also referred to as a scan slot. The time is usually at least 1 ms, in particular at least 5 ms. The dose with which a point on the wafer $25_i$ is illuminated thus arises as a result of the integral over this movement and is therefore also referred to as the scan integral. The dose control takes place in particular on a timescale of at most 1 ms, in particular at most 0.5 ms, in particular at most 0.3 ms, in particular at most 0.2 ms, in particular at most 0.1 ms.

It has furthermore been recognized that for such fast dose control it is advantageous if the mechanical components used therefor do not have to be multiply accelerated and decelerated.

The means described below for adapting the radiation dose which is guided to the individual scanners $3_i$ enable a variation of the intensity, in particular a variation of the illumination radiation reaching the individual scanners $3_i$, in particular the object fields $11_i$ thereof, in particular the image fields $23_i$ thereof, of up to ±1%, in particular of up to ±5%, in particular of up to ±10%.

A more intense dose adaptation may be desired on long timescales. This can be achieved, if appropriate, with additional means.

The variants described below make use of the fact that the illumination radiation 5 emitted by an FEL, in particular its intensity, can be controlled, in particular controlled by closed-loop control, very rapidly and easily for example by altering the number of generated electrons, by altering the repetition frequency of the FEL or by omitting individual pulses of the FEL. The control, and in particular closed-loop control, frequency of the radiation source 4 is in particular at least 1 MHz, in particular at least 10 MHz, in particular at least 100 MHz. It can be up to 1 GHz, in particular up to 10 GHz, in particular up to 100 GHz. The electrons can be generated in particular by the bombardment of an electrode via a laser. Lasers can be controlled very rapidly and without hysteresis, such that the intensity is advantageously controllable when such an electron source is used.

In order to be able to set the dose for the different scanners $3_i$ independently of one another, the disclosure uses the intensity control possibility of the FEL and a means for varying the division ratio of the total intensity of the collective output beam 8 into individual intensities of the individual output beams $10_i$. If the total intensity of the FEL and the division ratio of the total intensity of the collective output beam 8 into individual intensities of the individual output beams $10_i$ is controlled by closed-loop control, then the dose for each scanner $3_i$ can be controlled by closed-loop control independently of one another. It has been recognized that, for an independent closed-loop control of the dose for a plurality of scanners $3_i$, it suffices if the division ratio among the plurality of scanners $3_i$ can be described only by a single degree of freedom. Furthermore, it has been recognized that, for an independent closed-loop control of the plurality of scanners $3_i$, it may suffice if the division ratio among the plurality of scanners is only temporally variable, but not controllable.

Different variants of the means for varying the division ratio of the total intensity of the collective output beam 8 into individual intensities of the individual output beams $10_i$ are described below.

A variant of the radiation source module 2, in particular of the output coupling optical unit 9, is described below with reference to FIGS. 25 and 26.

The figures illustrate by way of example an output coupling optical unit 9 that is used to divide the collective output beam 8 into four individual output beams $10_1$ to $10_4$. This serves primarily for elucidating the concept according to the disclosure. The collective output beam 8 can also be divided into a number of individual output beams $10_i$ that deviates therefrom. The number of individual output beams $10_i$ corresponds in particular precisely to the number M of scanners $3_i$ of the projection exposure system 1.

The output coupling optical unit 9 includes a means for varying the division ratio of the total intensity of the collective output beam 8 into the individual intensities of the individual output beams $10_i$. In the case of the variant illustrated in FIGS. 25 and 26, the means is embodied as a separating plate 134, which is generally also referred to as a separating component.

The separating plate 134 is embodied in a rectangular fashion. It is arranged in a stationary fashion in the beam path of the illumination radiation 5.

The separating plate 134 is embodied in particular as a structured mirror. It has different regions $135_i$.

Each of the regions $135_i$ is assigned to exactly one of the scanners $3_i$. The regions $135_i$ are embodied in particular in each case in such a way that they result in the transfer of the illumination radiation 5 impinging on them to a specific one of the scanners $3_i$. With the aid of the separating plate 134, therefore, the collective output beam 8 can be divided into the individual output beams $10_i$.

The regions $135_i$ have in particular different orientations. This has the effect that the collective output beam 8 has different angles of incidence on the different regions $135_i$. This makes it possible, in a simple manner, to divide the collective output beam 8 into individual output beams $10_i$ specifically assigned to the individual scanners $3_i$.

Moreover, the output coupling optical unit 9 has a rotating polygon mirror 136.

The illustration of the polygon mirror 136 in the figures should be understood to be by way of example. It serves merely for explaining the underlying concept. The polygon mirror 136 in reality usually has a larger number of side faces.

In this variant, therefore, the output coupling optical unit 9 includes a rotating element, the polygon mirror 136, and a stationary element, the separating plate 134, which is provided with a location-dependent division ratio of the total intensity of the collective output beam 8 to the individual intensities of the individual output beams $10_i$.

The rotating polygon mirror 136 is arranged in the beam path between the radiation source 4 and the separating plate 134, in particular between the beam shaping optical unit 7 and the separating plate 134.

The polygon mirror 136 is arranged in the beam path of the illumination radiation 5 in such a way that the collective output beam 8 is reflected in each case from one of the reflective sides of the polygon mirror 136 to the separating plate 134, where it illuminates an illumination region 137. The illumination region 137 is embodied in a strip-shaped fashion. Alternative shapes of the illumination region 137 are likewise possible and will be described in even greater detail below. The exact shape of the illumination region 137 can be determined via the beam shaping optical unit 7 and/or the polygon mirror 136.

Figure 25:
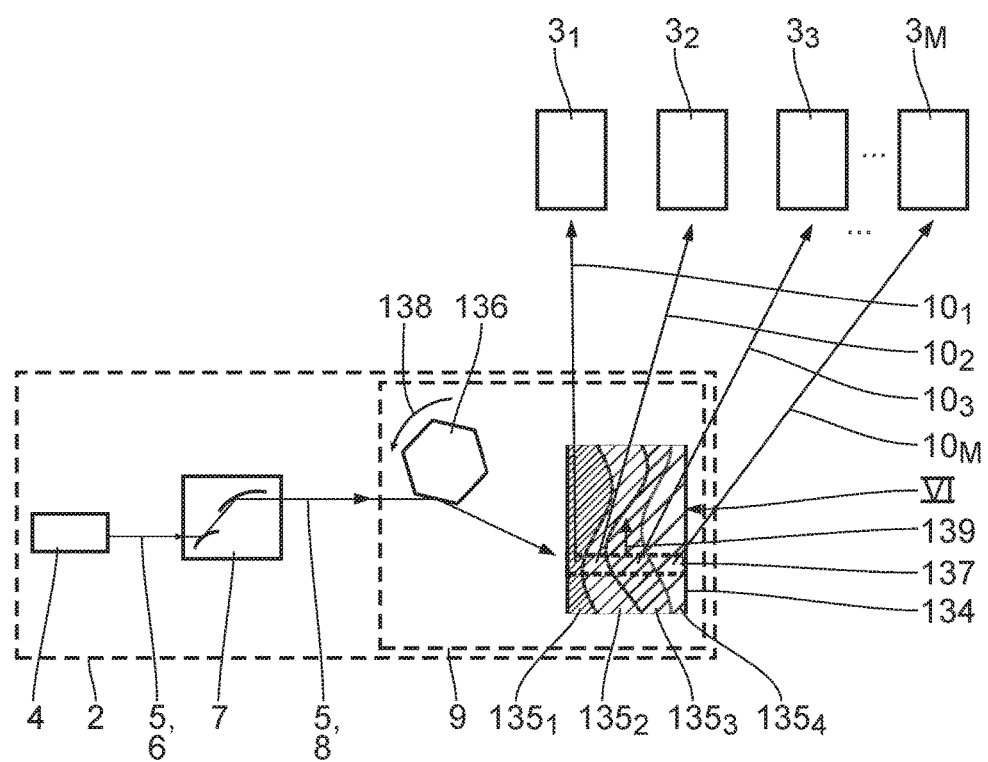
FIG. 25 shows a further schematic illustration of the projection exposure system with details of a radiation source module in accordance with a first variant.
Figure 26:
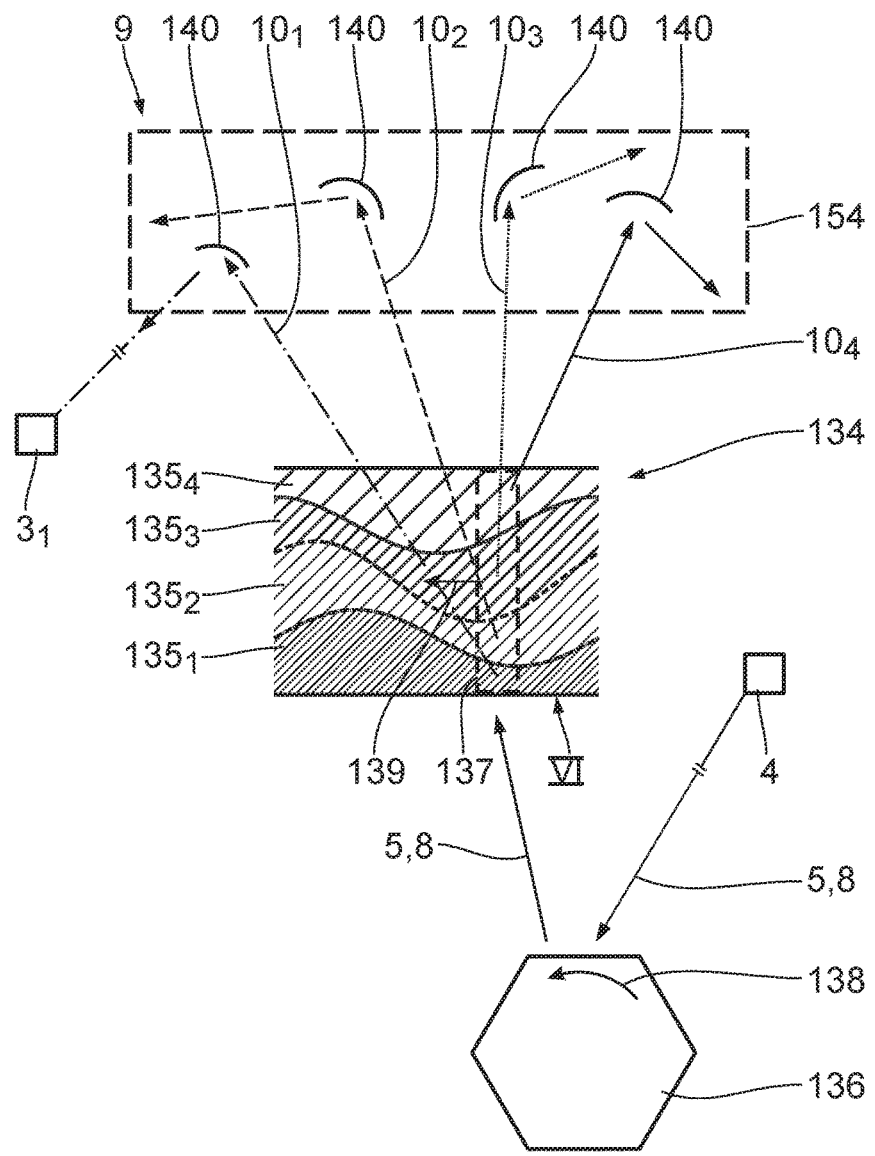
FIG. 26 shows an illustration for explaining details of the radiation source module with an additional imaging optical unit.

In the case of the variant illustrated in FIGS. 25 and 26, the illumination region 137 extends with its longer side over the entire width of the separating plate 134. In a direction perpendicular thereto, the illumination region 137 covers only a partial region of the separating plate 134. The illumination region 137 has, in particular, a width whose ratio to the length, that is to say to the longer side, of the separating plate 134 is at most 1:2, in particular at most 1:3, in particular at most 1:5, in particular at most 1:10.

The polygon mirror 136 is mounted rotatably. It is mounted rotatably in particular about a central longitudinal axis running parallel to all of its side faces.

For the displacement, that is to say for the rotation, of the polygon mirror 136, provision is made of a control unit (not illustrated in the figures) with an actuator, in particular in the form of a motor. The rotation of the polygon mirror 136, in particular the rotational speed thereof, can be controllable. In an alternative embodiment, the polygon mirror 136 has a fixedly predefined, non-controllable rotational speed. The rotational speed of the polygon mirror 136 need not necessarily be kept precisely constant. The polygon mirror 136 can also have a slightly fluctuating rotational speed if a means for determining the present position of the polygon mirror is present.

A rotation of the polygon mirror 136 in a rotation direction 138 leads to a displacement, in particular a shifting, of the illumination region 137 in a displacement direction 139 relative to the separating plate 134. Via the polygon mirror 136, therefore, it is possible to shift the illumination region 137 on the separating plate 134. The relative position of the illumination region 137 on the separating plate 134 and thus the variation of the division ratio of the total intensity of the collective output beam 8 into the individual intensities of the individual output beams $10_i$ can be varied in particular periodically with a period $T_{Var}$.

In order to compensate for a variation of the angles of incidence of the collective output beam 8 on the different regions $135_i$ in the case of a displacement of the illumination region 137 relative to the separating plate 134, the regions $135_i$ can be provided with a refractive power. Provision can be made, in particular, for providing the regions $135_i$ along the x-axis illustrated in FIG. 26, that is to say parallel to the displacement direction 139, with a refractive power. As an alternative or in addition thereto, as is illustrated schematically and by way of example in FIG. 26, for each of the individual output beams $10_i$ provision can be made of an additional optical element 140, in particular in the form of a mirror, which serves for transferring a respective one of the individual output beams $10_i$ from the separating plate 134 to one of the scanners $3_i$. The optical element 140 can be provided in each case with a refractive power. The optical elements 140 form constituent parts of an imaging optical unit 154. The imaging optical unit 154, in particular the optical elements 140, can form constituent parts of the output coupling optical unit 9. With the aid of the optical element 140, it can be ensured that the entrance point of the individual output beam $10_i$ into the scanner $3_i$ is independent of the impingement point of the collective output beam 8 on the separating plate 134, in particular independent of the position of the illumination region 137 in the displacement direction 139.

During a rotation of the polygon mirror 136, the angle of incidence of the collective output beam 8 on the reflective side faces changes. To a good approximation, the difference between the largest and smallest angles of incidence of the collective output beam 8 on the polygon mirror 136 scales with the reciprocal of the number of side faces thereof. The more side faces the polygon mirror 136 has, the smaller the interval of the different angles of incidence of the collective output beam 8 on the polygon mirror 136. The angle of incidence of the collective output beam 8 on the polygon mirror 136 has an influence on the reflectivity. In order to ensure that the polygon mirror 136 has a minimum reflectivity, a maximum permissible angle of incidence can be predefined. Conversely, a minimum angle of incidence can also be predefined. Given a difference between maximum angle of incidence and minimum angle of incidence of 10°, a number of side faces of the polygon mirror 136 of 136 resulted.

The number of side faces of the polygon mirror 136 is in particular at least 12, in particular at least 18, in particular at least 24, in particular at least 136. It can be up to 120, in particular up to 180, in particular up to 360.

By increasing the number of side faces of the polygon mirror 136, which are also referred to as facets, it is possible to reduce the rotational speed of the polygon mirror 136.

The larger the number of side faces of the polygon mirror 136, the larger the distance between the polygon mirror 136 and the separating plate 134, given a predefined size of the separating plate 134. The polygon mirror is embodied and arranged in particular in such a way that the illumination region 137 in each case sweeps over the entire separating plate 134 during a rotation of the polygon mirror 136. The rotation angle of the individual facets is thus directly associated with the dimensions of the separating plate 134 in the displacement direction 139 and the distance between the separating plate 134 and the polygon mirror 136. For a polygon mirror 136 having 64 facets and a distance of 1 m between polygon mirror and separating plate 134, a length of around 200 mm results for the region swept over in the displacement direction 139. To a good approximation, these indications can be scaled for other geometries, that is to say that the length of the region swept over in the displacement direction 139 is proportional to the distance between polygon mirror 136 and separating plate 134 and inversely proportional to the number of facets of the polygon mirror.

In accordance with one alternative of the disclosure, a further component, in particular in the form of a mirror 141, can be arranged between the polygon mirror 136 and the separating component 134. The mirror 141 serves for increasing the deflection angle brought about by the polygon mirror 136.

An increase in the deflection angle may be desirable in order to ensure that the illumination region 137 sweeps over the entire separating plate 134 during a rotation of the polygon mirror 136. This makes it possible to decouple the embodiment and/or arrangement of the separating plate 134 from the number of facets of the polygon mirror 136.

Moreover, the maximum deflection angle by which the illumination radiation is deflected on its way to the separating plate 134 during an individual reflection can be reduced via the mirror 141. The transmission can be increased by a total deflection being distributed among a plurality of partial reflections.

Figure 64:
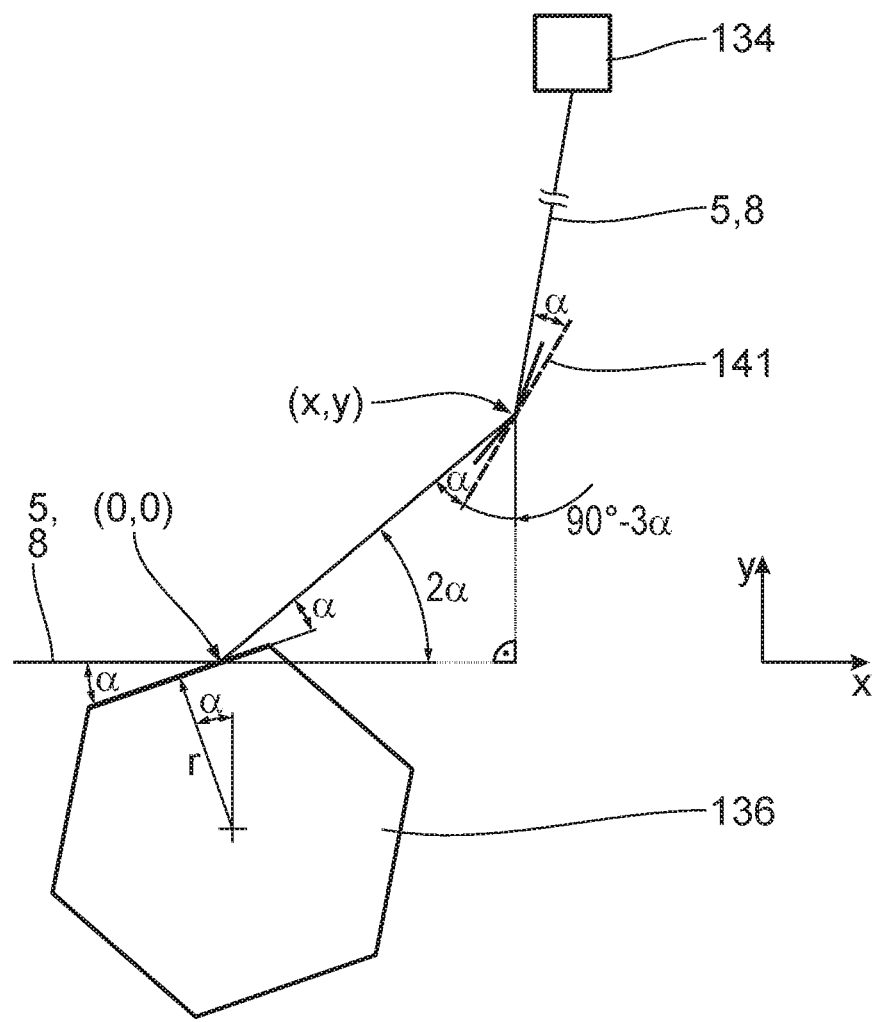
FIG. 64 shows a schematic illustration of an angle enlarging component.
Figure 65A:
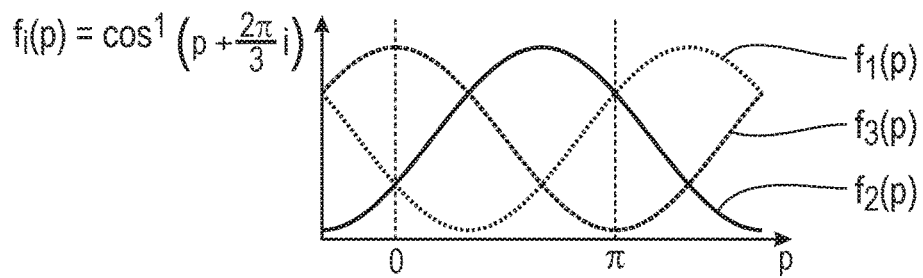
FIGS. 65A to 65D show schematic illustrations of the individual functions which in each case represent the deviation of the surface area of the regions of the separating plates in accordance with FIGS. 28A to 28B from a nominal value.
Figure 65B:
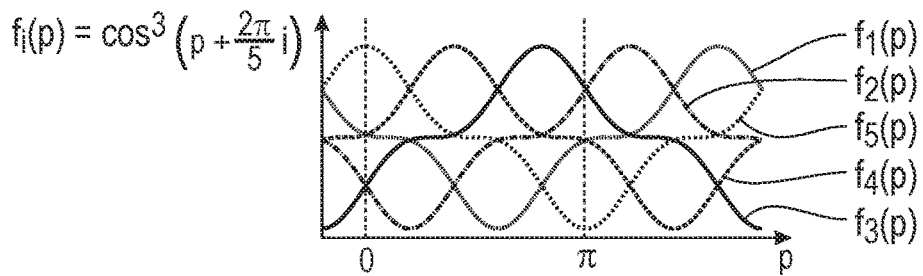
Figure 65C:
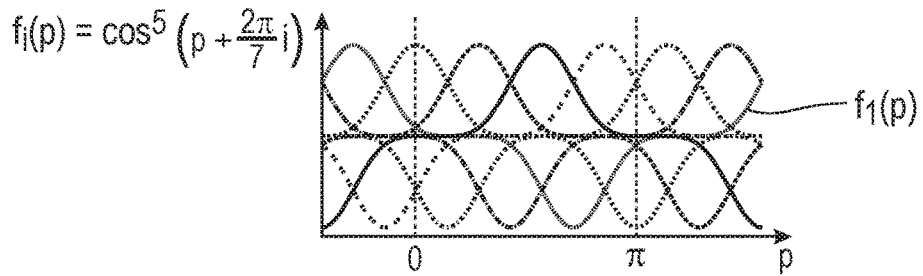
Figure 65D:
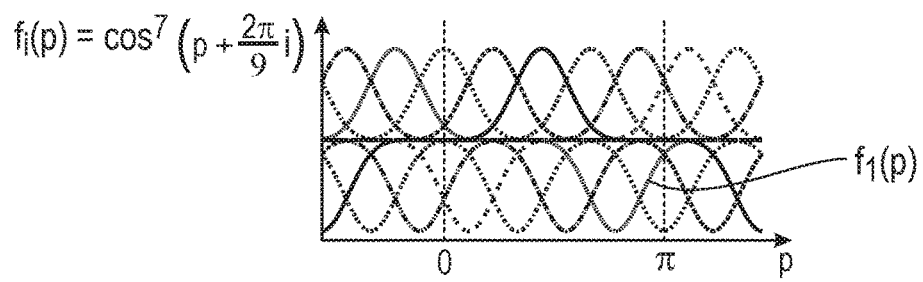
Figure 66:
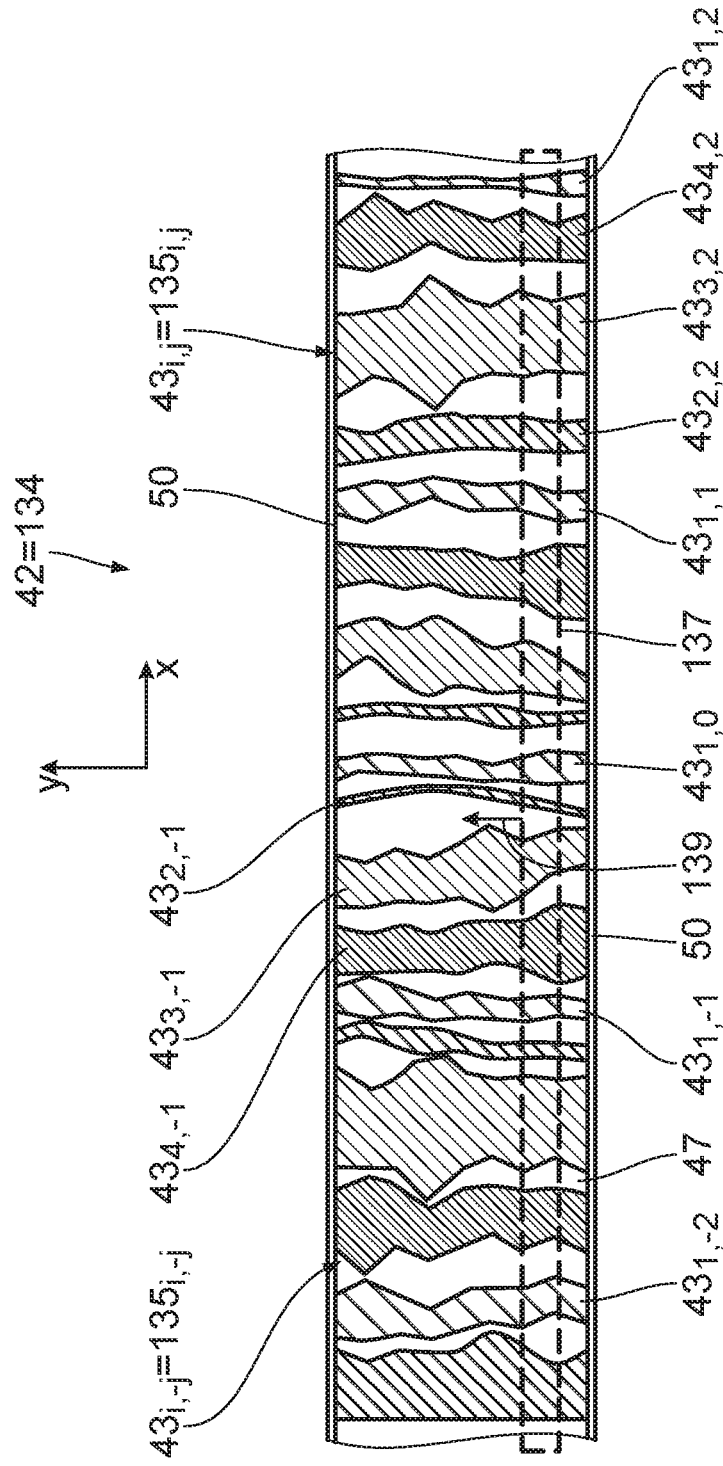
FIG. 66 shows a schematic illustration of a further variant of the optical component, FIG. 67 schematically shows a projection exposure apparatus for EUV projection lithography, FIG. 68 likewise schematically shows a leading portion of an EUV beam path for a system of a plurality of projection exposure apparatuses according to FIG. 67, proceeding from an EUV light source for generating an EUV raw beam to downstream of an output coupling optical unit for generating a plurality of EUV individual output beams from an EUV collective output beam.

A corresponding alternative in which the mirror 141 is arranged in the beam path between the polygon mirror 136 and the separating plate 134 is illustrated schematically in FIG. 64. In the case of the variant illustrated, the collective output beam, in the illustrated position of the polygon mirror 136, impinges at an angle α on a side face of the polygon mirror 136, that is to say is deflected overall by 2α.

The mirror 141 is arranged relative to the polygon mirror 136 in such a way that the collective output beam 8 reflected at the side face of the polygon mirror 136 is deflected by the angle 2α at the mirror 141.

The mirror 141 has a curved surface. If the mirror 141 is intended to lead precisely to a doubling of the deflection angle, the shape of the surface of the mirror 141 results as a solution of the following differential equation:

$$\frac{dy(x)}{dx} = \tan\left[\frac{3}{2}\tan^{-1}\frac{y(x)}{x}\right]$$

This differential equation has a one-parameter family of solutions of the following form:

$$y(x)=\tfrac{1}{2}\sqrt{2c^2-2c^{3/2}\sqrt{c-4x}-4cx-4x^2}$$

If the deflection angle is intended generally to be increased by a factor f, the shape of the surface results as a solution of the following differential equation:

$$\frac{dy(x)}{dx} = \tan\left[\frac{f+1}{2}\tan^{-1}\frac{y(x)}{x}\right]$$

The mirror 141 having such a surface forms an angle increasing component with a predefined translation. In the case of the angle increasing component, in particular the effective angles of incidence and reflection are proportional to one another.

In principle, the mirror 141 can also have an alternative surface shape. This is possible, in particular, if the proportionality between angle of incidence and angle of reflection is not of importance.

In principle, the factor f can also be less than 1. This case involves an angle reducing component which should generally be regarded as an angle increasing component with an increase <1.

In the case of the exemplary embodiment illustrated in FIGS. 25 and 5, a rotation of the polygon mirror 136 leads not only to the shifting of the illumination region 137 along the displacement direction 139, but also to a change in the impingement angle of the collective output beam 8 on the separating plate 134. Such an alteration of the impingement angle may be undesirable. In other words, it may be advantageous to be able to offset the collective output beam in a parallel fashion. The illumination region 137 can then be displaced in the displacement direction 139 relative to the separating plate 134, without a change in the impingement angle of the collective output beam 8 on the separating plate 134 occurring.

Figure 62:
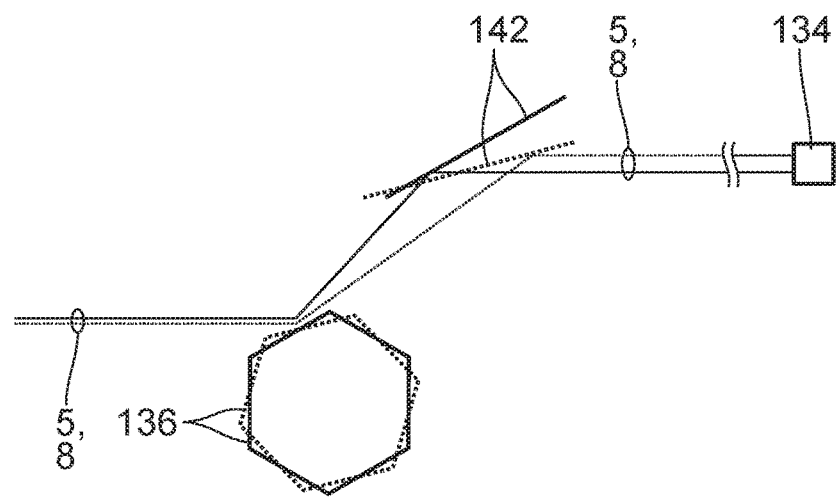
FIGS. 62 and 63 show schematic illustrations of optical components for the parallel offset of an illumination beam.

A variant for such a solution is illustrated schematically in FIG. 62. In accordance with this variant, an actuatable plane mirror 142 is arranged in the beam path between the polygon mirror 136 and the separating plate 134. Two different beam paths of the illumination radiation 5 with different positions of the polygon mirror 136 and of the actuatable plane mirror 142 are illustrated in order to elucidate the principle.

Figure 63:
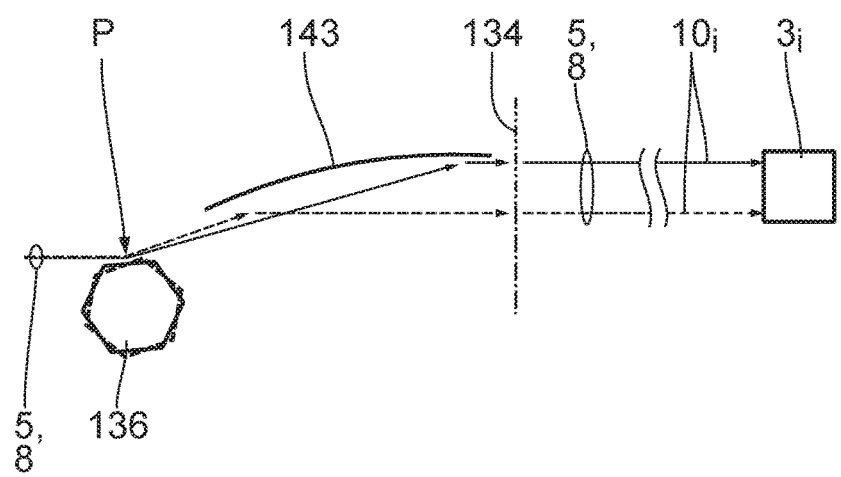

An alternative thereto is illustrated in FIG. 63. In accordance with this alternative, an optical component having refractive power, in particular in the form of a mirror 143, is provided instead of the actuatable plane mirror 142. The mirror 143 has a radiation-reflecting surface, the shape of which can be described by a parabola in the plane of the drawing in FIG. 63. In the direction perpendicular to the plane of the drawing in FIG. 63, the mirror 143 can be embodied in a manner free of curvature. The radiation-reflecting surface of the mirror 143 can have, in particular, the shape of a general cylinder lateral surface section. In this case, the term general cylinder denotes a body bounded by two parallel, planar, congruent surfaces, namely a base surface and a top surface, and a lateral surface. The lateral surface is formed in particular by parallel straight lines. The lateral surface can be generated in particular by a plane curve being shifted along a straight line that does not lie in the plane of the curve. The individual output beams $10_i$ reflected at the mirror 143 run in particular parallel or at least substantially parallel to a predefined direction. The mirror 143 is arranged in a stationary fashion on the beam path of the illumination radiation 5.

The mirror 143 is arranged relative to the polygon mirror 136 preferably in such a way that the impingement point P of the illumination radiation 5 on the polygon mirror 136 lies precisely at the focus of the parabola. The focal length f of the parabola then results from the desired parallel offset amplitude divided by the deflection angle interval of the polygon mirror 136.

Since the collective output beam 8 has a finite extent in the direction perpendicular to the propagation direction but in the plane of the drawing in FIG. 63, not all of the rays reflected by the mirror 143 will leave the parabola in an axially parallel manner. It is therefore advantageous to shape the collective output beam 8 in such a way that it has the smallest possible extent in this direction. It can have a large extent in the direction perpendicular to the plane of the drawing in FIG. 63. Such shaping of the collective output beam 8 can be achieved in particular via the beam shaping optical unit 7. The extent of the collective output beam 8 in the plane of the drawing in FIG. 63 is advantageously less than ⅕ of the focal length of the parabola of the mirror 143, in particular less than ⅒, in particular less than ¹/₂₅, of the focal length. The extent of the collective output beam 8 perpendicular to the plane of the drawing in FIG. 63 is advantageously at least 5 times the magnitude of the extent in the plane of the drawing, in particular at least 10 times the magnitude thereof, in particular at least 20 times the magnitude thereof.

The collective output beam 8 is shaped by the beam shaping optical unit 7, that is to say in particular before impinging on the output coupling optical unit 9, in such a way that it has an elongate cross section. The cross section of the collective output beam 8 upon impinging on the output coupling optical unit 9 has in particular an aspect ratio, defined by the ratio of the lengths of a long axis and a short axis of the cross section of the collective output beam 8, of at least 2:1, in particular at least 3:1, in particular at least 5:1, in particular at least 10:1.

The displacement direction 139 and the alignment of the long axis of the cross section of the collective output beam 8 are oriented perpendicularly to one another, in particular.

It is assumed hereinafter that the intensity of the illumination radiation 5 in the illumination region 137 is not dependent on the position in a direction perpendicular to the displacement direction 139. This can be achieved, for example, by virtue of the fact that the collective output beam 8 was homogenized in this direction, that is to say in the y-direction. This can be achieved via the beam shaping optical unit 7, for example.

The assumption that the collective output beam 8 is homogenized in the vertical direction, that is to say in the direction perpendicular to the displacement direction 139, is not necessary for the implementation of the general concept. A vertical edge decrease in the intensity of the collective output beam 8 can be compensated for, for example, by the regions 135$_i$ at the upper and lower edges of the separating plate 134, that is to say perpendicular to the displacement direction 139, being made wider in order to collect or to reflect the same amount of radiation energy.

With reference to FIGS. 53, 54, 54A and 54B, a description is given below by way of example as to how the intensity of the radiation source 4 can be altered depending on the desired doses and on the temporal profile of the division ratio.

For the sake of simplicity, the figures only illustrate the case of a division of an incident beam into two individual output beams 10$_i$, 10$_{i+1}$. This can be understood as an excerpt from a division of the collective output beam 8 into a larger number of individual output beams 10$_i$.

Figure 53:
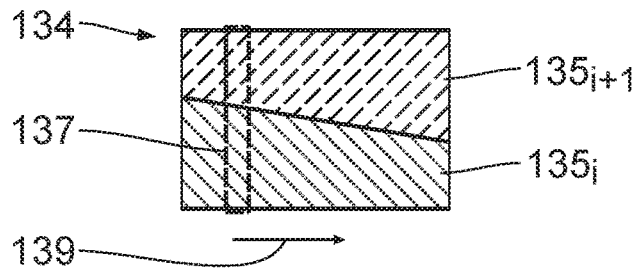
Figure 54:
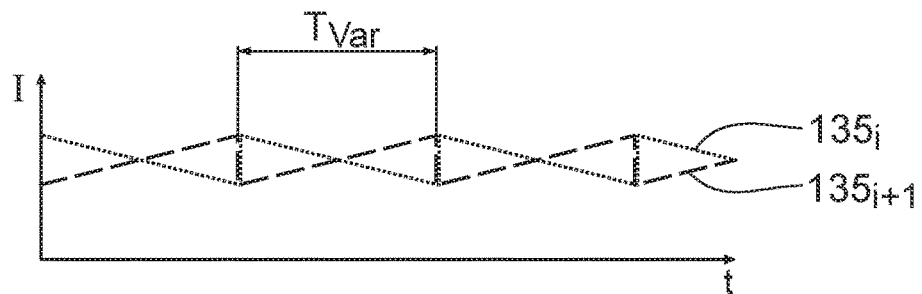

FIG. 53 illustrates by way of example an excerpt from the separating plate 134 having two regions 135$_i$, 135$_{i+1}$ and an illumination region 137, which is shifted in the displacement direction 139 relative to the separating plate 134. In order to elucidate the concept, the different regions 135$_i$, 135$_{i+1}$ are hatched using different dashed lines. The dashed lines are adopted again in FIG. 54. This figure illustrates how the division ratio of the intensity of the incident beam to the two individual output beams 10$_i$, 10$_{i+1}$ varies if the illumination region 137 is displaced periodically along the displacement direction 139 relative to the separating plate 134. FIG. 54 also depicts by way of example the duration of a period $T_{Var}$ of the variation of the division ratio.

Figure 55A:
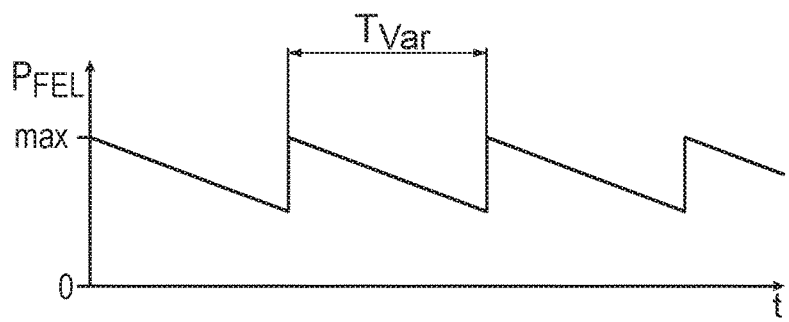

If the setpoint dose for the scanner 3$_i$ is greater than the setpoint dose for the scanner 3$_{i+1}$, then the power of the radiation source 4 is controlled for example as illustrated by way of example in FIG. 55A. It assumes a maximum in particular at the points in time when the ratio of the individual intensity of the individual output beam 10$_i$ to the individual intensity of the individual output beam 10$_{i+1}$ is a maximum. Conversely, it assumes a minimum in each case at the points in time when the ratio is a minimum.

Figure 55B:
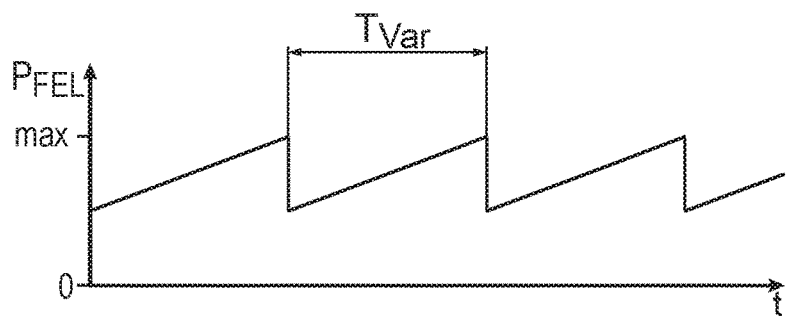

Conversely, if the setpoint dose for the scanner 3$_i$ is less than the setpoint dose for the scanner 3$_{i+1}$, then the power of the radiation source 4 is controlled for example as illustrated by way of example in FIG. 55B. In this case, the power assumes a minimum in particular at the points in time when the ratio of the individual intensity of the individual output beam 10$_i$ to the individual intensity of the individual output beam 10$_{i+1}$ is a maximum. Conversely, the power of the radiation source 4 assumes a maximum when the ratio has a minimum.

The profiles of the power of the radiation source 4 as illustrated by way of example in FIGS. 55A and 55B should be understood to be purely by way of example. Via a suitable control of the power of the radiation source 4 depending on the division ratio of the collective output beam 8 to the individual output beams 10$_i$, it is possible, as has been shown, to set fundamentally arbitrary setpoint doses for all of the scanners 3$_i$. This is possible, in particular, if the number k of partial intervals into which the period $T_{Var}$ is subdivided is sufficiently large. This is possible, in particular, if the number k of partial intervals is at least equal to the number M of scanners 3$_i$.

Different variants of the separating plate 134 are described below with reference to exemplary FIGS. 27 to 37.

Figure 27:
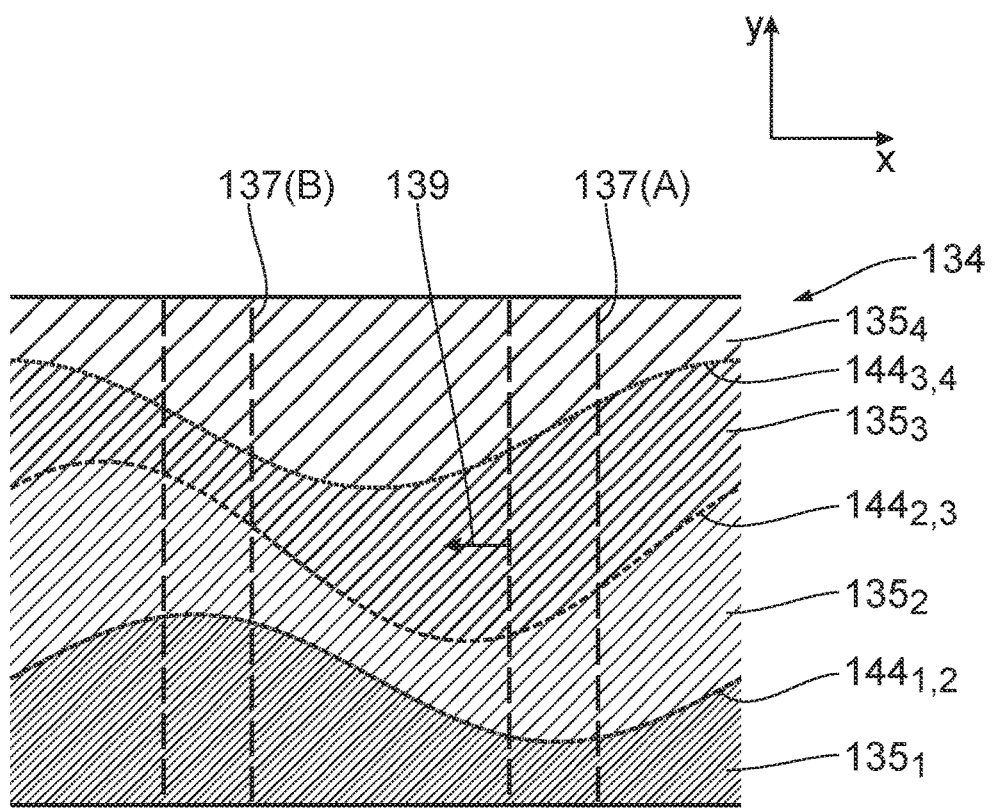
FIG. 27 shows the separating plate of the radiation source module in accordance with FIG. 5 as an enlarged excerpt.

FIG. 27 schematically illustrates a separating plate 134 having four regions 135$_1$ to 135$_4$. The different regions 135$_1$ to 135$_4$ serve, as described above, for transferring separate individual output beams 10$_1$ to 10$_4$, to four different scanners 3$_1$ to 3$_4$.

The regions 135$_i$ in each case have an extent in the y-direction which is dependent on their position in the x-direction. In this case, the x-direction is opposite to the displacement direction 139. The y-direction is perpendicular to the displacement direction 139.

If the separating plate 134 has a constant reflectivity over its entire extent, the individual intensity of the individual output beams 10$_i$ reflected from the different regions 135$_i$ to the different scanners 3$_i$ is directly dependent, in particular directly proportional in regard to the partial area of the region 135$_i$ which is illuminated by the collective output beam 8. The partial area is given precisely by the intersection, that is to say by the region of overlap, of the illumination region 137 and the respective region 135$_i$. The area and thus the individual intensity of the individual output beams 10$_i$ can be varied by a displacement of the illumination region 137 in the displacement direction 139. It is possible, in particular, to vary the division of the total intensity of the collective output beam 8 into the individual intensities of the individual output beams 10$_i$, that is to say the division ratio of the total intensity into the individual intensities, by the displacement of the illumination region 137 relative to the separating plate 134.

Two different arrangements (A, B) of the illumination region 137 on the separating plate 134 are illustrated by way of example in FIG. 27. The arrangement A corresponds precisely to a minimum of the individual intensity of the individual output beam 10$_1$. The individual output beam 10$_3$ has approximately a maximum in the position A of the illumination region 137. The situation is precisely the other way round in the position B. The individual output beam 10$_1$ has a maximum in this position, while the individual output beam 10$_3$ has a minimum in the position B. The individual output beams 10$_2$ and 10$_4$ in each case have an intermediate value in the two positions A, B.

In the case of this alternative of the separating plate 134, the regions 135$_i$, apart from the rectilinear edges of the separating plate 134, in each case have boundaries 144$_{ij}$ which can be described by trigometrical functions, in particular by sine functions. Here the indices i, j respectively indicate the indices of the adjacent regions 135$_i$, 135$_j$.

The boundaries 144$_{ij}$ can be described by continuous functions, in particular, in this alternative. In this alternative, the extent of the regions 135$_i$ in the y-direction is greater than a minimum value at every point in the x-direction. The minimum value is approximately 12% of the total extent of the separating plate 134 in the y-direction. Alternative minimum values are likewise possible. In the case of such an embodiment of the separating plate 134, in particular the division thereof into the different regions 135$_i$, it is ensured that for every arrangement of the illumination region 137 relative to the separating plate 134 a minimum proportion of 12% of the total intensity of the collective output beam 8 is guided to each of the individual scanners 3$_i$. It is ensured, in particular, that for every displacement position of the polygon mirror 136, that is to say at every point in time of the displacement thereof, each of the individual output beams 10$_i$ has an individual intensity which has at least 12% of the total intensity of the collective output beam 8 or at least 48% of the average individual intensity of all the individual output beams 10$_i$.

Generally, the separating plate 134 is preferably embodied in such a way that a proportion of at least 50%, in particular at least 70%, in particular at least 90%, in particular 100%, of the individual output beams 10$_i$ have, during at least 50% of the duration of the period $T_{Var}$ of the displacement of the polygon mirror 136, individual intensities which are at least 10% of the average individual intensity of all the individual output beams $10_i$.

An alternative feature of one preferred configuration of the separating plate 134 is described below: For each of the individual output beams $10_i$, the temporal profile of the division proportion, that is to say what proportion of the intensity of the collective output beam 8 is transferred into the relevant individual output beam $10_i$ can be determined over the duration of the period $T_{Var}$. The mean value, the variance and the standard deviation of the division proportion can be determined therefrom for each of the individual output beams $10_i$. The variance is equal to the square of the standard deviation. Preferably, a proportion of at least 50%, in particular at least 70%, in particular at least 90%, in particular 100%, of the individual output beams $10_i$ then have a standard deviation that is less than half the mean value of the corresponding division proportion.

Generally, one advantageous configuration of the separating plate 134, in particular the division thereof into the regions $135_i$, can be characterized as follows:

Let M be the number of scanners $3_i$. Let the x-coordinate, as above, be parallel to the displacement direction 139 along which the illumination region 137 is displaced relative to the separating plate 134, and let the y-coordinate be perpendicular thereto, in particular the coordinate along which the illumination region 137 illuminated by the collective output beam 8 is spanned. For the following consideration, the dimensions of the separating plate 134 in the x- and y-directions shall be normalized to 1. This can be achieved via a simple scaling.

With these assumptions, the average y-extent, that is to say y-extent averaged in the x-direction, of the individual regions $135_i$ results as 1/M.

Furthermore, let a be the maximum y-extent and b the minimum y-extent of a specific region $135_i$, and it thus follows that:

a≥1/M≥b.

Finally, let A be the proportion of the x-coordinates for which the y-extent of a specific region $135_i$ is greater than a/2+1/(2M), and let B be the proportion of the x-coordinates of the region $135_i$ for which the y-extent is less than a/2+1/(2M). Advantageous divisions of the separating plate can then be characterized by the following properties:

A+B<½ for M≤8 and
A+B<4/M for M≥8.

To put it illustratively, the y-extent of the regions $135_i$ over the extension in the x-direction has as far as possible in each case a value which varies only little, in particular a value which is substantially constant, and has outliers upwards or downwards only at a few points.

Figure 28A:
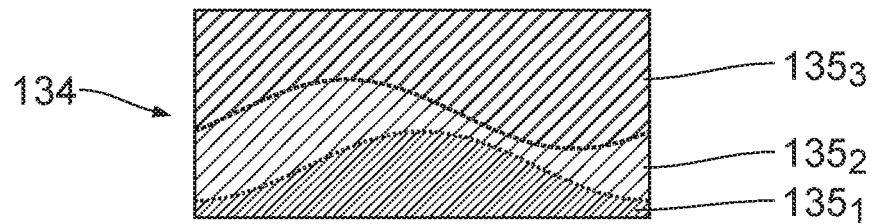
FIGS. 28A to 28D show exemplary illustrations of alternative variants of the separating plate.
Figure 28B:
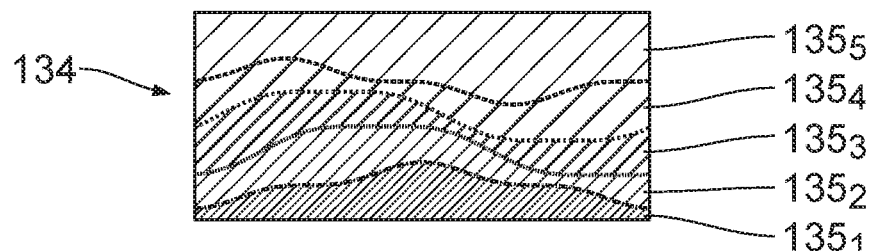
Figure 28C:
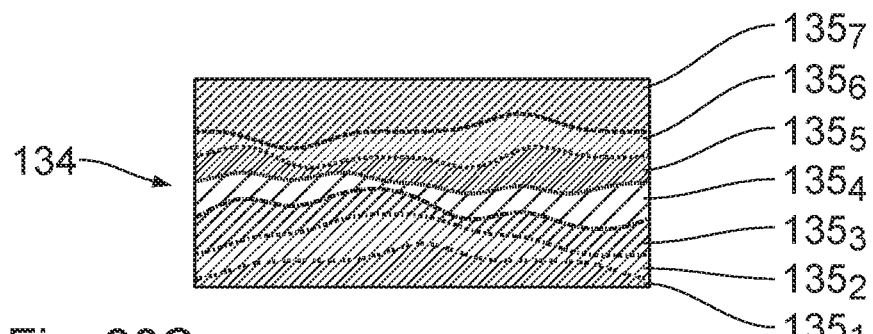
Figure 28D:
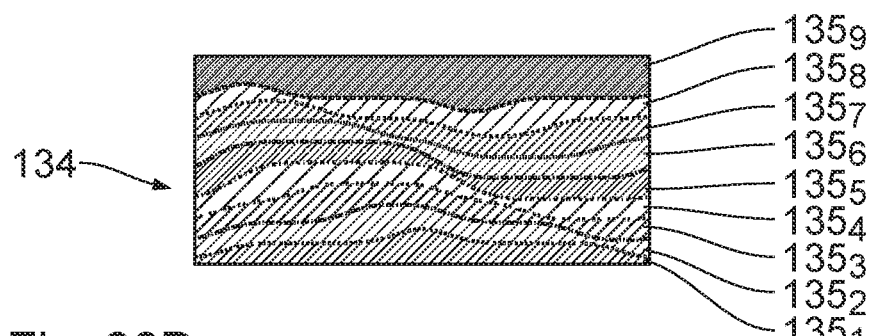

FIG. 28A schematically illustrates an alternative embodiment of the separating plate 134. The embodiment of the separating plate 134 as illustrated in FIG. 28A serves for dividing the collective output beam 8 into three individual output beams $10_1$, $10_2$ and $10_3$. In this case, the separating plate 134 has three regions $135_1$, $135_2$ and $135_3$. In this embodiment, the deviation of the partial area of that partial region of the individual regions $135_i$ which is covered by the illumination region 137 from a predefined nominal value depending on the position of the illumination region 137 in the displacement direction 139 can be described in each case by a sum of trigonometrical functions. The nominal value can be in particular a mean value which corresponds to a uniform division of the collective output beam 8 into individual output beams $10_i$.

Further aspects of the output coupling optical unit 9 and of the methods for controlling the division of the illumination radiation 5 among the scanners $3_i$ are described below.

Generally, the output coupling optical unit 9 serves to divide the illumination radiation 5 from the radiation source 4, in particular the collective output beam 8 which can be shaped from the raw beam 6 in particular by the beam shaping optical unit 7, among the individual output beams $10_i$, which are guided to the individual scanners $3_i$. In particular the division ratio of the total intensity of the collective output beam 8 into the individual intensities of the individual output beams $10_i$ can be varied, in particular controlled, in particular controlled by closed-loop control, with the aid of the output coupling optical unit 9. The distribution of the total energy of the illumination radiation 5 among the individual scanners $3_i$ can thereby be varied, in particular controlled, in particular controlled by closed-loop control.

The division of the total energy of the illumination radiation 5 among the individual scanners $3_i$ can be described by a function $f_i(p)$, which indicates depending on a parameter p the proportion of the total energy which is guided to the i-th scanner $3_i$. The parameter p denotes in a generalized form the setting of the output coupling optical unit 9 in particular the relative arrangement of the illumination region 137 on the separating plate 134 or the transmittance thereof for the different individual output beams $10_i$, the transmittance being dependent on the setting of the elements of the output coupling optical unit 9. The variation of the division ratio of the total intensity to the individual intensity can thus be described by a variation of the parameter p and associated changes in the functions $f_i(p)$.

A temporal profile p(t) is set for the parameter p. Since a variation of p is often associated with a mechanical displacement, it is often advantageous and/or even necessary for p(t) to be a continuous function. For the inventive insight, however, it suffices if the parameter p is set to a specific value for a certain period of time and is then varied instantaneously to a different value. Since the latter approach for the temporal variation of p facilitates the description, it is used below.

The parameter p is set in each case for a certain period of time. The averaging over the different periods of time then arises in the scan integral. It has been possible to show that the possibility of the temporal variation of the parameter p, in particular the possibility of choosing the parameter p differently in different periods of time, can make the number of degrees of freedom large enough to be able to choose substantially freely the distribution of the total energy of all the scanners $3_i$ averaged over a period. In practice, this can take place by the illumination region 137 being displaced relative to the separating plate 134, in particular by a sequence of different illumination regions 137 being successively illuminated on the separating plate 134. By varying the relative position of the illumination region 137 on the separating plate 134, it is possible to vary the division ratio of the total intensity of the collective output beam 8 to the individual intensities of the individual output beams $10_i$.

Different solutions differ for example in whether the individual intensities of the individual output beams $10_i$ can only be attenuated proceeding from an average standard intensity thereof, or whether a redistribution of the energy between different scanners $3_i$ is possible. This can generally be described by a so-called lever of the output coupling optical unit 9. The lever is designated hereinafter by the letter m.

Without actuation of the output coupling optical unit 9, in each case a fixed reference proportion of the power of the collective output beam 8 is directed onto a specific one of the individual output beams $10_i$ by the output coupling optical unit 9. Given M individual output beams $10_i$, the proportion can be 1/M, particularly if the scanners $3_i$ are identical and identical processes for the exposure of a wafer $25_i$ are carried out on them. The reference proportion can also not be equal to 1/M, particularly if the set of scanners $3_i$ consists of different types. Lever m denotes the maximum relative deviation of the adjustable proportion of an individual output beam $10_i$ from the reference proportion of the individual output beam $10_i$. Hereinafter, lever m denotes the absolute value of the maximum relative deviation, that is to say that the indication of a certain value of m does not necessarily include the information that it is possible both to increase the proportion by m and to decrease the proportion by m.

It has furthermore been recognized that, in the case of a redistribution of the illumination radiation 5 guided to the individual scanners $3_i$, an increase in the quantity of energy guided to a specific one of the scanners $3_i$ results in a decrease in the quantity of energy guided overall to the other scanners $3_j$, j≠i, if the total intensity of the collective output beam 8 is constant.

The task of supplying a predefined number M of scanners $3_i$ with a predefined, scan-integrated dose y of illumination radiation 5 can be mathematically described and solved with the aid of the functions $f_i(p)$. If the scan period, that is to say the time by a point on the wafer $25_i$ to pass through the scan slot, is divided into k intervals, and if the total intensity of the collective output beam 8 in the k-th interval is designated by $z_k$, then the radiation doses $y_i$ which are guided to the i-th scanner $3_i$ can be expressed as follows:

$$y_i = \sum_{k=1}^{N} f_i(p_k) z_k,$$
$$i = 1, \ldots, M$$

wherein M indicates the total number of scanners $3_i$.

If the redistribution of the energy between the individual scanners $3_i$ leaves constant the total absolute value of the energy of the illumination radiation 5 that is guided to the scanners $3_i$, the following holds true independently of the division of the collective output beam 8 into the individual output beams $10_i$, that is to say independently of the setting of the output coupling optical unit 9 which is described by the parameter p:

$$\sum_{i=1}^{M} f_i(p) = 1$$

According to the disclosure, it has been possible to show how the output coupling optical unit 9 is designed in order that for a substantially arbitrarily predefined set of desired doses $\{y_i\}$ there is a solution $\{p_k\}$, that is to say a sequence of the parameter values p in the k intervals, in order to be able to set the desired doses. This is expressed mathematically by the functions $\{f_i\}$.

Moreover, it has been possible to show how the output coupling optical unit 9 can be controlled in order to calculate a solution $\{p_k\}$ for given functions $\{f_i\}$ from the desired doses $\{y_i\}$.

It has been possible to show that for setting M predefined desired doses, that is to say for setting predefined, scanner-specific desired doses in a projection exposure system 1 including M scanners $3_i$, it suffices to subdivide the scan period into M intervals k.

A simple variant as to how the division of the collective output beam 8 can be manifested in order to set arbitrary desired doses for M scanners $3_i$ consists in splitting the scan interval into M disjoint intervals and choosing the functions $f_i(p_k)$ in such a way that the functions $f_i(p_k)$ are chosen suitably in each case in exactly one interval $p_i$, while they are constant in the remaining intervals $p_j$, j≠i.

Advantageously, the functions $f_i(p)$ are continuous, at least for the actually used values of p, since what can thus advantageously be achieved is that in the actual setting of the parameter p, that is to say a displacement of the illumination region 137 relative to the separating plate 134, via an actuator, small deviations from a setpoint value do not lead to large deviations of the actual division ratios of the collective output beam 8 to individual output beams $10_i$ from the setpoint division ratio. The sum of all the functions $f_i(p)$ is advantageously equal to 1 for every value of p less than or equal to 1. A corresponding division of the total intensity of the collective output beam 8 to the individual intensities of the individual output beams $10_i$, that is to say a corresponding profile of the functions $f_i(p)$, is illustrated by way of example in FIG. 60.

Figure 60:
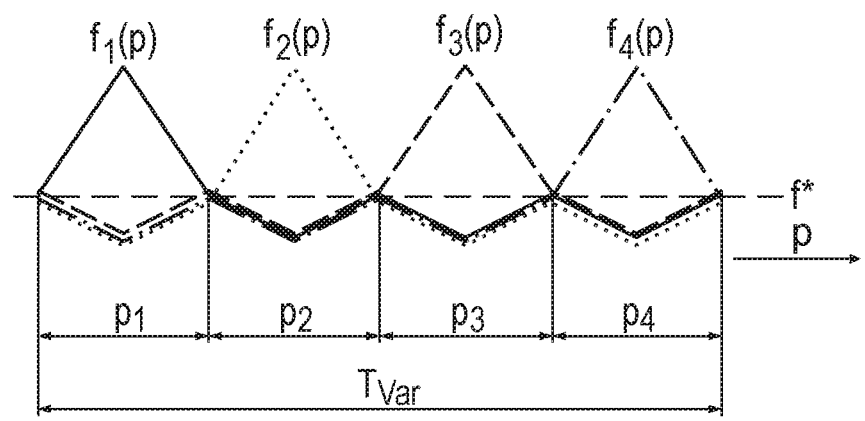
FIGS. 60 and 61 show schematic illustrations of different variants of the functions which describe the division ratio of the collective output beam into individual output beams over the period $T_{Var}$.
Figure 61:
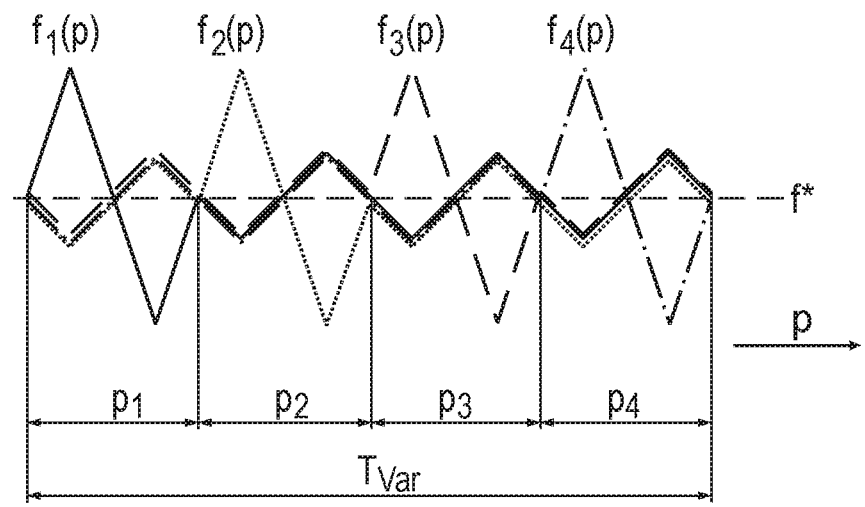

While it is possible to set intensity increases relative to an average nominal value f of the individual intensity of the individual output beams $10_i$ in a particularly simple manner with the profile of the functions $f_i(p)$ in accordance with FIG. 60, it may also be advantageous to form the functions $f_{i(p)}$ in the intervals $p_k$ preceding from a nominal value $f^*$ with excursions in both directions. This is illustrated by way of example in FIG. 61.

If the value of p is designated during the i-th interval minus a mean value where $x_i$, such that $x_i$ directly indicates how the individual intensity of the individual output beam $10_i$ which is guided to the i-th scanner $3_i$ during this interval is changed relative to the mean value $x_i$, then the functions $f_i$ assume the following simple form:

$$f_i(x_k) = \frac{M}{M-1} x_k \delta_k - \frac{M}{M-1} x_k$$

wherein $\delta_{ik}=1$ for i=k and $\delta_{ik}=0$ for i≠k.

One important question is what value the variables $x_i$ is able maximally to assume in order to be able to set a specific range of target values $y_i$. For the practical implementation this corresponds to the question of how large the setting range of the output coupling optical unit 9 is in order to be able to set a predefined range of desired doses of the illumination radiation for the different scanners $3_i$. This is described by the variable of the lever m introduced above.

If it is assumed, without restricting the generality, that arbitrary $y_i$ where $-1<y_i<1$ are intended to be settable, then the setting range m of the manipulators is given by the following formula:

$$\max_{\substack{-1 \leq y_i \leq 1 \\ \sum y_i = 0 \\ i=1,\ldots,M}} \min_{\substack{x_k \\ k=1,\ldots N}} m: \sum_{k=1}^{N} f_i(x_k) = y_i \wedge -m \leq x_k \leq m$$

As already described above, the lever m indicates the absolute value of the maximum relative deviation of the actual division ratio from a reference division ratio. If the relative deviation can be attained both upwards and downwards, then this is referred to as symmetrical. The above formula describes the symmetrical case. As another extreme, the relative deviation m can be attained only either upwards or downwards. The setting range M of the manipulators is summarized in the following table:

TABLE

Setting ranges m of the manipulators for a projection exposure system including M scanners

| Number N of disjoint intervals into which the scan period is divided | Asymmetrical form of the functions $f_i(p)$ | Symmetrical form of the functions $f_i(p)$ |
|---|---|---|
| N = M − 1 | No solution | m = 2(M − 1)$^2$:M |
| N = M | m = 2(M − 1) | m = M − 1 |

As described, the normalization of the above equation is such that the maximum possible independent variation of the proportion of each of the individual output beams $10i$, integrated over the scan period, is set to be equal to 1. The lever m is greater than 1 and accordingly indicates the extent to which the instantaneous division ratio is able to be changed more greatly than the predefined values of the division ratios integrated over the scanned period are permitted to deviate from a reference value. A minimum value of m is therefore uniquely predefined by the objective.

It has been recognized that even if M−1 intervals may be sufficient, it is usually better to divide the scan period into M intervals. This has the advantage, in particular, that the setting range then becomes significantly smaller. Moreover, a solution then always exists.

The scan period can also be divided into more than M intervals. It can be divided in particular into an integer multiple of M intervals. A lower limit for the minimum duration of the individual intervals results from the speed with which the division of the collective output beam 8 into the individual output beams $10_i$ can be varied.

If the number of disjoint intervals into which the period $T_{Var}$ of the variation of the division ratio of the collective output beam 8 into the individual output beams $10_i$ is divided corresponds precisely to the number M of different scanners $3_i$ of the projection exposure system 1, there is ultimately no essential difference between the symmetrical embodiment and the asymmetrical embodiment. Although the setting range m is twice as large in the case of the asymmetrical embodiment, in return only values of 0 to m are desired. In the case of the symmetrical embodiment, although m is half as large, in return values of −m to +m are desired. The equation indicated above for the setting range m of the manipulators guarantees that a solution exists for $y_i$ in a specific range. This solution is even explicitly constructed during the optimization. It is therefore always possible also to use this solution if a certain intensity distribution is intended to be set at a later point in time.

While at the edges of the permitted diversity $\{y_i\}$ there is usually only a single solution $\{y_k\}$, an infinite set of conceivable solutions usually exists in the case of a division of the period $T_{Var}$ into at least M disjoint intervals for $y_i$ within the permitted range. Mechanical boundary conditions can be taken into account when selecting the best solution/solutions.

By way of example, the desire to have to move the manipulators as little as possible can be taken into account.

Figure 29:
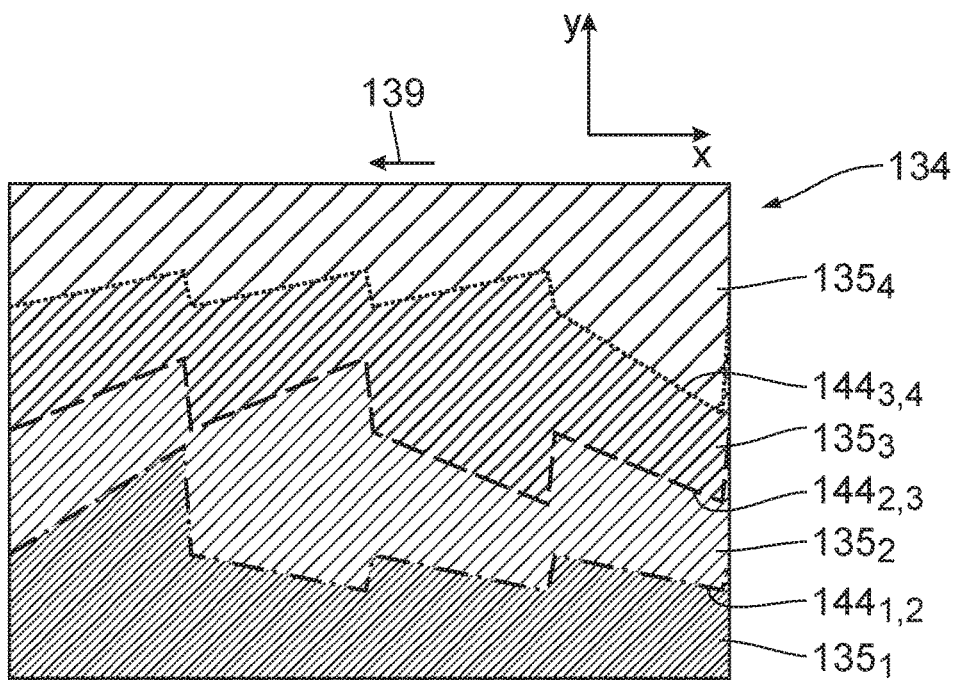
FIGS. 29 to 31 show further alternatives of the separating plate.
Figure 30:
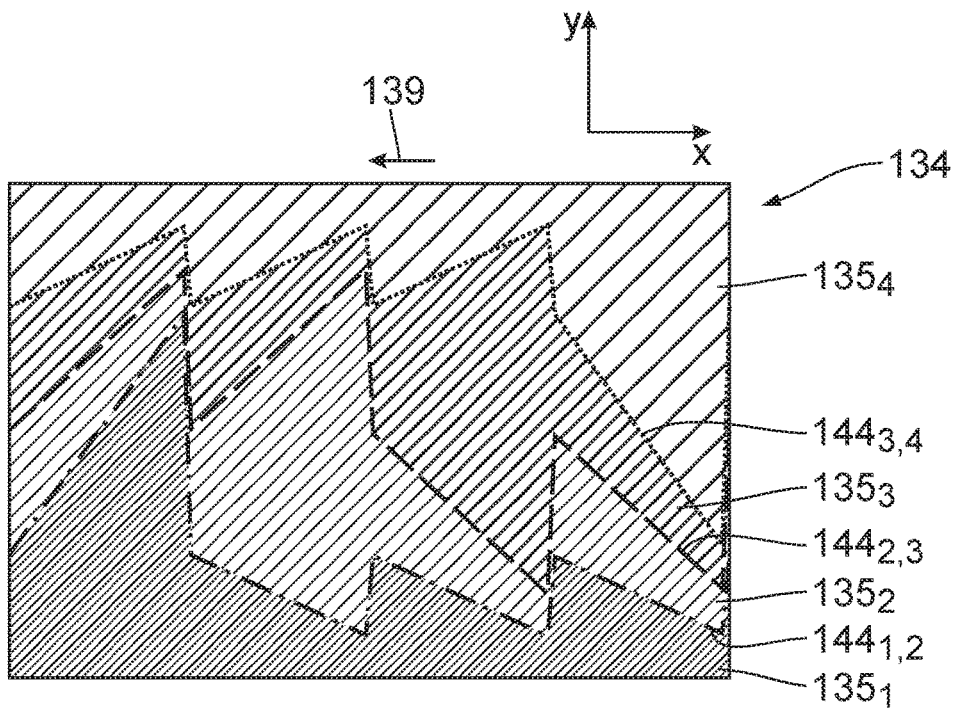

Specific embodiments of the correspondingly designed separating plate 134 are illustrated by way of example in FIGS. 29 and 30, to the description of which reference is hereby made. The variant of the separating plate 134 in accordance with FIG. 29 has a setting range m=0.9. The variant illustrated in FIG. 9 has a setting range m=2.

In accordance with alternative variants, the functions $f_i(p)$ have a non-linear profile. For M=3, for example, the following functions can be chosen as functions $f_i(p)$:

$f_1(p)=\cos p$, $f_2(p)=\sin p$ and $f_3(p)=-\cos p - \sin p$.

An alternative possibility is as follows:

$f_1(p)=\cos p$, $f_2(p)=\cos (p+2\pi:3)$ and $f_3(p)=\cos (p+4\pi:3)$.

The following holds true in both alternatives:

$$\sum_i f_i(p) = 0$$

In both alternatives, with a division of the period $T_{Var}$ into two disjoint intervals, it is possible to set a desired energy distribution $y_1$ and $y_2$ where $y_3=-y_1-y_2$. Apart from a possible interchange of $p_1$ and $p_2$, a unique solution results for the first example $$p_1 = 2\tan^{-1} \frac{2y_2 + \sqrt{(4 - y_1^2 + y_2^2)(y_1^2 + y_2^2)}}{y_1(2 + y_1) + y_2^2}$$

$$p_2 = 2\tan^{-1} \frac{2y_2 - \sqrt{(4 - y_1^2 + y_2^2)(y_1^2 + y_2^2)}}{y_1(2 + y_1) + y_2^2}$$

and for the second example, respectively $$p_1 = -2\tan^{-1} \frac{-2\sqrt{(3 - y_1^2 - y_1 y_2 - y_2^2)(y_1^2 + y_1 y_2 + y_2^2)} + \sqrt{3} y_1 + 2\sqrt{3} y_2}{2y_1 y_2 + y_1(2y_1 + 3) + 2y_2^2}$$

$$p_2 = -2\tan^{-1} \frac{2\sqrt{(3 - y_1^2 - y_1 y_2 - y_2^2)(y_1^2 + y_1 y_2 + y_2^2)} + \sqrt{3} y_2 + 2\sqrt{3} y_1}{2y_1 y_2 + y_1(2y_1 + 3) + 2y_2^2}$$

However, there is a solution only if $y_1$, $y_2$ and $y_3=-y_1-y_2$ lie within certain limits.

It has been possible to show that arbitrary $y_1$ where $-1<y_i<1$ can be set if the manipulator has a lever m which serves as a prefactor preceding the functions $f_i(p)$. The lever m is summarized for the different cases in the table below:

| Number N of disjoint intervals into which the scan period is divided | Asymmetrical form of the functions $f_i(p)$ | Symmetrical form of the functions $f_i(p)$ |
|---|---|---|
| N = M − 1 | $M = \frac{\sqrt{2}}{2}$ | $m = \frac{1}{\sqrt{3}}$ |
| N = M | $m = \frac{\sqrt{2}}{3}$ | $m = \frac{2}{3\sqrt{3}}$ |

It has furthermore been possible to show that the functions $f_i(x)=\cos^q(x+c_i)$ with $c_i=2\pi i/(q+2)$, $i=1 \ldots M$ and $q$ odd for $M=q+2$ scanners $3_i$ always represent a solution. In other words, this family of functions $\{f_i\}$ indicates a possibility for the division of the separating plate 134 for a projection exposure system 1 including $M=q+2$ scanners $3_i$. The form of the functions $f_i(p)=\cos^q(p+c_i)$ is illustrated by way of example for $q=1, 3, 5$ and 7 in FIGS. 65A to 65D. Corresponding deviations of the separating plate 134 into separate regions $135_i$ are illustrated in FIGS. 28A to 28D.

Illustratively, it becomes clear that the larger the exponent $q$, the more the functions $f_i(p)$ are localized. In practice this means that the individual scanners $3_i$ can be driven independently of one another all the better, the more localized the functions $f_i(p)$ are.

Further alternatives of the separating plate 134 are illustrated in FIGS. 29 and 30. In these alternatives, the boundaries $144_{ij}$ are in each case embodied linearly in sections. The separating plate 134, in the displacement direction 139, substantially has in each case four regions in which the relative proportions of the regions $135_i$ vary continuously. Between the regions adjoining one another in the displacement directions 139 there occurs an abrupt change in the extent of the regions $135_i$ in a direction perpendicular to the displacement direction 139.

The alternatives in accordance with FIG. 29 and in accordance with FIG. 30 differ in the value of the setting range or lever m. The setting range m thus forms a measure of how much the different divisions of the total intensity of the collective output beam 8 into individual intensities of the individual output beams $10_i$ can maximally deviate from a uniform division. It results directly from the embodiment of the output coupling optical unit 9, in particular from the embodiment of the separating plate 134, in particular the division thereof into the different regions $135_i$. Since the output coupling optical unit 9, in particular the interaction of its components that are displaceable relative to one another, serves for varying or generally for manipulating the division ratio of the total intensity of the collective output beam 8 into the individual intensities of the individual output beams $10_i$, the setting range m is also referred to as the setting range m of the output coupling optical unit 9 or as the setting range m of the manipulators. In the case of the alternative illustrated in FIG. 29, the setting range m=0.9. In the case of the alternative illustrated in FIG. 30, m=2.

Figure 31:
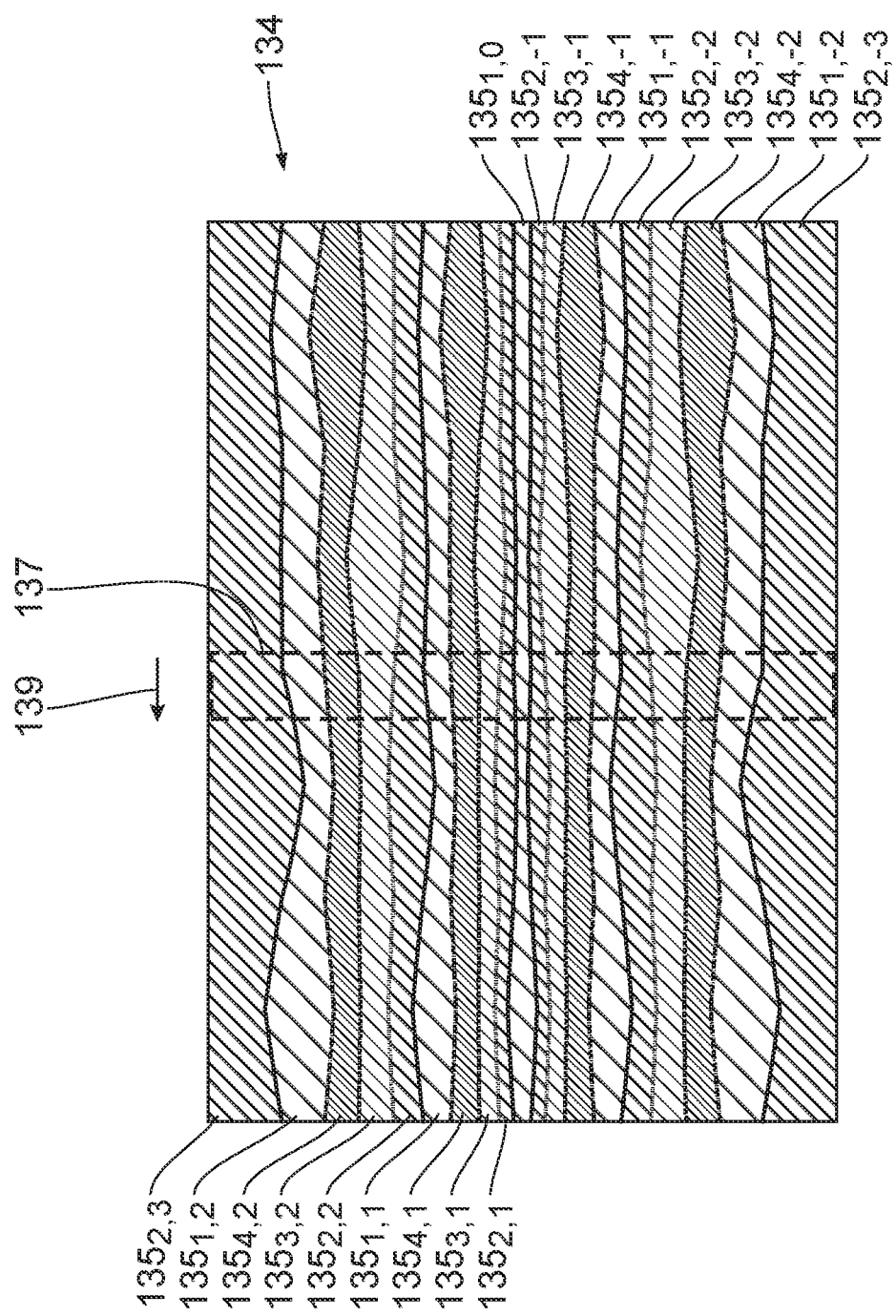

In one particularly advantageous embodiment, illustrated schematically in FIG. 31, the individual regions $135_i$ are divided into a plurality of partial regions $135_{ij}$ in a direction perpendicular to the displacement direction 139. The division corresponds, in particular, to the above-described division of the separating plane 39 into the regions $43_i$, to which reference is hereby made. The division of the regions $135_i$ into partial regions $135_{ij}$ corresponds, in particular at predefined positions with respect to the displacement direction, in particular at every position with regard to the displacement direction, to the above-described division of the separating plane 39 into the regions $43_i$ (see FIG. 3, for example).

The division of the regions $135_i$ into the partial regions $135_{ij}$ is in particular such that the illumination region 137 at predefined positions in the displacement direction 139, in particular at all positions in the displacement direction 139, covers a segment from the separating plate 134 whose division into the partial regions $135_{ij}$ corresponds precisely to the above-described division of the separating plane 39 into the regions $43_{ij}$.

In this embodiment, therefore temporal and spatial aspects are combined with one another. In this embodiment, in particular, the advantages of the division of the separating plane 39 for the compensation of fluctuations up to a predefined order L are combined with the advantages which result from a temporally variable, in particular controllable, in particular closed-loop controllable, division of the collective output beam 8 into individual output beams $10_i$.

In this embodiment, the separating plate 134 corresponds in terms of its embodiment and function to the optical component 42, to the description of which reference is hereby made.

A corresponding division of the regions $135_i$ into partial regions $135_{ij}$ is also possible in the other embodiments of the separating plate 134 and of the separating plate 145, respectively.

FIGS. 32 to 37 schematically illustrate by way of example three-dimensional grid drawings of different alternatives of the separating plate 134.

Figure 32:
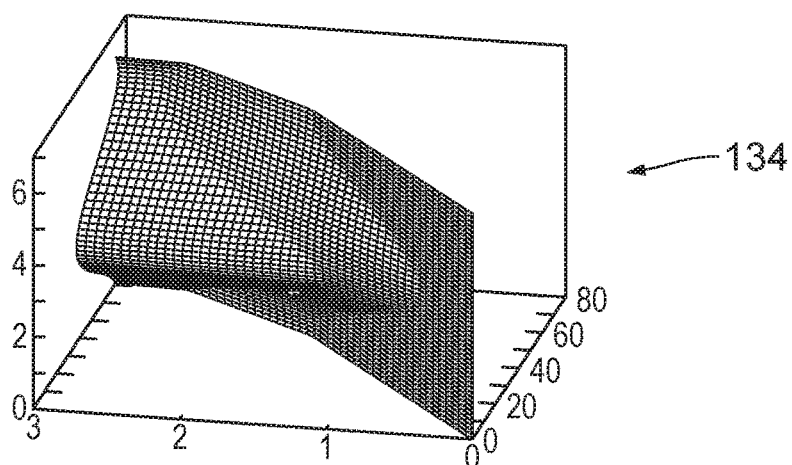
FIGS. 32 to 37 show further alternatives of the separating plate as grid representations.
Figure 33:
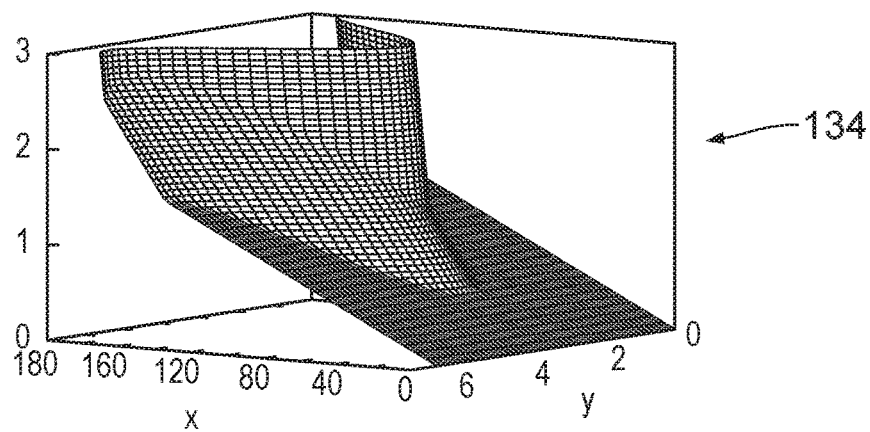

In the case of the alternatives illustrated in FIGS. 32 and 33, the separating plate 134 has bends, but no jump discontinuities.

In the case of the alternatives illustrated in FIGS. 34 to 37, the separating plates 134 have jump discontinuities.

Figure 34:
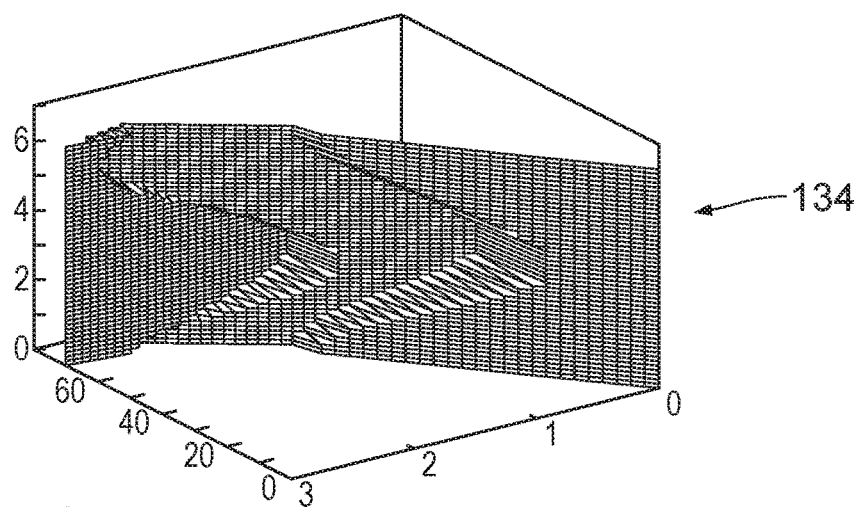
Figure 35:
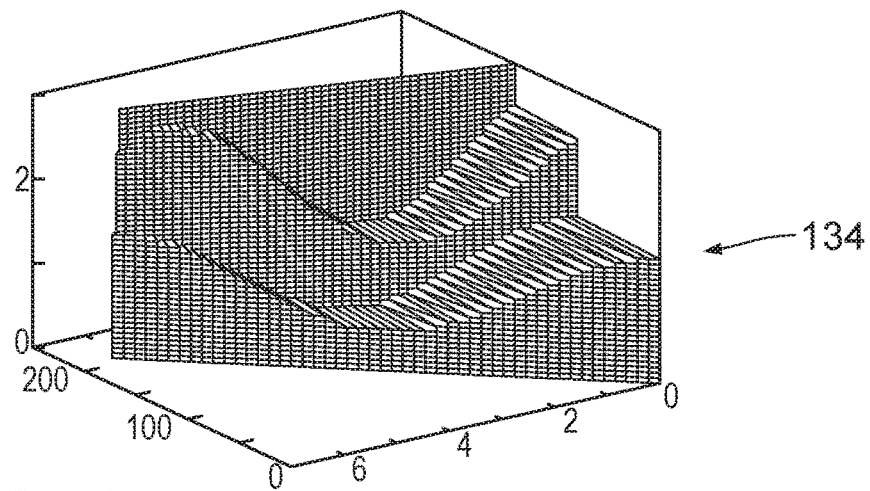
Figure 36:
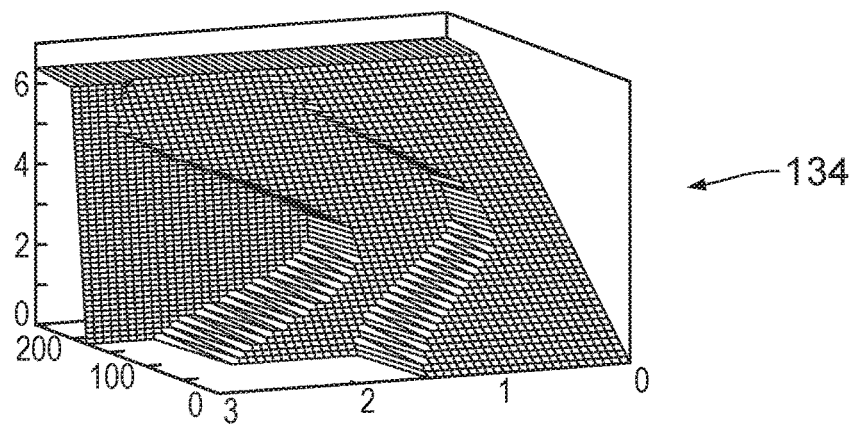
Figure 37:
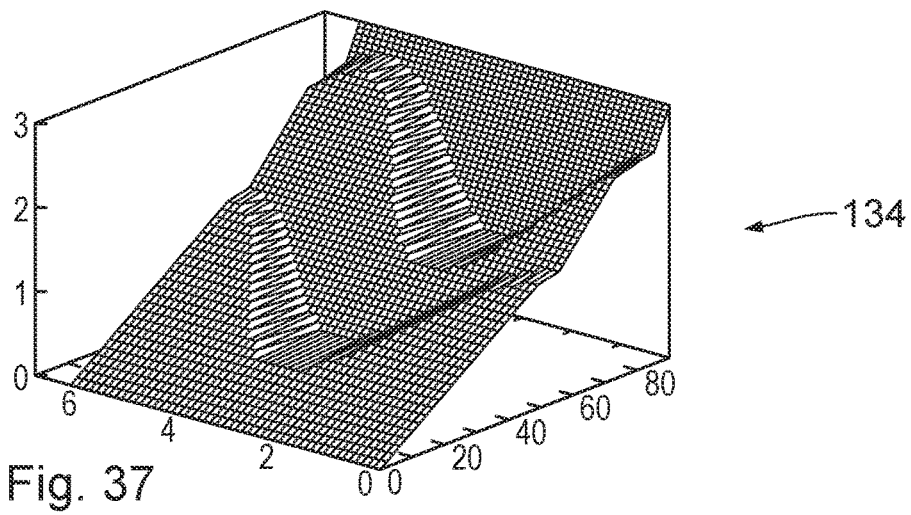

In the case of the alternatives illustrated in FIGS. 32, 34, 36, the illumination region 137 is oriented horizontally on the separating plate 134, that is to say the entire width of the separating plate is illuminated, but only part of the height. In the case of the alternatives illustrated in FIGS. 33, 35 and 37, the illumination region 137 is oriented vertically on the separating plate 134, that is to say that the entire height of the separating plate is illuminated, but only part of the width.

In the case of the alternatives illustrated in FIGS. 32, 34, 35, the direction of the individual output beams $10_i$ to different scanners differs in the orientation in a horizontal plane, that is to say that the individual output beams $10_i$ run alongside one another to different scanners $3_i$. In the case of the alternatives illustrated in FIGS. 33, 36, 37, the direction of the individual output beams $10_i$ to different scanners $3_i$ differs in the orientation in a horizontal plane, that is to say that the individual output beams run one above another to different scanners.

Other configurations are possible in which, for example, the orientation of the illumination region 137 on the separating plate 134 is not parallel to one of the axes. In other configurations, the plane in which the directions of the individual output beams $10_i$ to different scanners $3_i$ are situated is not parallel to a coordinate plane. In other configurations, the directions of the individual output beams $10_i$ to different scanners $3_i$ do not lie in one plane.

A description is given below of general aspects of the methods according to the disclosure for controlling the division of the illumination radiation 5 among the scanners $3_i$ with the aid of the output coupling optical unit 9. Even though the description of these aspects relates to individual concrete embodiments of the output coupling optical unit 9, the considerations correspondingly apply to all of the embodiments presented in this disclosure.

Without restricting the generality, hereinafter use is made of the convention that a dose of the illumination radiation 5 of 1 per unit time would arrive at each of the scanners $3_i$ if the illumination radiation 5 from the radiation source 4 were distributed uniformly among the scanners $3_i$ without further components.

The dose of illumination radiation 5 with which a point on one of the wafers $25_i$ is exposed results from the temporal integral of the instantaneous radiation dose with which the point is exposed while it passes through the scanner slot. The intensity of the radiation source 4, in particular the individual intensity of the individual output beam $10_i$ guided to the corresponding scanner $3_i$, can be varied within this time.

The radiation source 4 is operated in a pulsed fashion, in particular. It emits illumination radiation 5 in the form of a sequence of pulses including illumination radiation 5. It is assumed below that the time duration over which the division ratio of the total intensity to the individual intensities is varied, in particular the period $T_{Var}$ of this variation, is divided into N disjoint intervals. The intervals can have in particular identical widths, that is to say identical interval durations. They can also have different widths. If the sum of the intensities of the pulses including illumination radiation 5 that are emitted by the radiation source 4 in the k-th interval is designated by $x_k$, then the total intensity that reaches the i-th scanner $3_i$ is given by $$y_i = \sum_k a_{ik} x_k$$

wherein $a_{ik} \geq 0$.

It is assumed here that $a_{ik}$ is constant over the length of the k-th interval and/or that the individual pulses in the interval k in each case have an identical intensity. However, the considerations can be extended without any problems to the case where the intensity of the pulses is variable within the individual intervals.

Given pulses having a constant intensity, the total intensity of the illumination radiation 5 which reaches the i-th scanner $3_i$ in the k-th interval results from the intensity of an individual pulse, in particular the average intensity of an individual pulse, which is weighted with the length of the interval.

Depending on whether the individual regions $135_i$ of the separating plate 134 only have an attenuating effect with an attenuation that varies in the displacement direction 139, or whether the regions $135_i$ lead to a redistribution of illumination radiation 5 between the individual scanners $3_i$, different upper limits can be specified for the matrix elements $a_{ik}$.

The elements $a_{ik}$ of the matrix A substantially indicate what radiation dose of the illumination radiation 5 reaches the scanner $3_i$ in the time interval k if the radiation source 4 emits illumination radiation 5 having the power 1 in this interval.

If the total intensity that is maximally emitted by the radiation source 4 is normalized to 1, without restricting the generality, it generally holds true that:

$$0 \leq \sum_k a_{ik} \leq N.$$

The individual matrix elements $a_{ik}$ can be greater than 1. However, an upper limit u can be specified:

$0 \leq a_{ik} \leq u$.

Generally, it is not necessary for there to be only a single separating plate 134 at which the radiation is divided among a plurality of scanners $3_i$. Another possibility is first to divide the radiation to individual output beams $10_i$ in accordance with a fixed ratio and then to guide the individual output beams $10_i$ via a dedicated separating plate in each case.

At the separating plates, in particular, in each case only one variable part of the individual output beam $10_i$ can be guided to the scanner $3_i$, while another part of the energy is removed from the individual output beam. This alternative configuration is described in even greater detail below with reference to FIGS. 49 and 50.

In the case of the configuration with a single separating plate 134, the division ratio $f_i(p)$ to the individual output beams $10_i$ to the scanners $3_i$ was described by a parameter p. If all the scanners $3_i$ are equivalent, then $f_i(p)$ can be chosen such that—if the two edges of the separating plate 134 are identified with one another, that is to say the division ratio to the individual output beams $10_i$ is identical at the upper and lower edges of the separating plate—$f_{i+1}(p)=f_i(p+\Delta)$. In other words, the different functions $f_i(p)$ differ only in a shift of the parameter p. If the parameter p is varied periodically, then the different functions $f_i(p)$ thus differ in a phase shift. FIG. 27 is one example of such a configuration.

In the case, too, of a configuration with a plurality of separate separating plates it is assumed below that the separating plates are constructed identically and are phase-shifted relative to one another only in their driving.

Moreover, it is assumed below that the period $T_{Var}$ in the case of M scanners $3_i$ is divided into N=M disjoint intervals, wherein the radiation source emits a specific, identical number of pulses including illumination radiation 5 in each of the M intervals.

The matrix A is a cyclic matrix under the above assumptions. This is advantageous since linear computation operations, such as solving systems of equations, for example, for such matrices can be carried out very efficiently by reduction to one-dimensional discrete Fourier transformations.

The matrix A is invertible, in particular, that is to say that there exists a matrix B having matrix elements $b_{ik}$, such that the following holds true:

$$x_i = \sum_k b_{ik} y_k$$

Hereinafter, $y_{max}$ denotes the maximum intensity of all the individual output beams $10_i$, that is to say the maximum intensity that is intended to be received by a scanner $3_i$. Correspondingly, $y_{min}$ denotes the minimum intensity of all the individual output beams $10_i$. The capability of being able to set different intensities for the individual scanners $3_i$ is determined by the ratio of $y_{max}$ and $y_{min}$. Hereinafter, for characterizing the range of different divisions of the total intensity of the collective output beam 8 into individual output beams $10_i$ this is identified by the parameter $r=(y_{max}-y_{min})/y_{max}$.

Via a numerical optimization it was possible to examine the dependence of the parameter r on $y_{max}$ for different numbers M of scanners $3_i$. The following general relationship could be discerned from the further analysis of the results:

$$r_N(y_{max}) = 1 - \frac{2\sqrt{(N-1)(y_{max}-1)} - (N-2)}{y_{max}}$$

Figure 38:
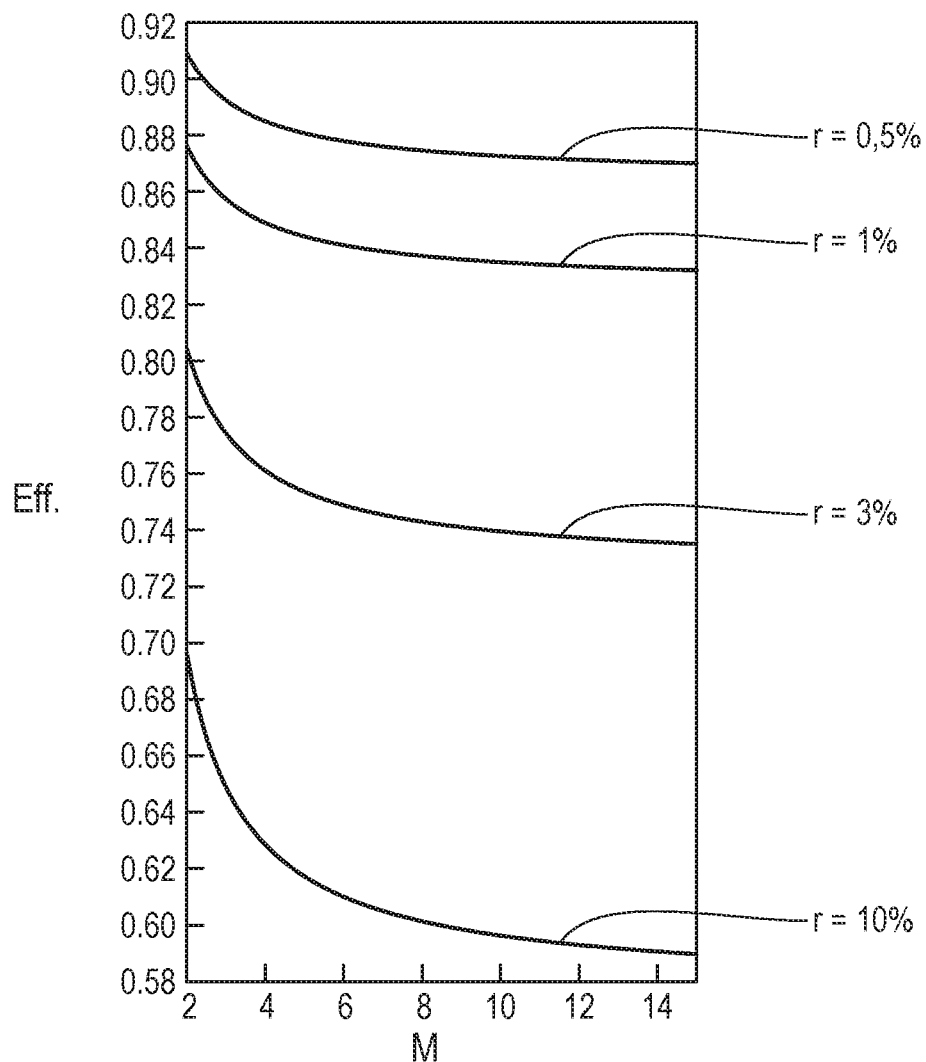
FIG. 38 shows exemplary illustrations of the efficiency of the division of the collective output beam into individual output beams depending on the number of scanners for different setting ranges r.
Figure 39:
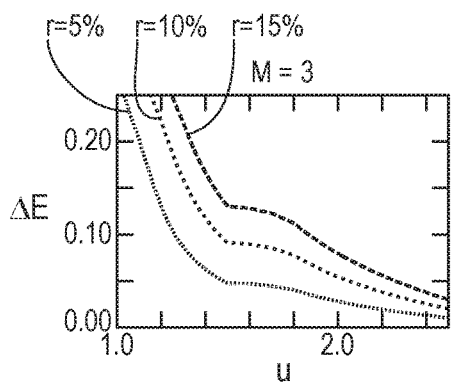
FIGS. 39 to 44 show exemplary illustrations of the energy loss depending on a maximum redistribution u of radiation intensity between the individual output beams for a different number M of scanners.
Figure 40:
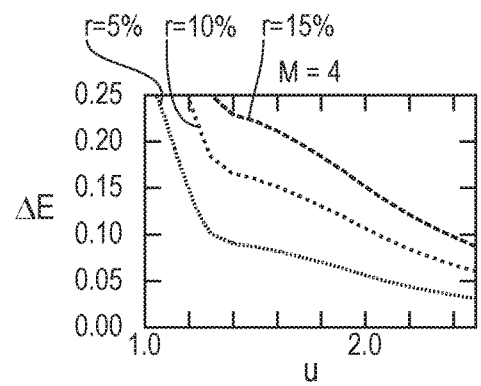
Figure 41:
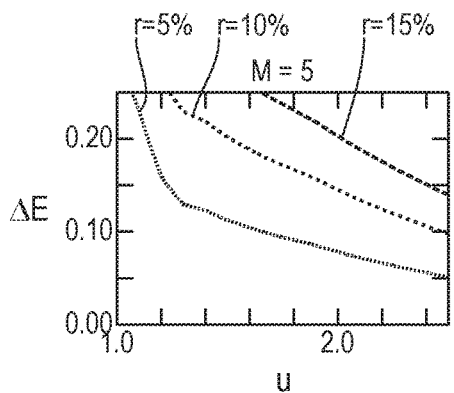
Figure 42:
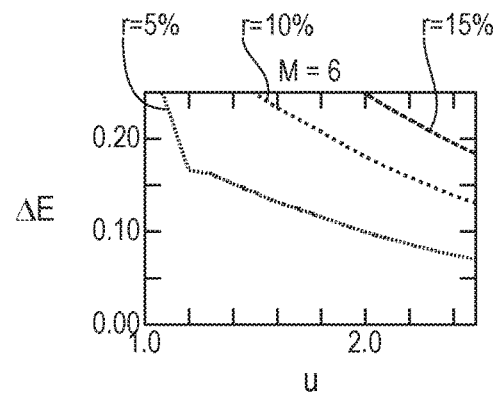
Figure 43:
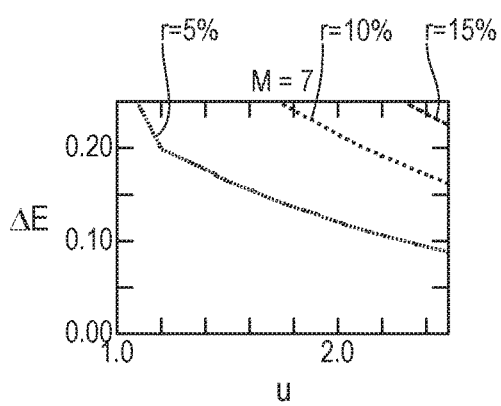
Figure 44:
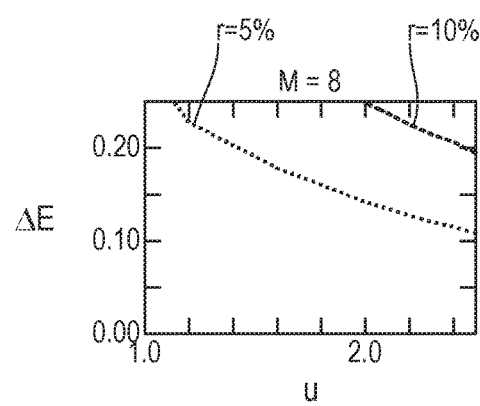

This allows the determination of the maximum value $y_{max}$ for which a specific value r can be set. Without an attenuation in the beam path, the total intensity $y_i$ at the scanner $3_i$ would be proportional to the total number N of intervals, such that the ratio $y_{max}/N$ indicates the energy efficiency. The energy efficiency can be determined by inverting the above-indicated equation for $r_N(y_{max})$. The result is illustrated in FIG. 38 for different values of r depending on the number M of scanners $3_i$.

Generally, via the output coupling optical unit 9, in particular via the separating plate 134, energy of the illumination radiation 5 can be redistributed between the scanners $3_i$. This should be understood to mean, in particular, that, proceeding from an average energy or individual intensity of the individual output beams $10_i$, the individual intensity of one subset of the individual output beams $10_i$ can be increased at the expense of the individual intensities of another subset of the individual output beams $10_i$. In the extreme case, the entire collective output beam 8, that is to say the total intensity of the collective output beam 8, can be guided in each case to exactly one of the scanners $3_i$ at a specific point in time. In other words, the collective output beam 8 can in each case be divided to exactly one of the individual output beams $10_i$, while the other individual output beams $10_j$, $j \neq i$ have individual intensities=0 at this point in time. In this case, the dose of the scanner $3_i$ can be controlled, in particular controlled by closed-loop control, by the control, in particular closed-loop control, of the power of the radiation source 4, without this having an effect on the other scanners $3_j$. However, in this case, each of the scanners $3_i$ is supplied with illumination radiation 5 only for a proportion 1/N of the period $T_{Var}$. This can lead to pulse quantization effects.

The parameter u indicates, in particular, the maximum value of the matrix elements $a_{ik}$. Illustratively, this value represents the ratio of the maximum individual intensity of one of the individual output beams $10_i$ to the average individual intensity of all the individual output beams $10_i$, which corresponds precisely to the total intensity of the collective output beam 8 divided by the number M of scanners $3_i$. It is assumed here that the total intensity of the collective output beam 8 is distributed completely among the individual output beams $10_i$.

FIGS. 39 to 44 illustrate the energy loss $(N-y_{max})/N$ depending on a parameter u for different numbers M of scanners $3_i$. The figures illustrate by way of example in each case curves for r=5%, r=10% and r=15%. As can be gathered qualitatively from FIGS. 39 to 44, an increase in the parameter u leads to a reduction of the energy loss. The disclosure provides, in particular, for embodying the separating plate 134, in particular the regions $135_i$ thereof, in such a way that u≥2. As an upper limit for u, in particular u≤6 can be chosen.

It can be shown analytically that for a large number N of intervals the value for the achievable energy efficiency approximates $1/(1+\sqrt{r})^2$. The disclosure therefore provides the use of a neutral filter, and its influencing of the individual intensities of the individual output beams $10_i$ exclusively by energy absorption, only for small values of M and/or small values of r. The use of a neutral filter is provided in particular in the case of a maximum of M=5, in particular a maximum of M=3, scanners $3_i$. The use of a neutral filter is provided in particular in the case of r<0.1, in particular r<0.05, in particular r<0.02, in particular r<0.01.

Figure 45:
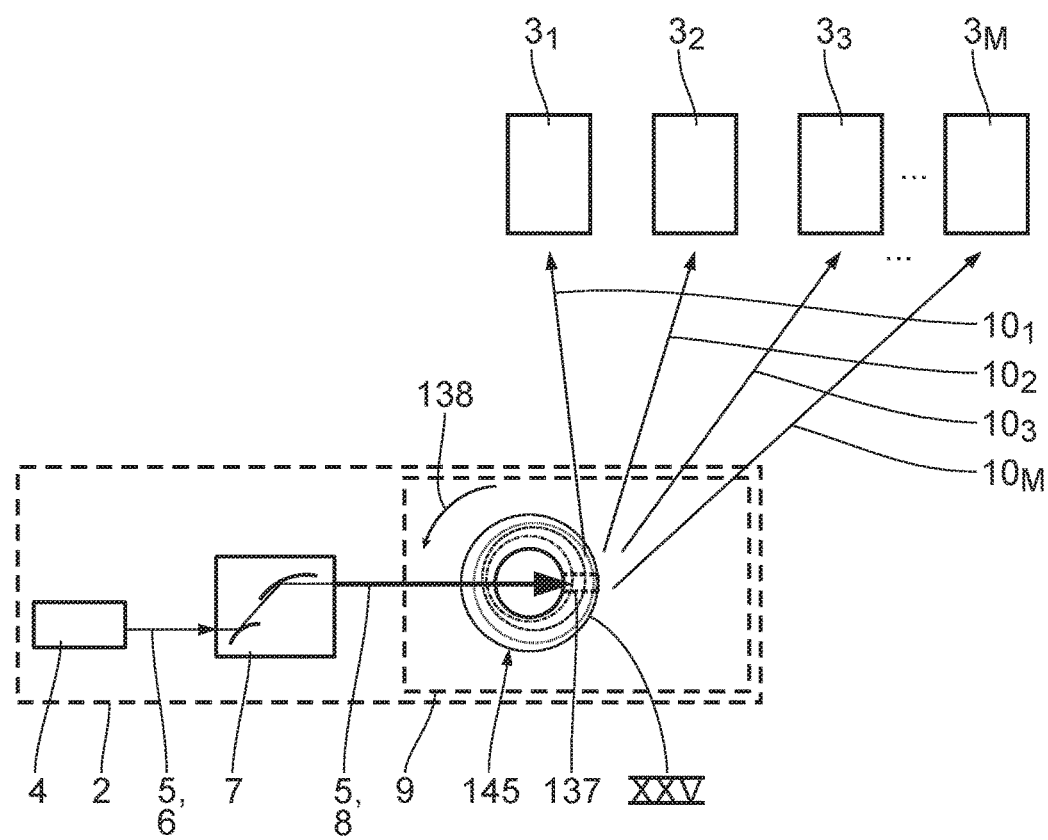
FIG. 45 shows an illustration in accordance with FIG. 25 of an alternative variant of the output coupling optical unit.
Figure 46:
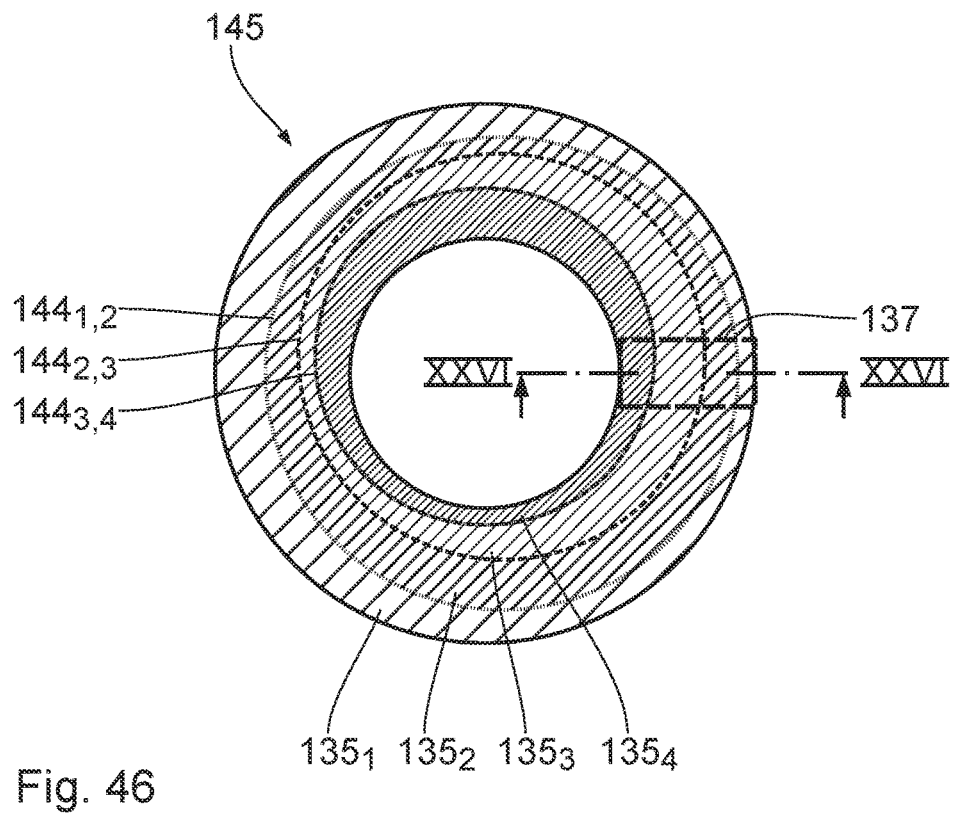
FIGS. 46 and 47 show excerpt details from FIG. 45.
Figure 47:
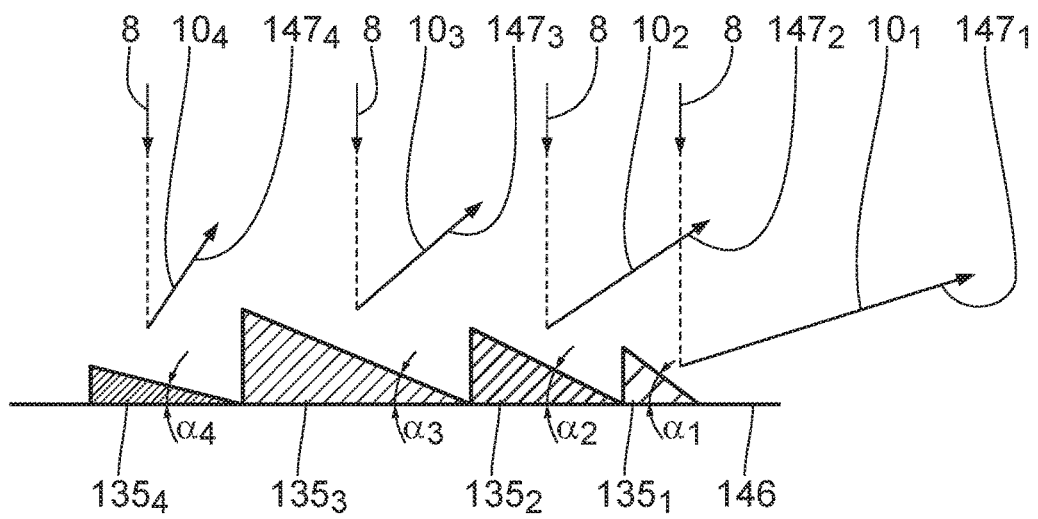

An alternative of the output coupling optical unit 9 is described below with reference to FIGS. 45 to 47. Identical parts acquire the same reference signs as in the case of the above-described variant, to the description of which reference is hereby made.

In this embodiment, a rotatable separating plate 145 is provided instead of the stationary separating plate 134. The rotating polygon mirror 136 can be dispensed with in this variant.

In this variant, the output coupling optical unit 9 thus includes a rotating element, the separating plate 145, which is provided with a location-dependent division ratio of the total intensity of the collective output beam 8 to the individual intensities of the individual output beams $10_i$.

The separating plate 145 is embodied in an annular fashion, that is to say in a circular-ring-shaped fashion.

The illumination region 137, that is to say the region which is illuminated by the collective output beam 8, is stationary in this variant. Via a rotation of the separating plate 145, therefore, the separating plate 145 is displaced relative to the illumination region 137 and the illumination region 137 is thus displaced relative to the separating plate 145.

The different regions $135_i$ in each case have boundaries $144_{ij}$ that are embodied in such a way that the partial regions of the regions $135_i$ that are covered by the illumination region 137 change during a rotation of the separating plate 145. The division ratio of the total intensity of the collective output beam 8 into individual intensities of the individual output beams $10_i$ can be varied as a result. The division ratio can be varied periodically, in particular. In this case, the period can correspond in particular precisely to an entire revolution of the separating plate 145.

In the embodiment illustrated by way of example in the figures, the separating plate 145 has four different regions $135_1$ to $135_4$. The number N of regions $135_i$ corresponds once again to the number M of scanners $3_i$. In this variant, too, it is possible to divide the regions $135_i$ into a plurality of separate, that is to say non-connected, partial regions. The regions $135_i$ can be divided into partial regions in particular in such a way that at least one of the individual output beams $10_i$ guided to a specific scanner $3_i$ is reflected by a plurality of separate, that is to say non-connected, partial regions on the separating plate 145.

In reality, the projection exposure system 1 usually includes more than four scanners $3_1$ to $3_4$. In this case, the number n of different regions $135_i$ of the separate plate 145 is also correspondingly higher. FIG. 47 schematically illustrates how a division of the collective output beam 8 into the different individual output beams $10_i$ is achieved. The individual regions $135_i$ have different inclination angles $\alpha_i$ relative to a plane 146 parallel to the rear side of the separating plate 145. This leads to different emergence directions $147_i$ of the individual output beams $10_i$ reflected, that is to say deflected, at the individual regions $135_i$.

Figure 48:
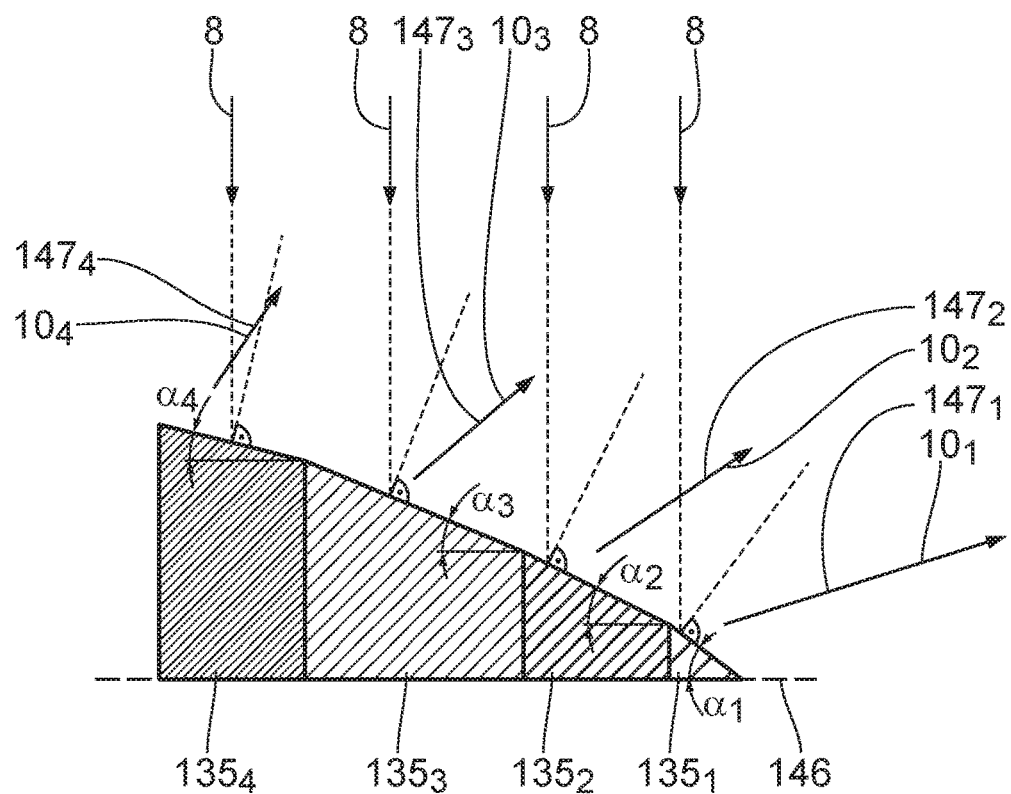
FIG. 48 shows an illustration in accordance with FIG. 47 with an alternative arrangement of the different regions of the separating plate.

In order to avoid a shading of the individual output beams $10_i$ by adjacent regions $135_j$, the regions $135_i$, as is illustrated by way of example in FIG. 48, can be offset in a direction perpendicular to the plane 146. The regions $135_i$ are preferably offset with respect to one another in particular in such a way that the separating plate 145 overall has a continuous surface, that is to say a surface free of steps. A corresponding embodiment of the separating plate 145 having a continuous surface free of steps is advantageous in particular if the reflection of the illumination radiation 5 is intended to be carried out with grazing incidence. In this case, grazing incidence should be understood to mean, in particular, incidence of the illumination radiation 5 at angles of incidence of at least 70° relative to the surface normal of the reflective surface.

A further variant of the output coupling optical unit 9 is described below with reference to FIG. 49. Identical parts acquire the same reference signs as in the above-described variants, to which reference is hereby made.

In this variant, the output coupling optical unit 9 includes a dividing unit 148 for dividing the collective output beam 8 into individual output beams $10_i$. The dividing unit 148 includes a plurality of deflection elements $149_i$. The deflection elements $149_i$ serve in each case for deflecting and coupling out one of the individual output beams $10_i$ from the collective output beam 8. They are arranged in a stationary fashion in the beam path of the illumination radiation 5.

Elements for influencing the transmission are in each case provided for varying the individual intensities of the individual output beams $10_i$. In particular, such an element is assigned to each of the individual output beams $10_i$. The element for influencing the transmission is embodied in particular in each case as a rotating element with location-dependent transmission. This can involve in particular in each case rotating neutral filters $150_i$. The neutral filters $150_i$ have in particular in each case an annular filter region whose absorption and thus transmittance vary in the azimuthal direction, that is to say depending on the rotational position.

Figure 49:
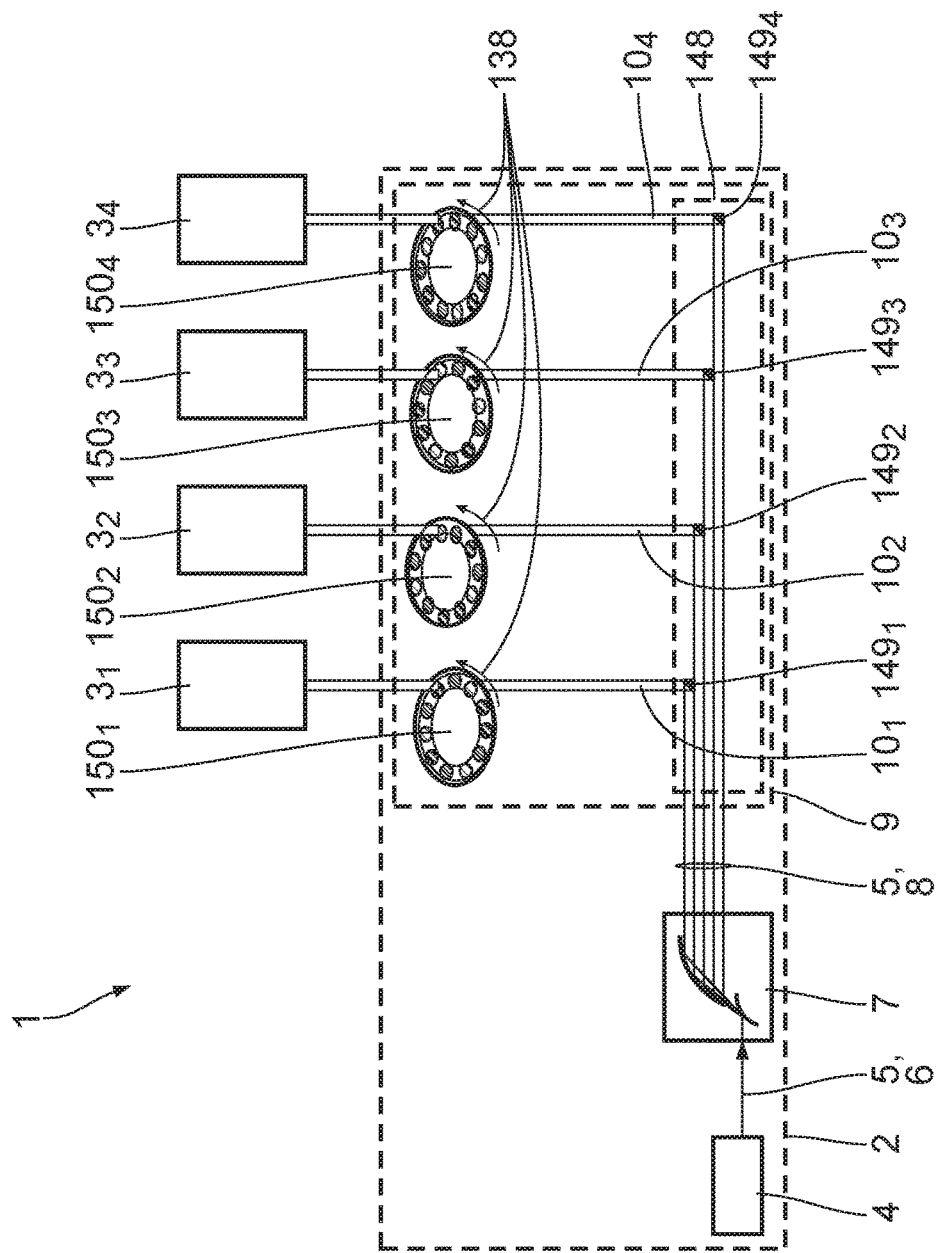
FIGS. 49 and 50 show illustrations in accordance with FIG. 25 with alternative variants of the output coupling optical unit, FIG. 51 an illustration in accordance with FIG. 26 of a further variant of the output coupling optical unit.

FIG. 49 illustrates by way of example and schematically a variant in which a separate neutral filter $150_i$ is assigned to each of the individual output beams $10_i$. In principle, it is also possible to influence a plurality, in particular all, of the individual output beams $10_i$ with a single rotating neutral filter 150. Here the neutral filter 150 can have in each case a separate filter region for each of the individual output beams $10_i$. It is also possible to influence, in particular attenuate, the individual output beams $10_i$ differently via different impingement regions on the neutral filter $150_i$. In this case, it may suffice to embody the neutral filter 150 with a single annular filter region. Further alternatives are likewise possible. A neutral filter can also be realized in reflection by virtue of a variable proportion of the radiation being directed from the beam path and subsequently absorbed.

The neutral filters $150_i$ enable a periodic adaptation of the individual intensities of the individual output beams $10_i$. The individual intensities of the individual output beams $10_i$ can be controlled independently of one another in particular with the aid of the neutral filters $150_i$.

The total intensity of the collective output beam 8 can in turn be controlled, in particular controlled by closed-loop control, as desired. It can be controlled, in particular controlled by closed-loop control, in particular depending on the variation of the division ratio of the total intensity of the collective output beam 8 into the individual intensities of the individual output beams $10_i$. It can be controlled, in particular controlled by closed-loop control, in particular also depending on predefined desired doses of the illumination radiation 5 which are intended to reach the different wafers $25_i$. For further details, supplementations and alternatives, reference should be made to the alternatives above.

In this embodiment, the number of rotating elements can be precisely equal to the number of individual output beams $10_i$ in particular precisely equal to the number of scanners $3_i$. The rotating elements are provided with a location-dependent absorption or reflectivity or transmission.

Figure 50:
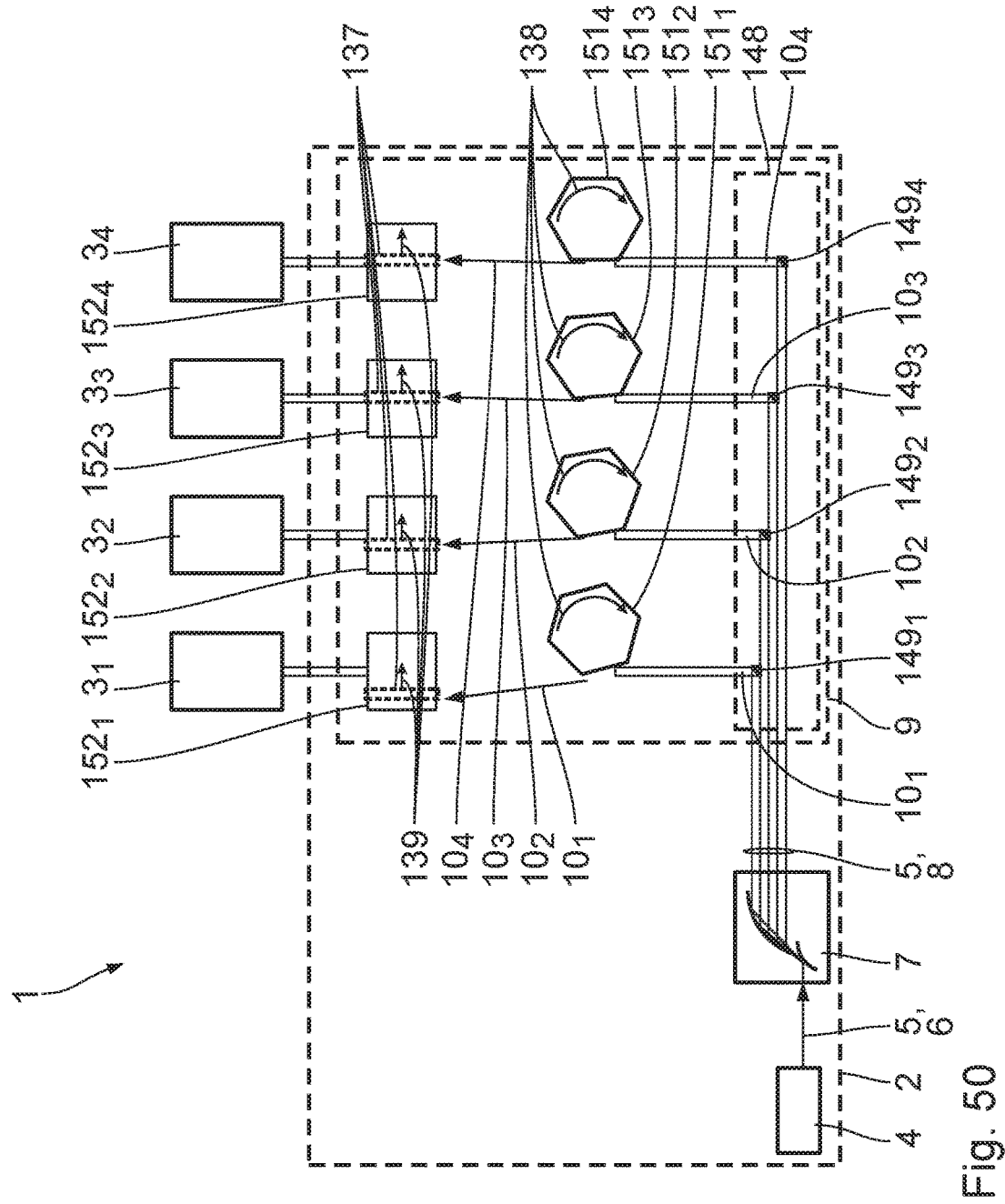

A further variant of the output coupling optical unit 9 is described below with reference to FIG. 50. Identical parts acquire the same reference signs as in the case of the above-described variants, to which reference is hereby made.

In this variant, the output coupling optical unit 9 includes, instead of the rotating neutral filters $150_i$ of the variant illustrated in FIG. 49, in each case a rotating polygon mirror $51_i$ and in each case a stationary component assigned thereto and having a location-dependent transmission, in particular reflection or absorption. The stationary component is embodied in each case as a rectangular plate $152_i$ having a transmittance that varies in the displacement direction 139.

The polygon mirror $51_i$ results in each case in an illumination region 137 displaceable in the displacement direction 139 on the plate $152_i$. The displacement of the illumination region 137 substantially corresponds to the variant illustrated in FIG. 25. However, in the variant in accordance with FIG. 50, the plate $152_i$ does not serve for dividing the collective output beam 8 into the individual output beams $10_i$, but rather only for influencing the individual intensity of one of the individual output beams $10_i$, which reaches the scanner $3_i$.

Different methods for controlling the division of the total intensity of the collective output beam 8 to the individual intensities of the individual output beams $10_i$ are described below.

In all of the variants described above, the output coupling optical unit 9 includes at least one rotatable, that is to say at least one periodically displaceable, element. For controlling the division of illumination radiation 5 of the radiation source 4 among the plurality M of scanners $3_i$, it is possible firstly to determine the temporal profile of the division ratio of the total intensity of the collective output beam 8 into the individual intensities of the individual output beams $10_i$ depending on the periodically variable setting of the element.

In addition, provision is made for determining the average actual intensities of each of the individual output beams $10_i$. The actual intensities can be determined in particular in a manner averaged in each case over a period.

It is possible here to determine the actual intensities in each case at the input of the scanners $3_i$ and/or in the region of the object field $11_i$ and/or in the region of the image field $23_i$. In principle, the actual intensities can also be determined at other locations in the beam path downstream of the output coupling optical unit 9.

For predefined setpoint intensities of the individual output beams $10_i$, correction factors for adapting the average actual intensities of each of the individual output beams $10_i$ can be determined on the basis of the actual intensities determined.

Finally, the total intensity of the collective output beam 8 can be controlled depending on the correction factors determined and in dependence, in particular in temporal dependence, on the periodic variation of the means for varying the division ratio of the total intensity of the collective output beam 8 into the individual intensities of the individual output beams $10_i$. This can take place with the aid of the control device 133, in particular. The total intensity of the collective output beam 8 can be achieved in particular by control of the radiation source 4 in particular control of the pulse frequency of the radiation source 4, in particular by control of the average pulse frequency of the radiation source 4. In this case, the control can be effected with feedback, in particular. In other words, a closed-loop control can be involved.

In particular, provision can be made for individually controlling, in particular controlling by closed-loop control, the pulse frequency of the radiation source for each of the disjoint intervals of the period $T_{Var}$. In this case, the pulse frequency can be constant within the individual intervals. It can also be controlled, in particular controlled by closed-loop control, within the intervals.

Instead of disjoint and discrete intervals, the intensity and/or pulse frequency of the radiation source can also be continuously controlled, in particular controlled by closed-loop control. This can be advantageous in particular if the division ratio of the collective output beam 8 into individual output beams $10_i$ is varied continuously, in particular constantly.

As an alternative thereto, the control of the division of the illumination radiation 5 from the radiation source 4 among the scanners $3_i$ can take place as follows: Firstly, setpoint intensities of the individual output beams $10_i$ or desired doses with which the wafers $25_i$ in the different scanners $3_i$ are intended to be exposed are predefined.

A temporal profile of the division ratio of the total intensity of the collective output beam 8 into the individual intensities of the individual output beams $10_i$ depending on the variable setting of the means for varying the division ratio is determined.

This is followed by determining a temporal sequence $p_k$ of settings of the means for varying the division ratio of the total intensity of the collective output beam 8 into the individual intensities of the individual output beams $10_i$ which can be used to achieve a division ratio of the total intensity of the collective output beam 8 to the individual output beams $10_i$ that is averaged over the entire sequence $p_k$. The temporal sequence $p_k$ is determined in particular depending on the predefined setpoint intensities.

This is followed by determining the actual intensity of each of the individual output beams $10_i$ that is averaged over the sequence $p_k$ when passing through the entire sequence $p_k$ of the setting of the means for varying the division ratio.

Deviations of the determined actual intensities from the predefined setpoint intensities are determined therefrom.

An adaptation of the total intensity of the collective output beam 8 or its temporal profile and/or the sequence of the settings $p_k$ can be effected constantly. It can also be effected only if at least one of the deviations exceeds a predefined maximum value.

The total intensity of the collective output beam 8 can be in particular temporally controlled, in particular controlled by closed-loop control. It can be controlled, in particular controlled by closed-loop control, in particular depending on the sequence $p_k$ of the settings of the means for varying the division ratio.

For the closed-loop control of the total intensity of the collective output beam 8 and for the closed-loop control of the sequence of the settings $p_k$, in particular two separate control loops are provided. The control loop for the closed-loop control of the total intensity of the collective output beam 8, in particular of the intensity of the illumination radiation 5 emitted by the radiation source 4, in the time for a point on the wafer $25_i$ to pass through the scan slot, is passed through at least once, in particular multiply, in particular at least three times, in particular at least five times, in particular at least ten times. The duration within which a pass of the control loop takes place is designated as $T_{Var}$ by analogy with the exemplary embodiments described above.

The closed-loop control of the setting of the means for varying the division ratio of the collective output beam 8 into individual output beams $10_i$ can be effected in a separate control loop. This is advantageous since new predefined values for the division ratios to be set can emerge from the measurements of the actual intensities of the individual output beams $10_i$ at each point in time, but only exactly one value for the instantaneous division ratio of the illumination radiation 5 emitted by the radiation source 4 that is to say of the collective output beam 8, to the individual output beams $10_i$ can be set at each point in time. The sequence $p_k$ of the settings of the means for varying the division ratio of the collective output beam 8 into the individual output beams $10_i$ is determined from the predefined values for the target dose values. The means for varying the division ratio is then set in accordance with the sequence $p_k$ determined.

Further details of these methods and further variants of the output coupling optical unit 9 are described in greater detail below.

A further exemplary embodiment of the output coupling optical unit 9 is described below with reference to FIG. 51. The variant illustrated in FIG. 51 substantially corresponds to that illustrated in FIG. 26, to the description of which reference is hereby made. In the variant in accordance with FIG. 51, a displaceable deflection mirror 153, in particular one that is displaceable in an actuatable manner, is provided instead of the rotating polygon mirror 136. Via a displacement, in particular a tilting, of the deflection mirror 153, the illumination region 137 is displaceable relative to the separating plate 134. Consequently, the division of the collective output beam 8 into the individual output beams $10_i$ can be varied by control of the displacement position of the deflection mirror 153.

Given a distance between the deflection mirror 153 and the separating plate 134 of 2 m and an extent of the separating plate 134 in a direction parallel to the displacement direction 139 of 100 mm, the tilting range of the deflection mirror 153 relative to a central position is ±12.5 mrad. Given a basis of 10 mm, such a tilting corresponds to a movement of two linear actuators by ±62.5 μm, around their zero positions. Piezo-actuators can be used for displacing the deflection mirror 153. The piezo-actuators enable, in particular, a very fast displacement of the deflection mirror 153. The time for displacing the deflection mirror 153 between two displacement positions is in particular less than 1 ms, in particular at most 0.1 ms, in particular at most 0.05 ms, in particular at most 0.03 ms, in particular at most 0.02 ms, in particular at most 0.01 ms.

Figure 52:
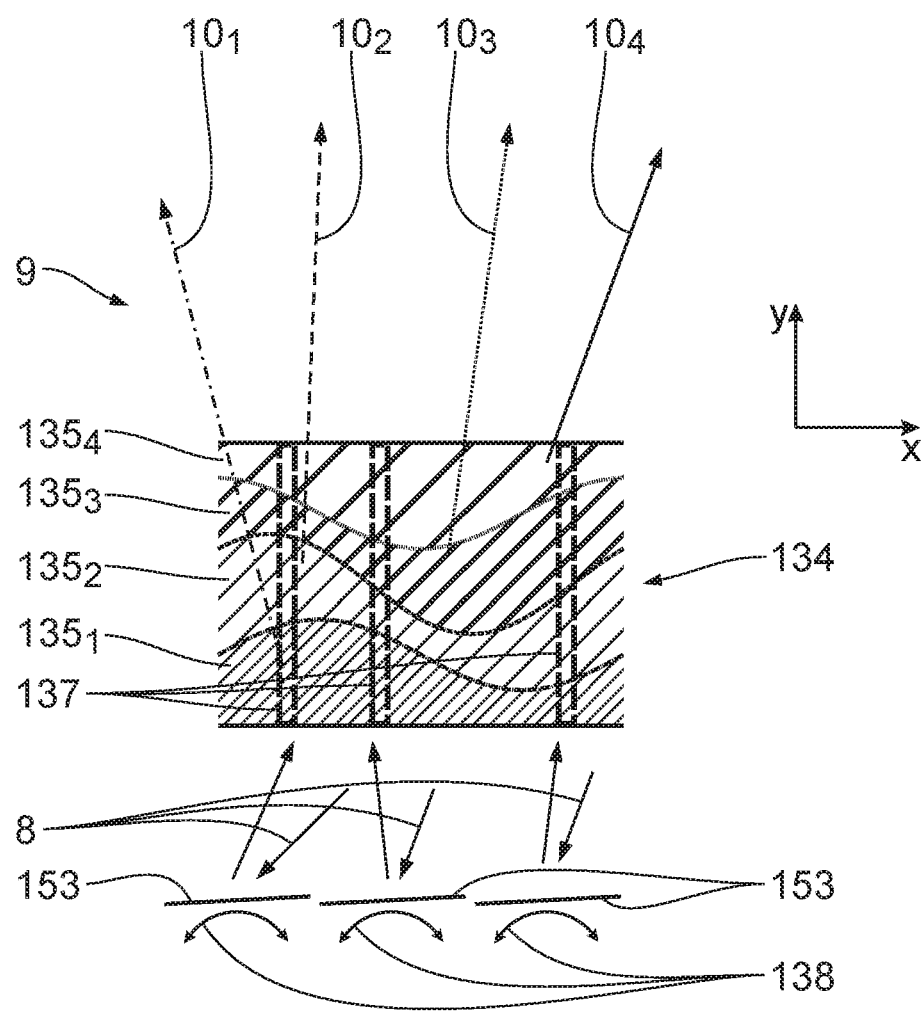
FIG. 52 shows a further variant of the output coupling optical unit in accordance with FIG. 24, FIGS. 53 to 55B show schematic illustrations for explaining the method for adapting the power of the radiation source depending on the division of the collective output beam to the individual output beams with the aid of the output coupling optical unit.

Illustrated schematically in FIG. 52, the output coupling optical unit 9 in accordance with one variant can also include a plurality of deflection mirrors 153, for example two, three, four, five or more deflection mirrors 153 instead of a single deflection mirror 153. If a number q of deflection mirrors 153 are used, q different illumination regions 137 can be simultaneously illuminated on the separating plate 134 by a single collective output beam 8.

One advantage of this alternative is that the actuators for displacing the deflection mirrors 153 have to be moved more slowly than in the case of the alternative with a single deflection mirror 153. The time between two switching processes can be longer than in the case of the alternative with a single deflection mirror 153 in particular by a factor which precisely corresponds to the number q of deflection mirrors 153. Moreover, the displacement travel per switching process can be smaller. In principle, it is also possible to assign a dedicated separating plate 134 to each of the individual deflection mirrors 153.

The number of deflection mirrors 153 can correspond in particular precisely to the number of scanners $3_i$. It is also possible for the output coupling optical unit 9 to have a number of deflection mirrors 153 that is smaller than the number of scanners $3_i$.

A configuration in which the number q of deflection mirrors 153 corresponds at least to the number M of scanners $3_i$, q≥M, affords the advantage that the setting of the deflection mirrors 153 does not have to be varied within a period of the control loop. The timescale on which the deflection mirrors 153 have to be set is therefore no longer given by the time $T_{Var}$, but rather only by the timescale on which the relevant drift effects of the lithography apparatus 1 take place.

Figure 51:
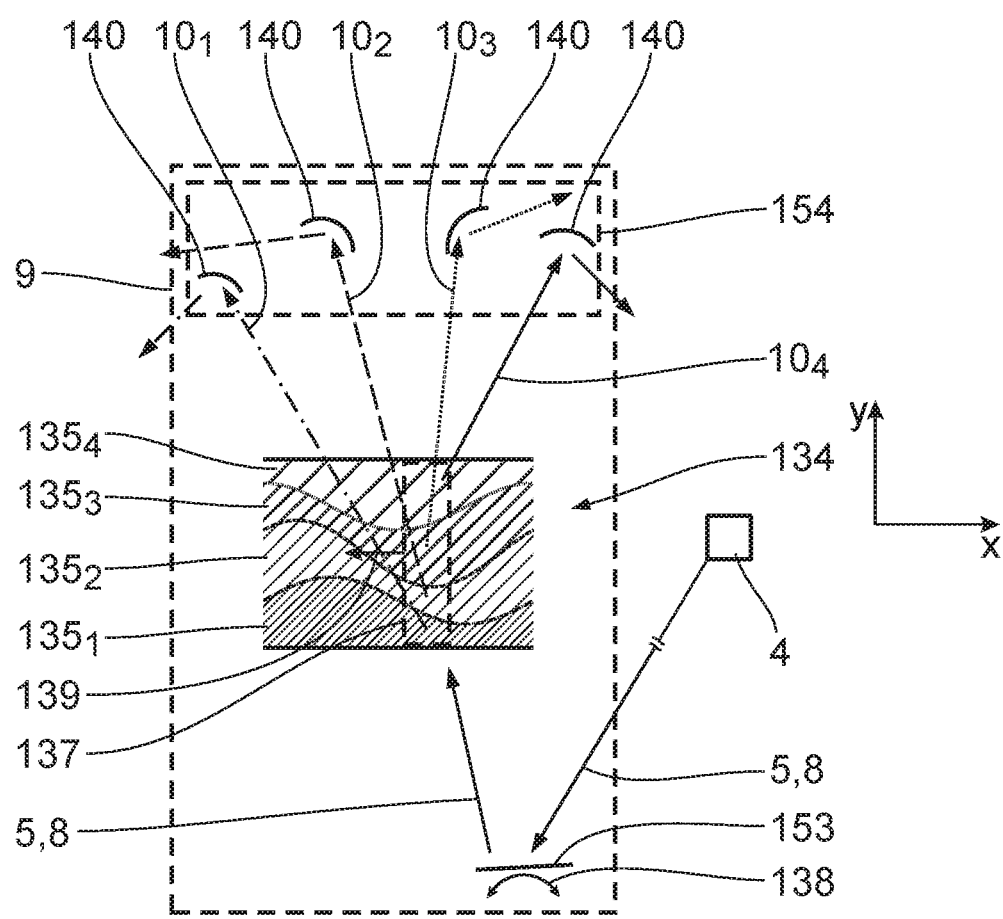

In the variants in accordance with FIGS. 51 and 52, too, an angle increasing component in accordance with FIG. 64 can advantageously be used. The range of tiltability of the deflection mirror 153 can be reduced as a result.

Figure 56:
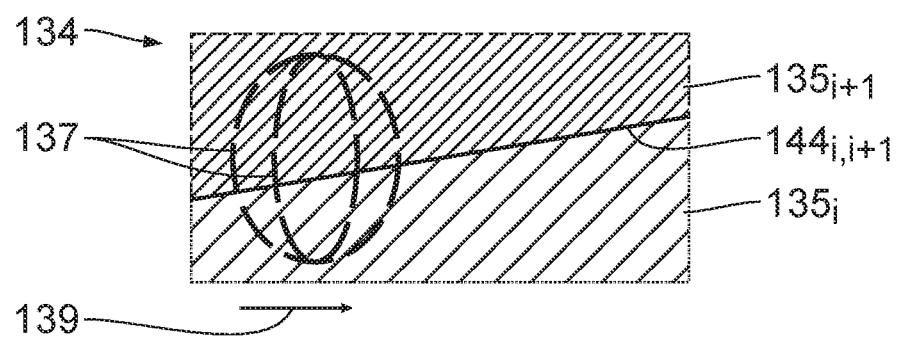
FIGS. 56 and 57 show schematic illustrations for elucidating further aspects of the method for dividing the collective output beam to individual output beams.

The shape of the illumination region results from the beam properties of the radiation source 4 and the configuration of the beam shaping unit 7. As is illustrated schematically in FIG. 56, the illumination region 137 need not necessarily be embodied in a strip-shaped fashion, in particular need not necessarily be embodied in a rectangular fashion. FIG. 56 illustrates by way of example two different illumination regions 137 having a round, in particular an ellipse-like, shape. The two illumination regions 137 illustrated in FIG. 56 differ in their extent in the displacement direction 139.

Figure 57:
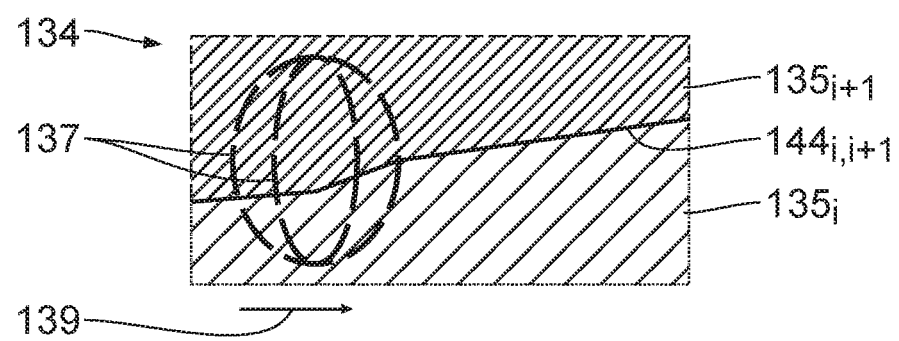

To a first approximation, a free electron laser emits a Gaussian radiation profile. What is desired for the following considerations, however, is merely the more general property that the illumination of the separating plate 134 factorizes: $I(x,y)=I_x(x) \cdot I_y(y)$, and that a mirror symmetry is present: $I_x(-x)=I_x(x)$. These conditions are met in particular if the beam properties of the radiation source 4 and also the beam shaping properties of the beam shaping unit 7 meet these conditions. In the case of a straight, linear course of the boundary $144_{i, i+1}$ this has the effect that the extent of the illumination region 137 in the displacement direction 139 becomes irrelevant for the division ratio of the collective output beam 8 to the individual output beams $10_i$. This no longer holds true if the course of the boundary $144_{i, i+1}$, as is illustrated by way of example in FIG. 57, has a bend and/or a curvature. In this case, the division ratio is dependent not only on the position of the centre of the illumination region 137, but also on the extent thereof in the displacement direction 139.

Advantageously, therefore, in the design of the separating plate 134 attempts are made to avoid bends of the boundaries $144_{ij}$ as much as possible. Moreover, curvatures are preferably kept as small as possible. Radii of curvature of the boundaries $144_{ij}$ are advantageously greater than double the diameter of the illumination region 137, in particular greater than five times the diameter of the illumination region 137, in particular greater than 10 times the diameter of the illumination region 137.

Moreover, in the control of the division ratio, in particular in the control of the displacement of the illumination region 137, the illumination region 137 is preferably prevented from becoming located in the region of bends or regions having large curvatures.

Figure 58:
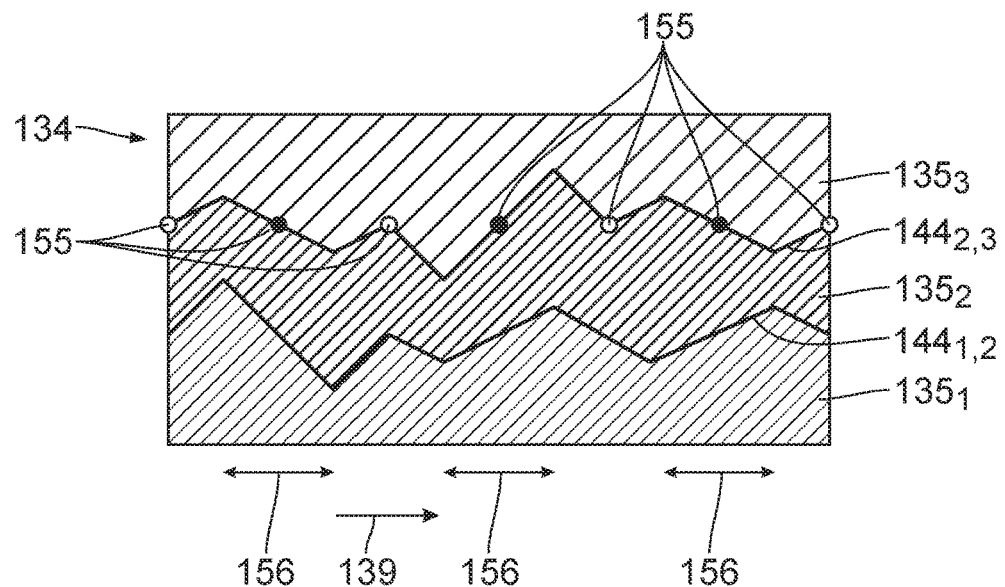
FIGS. 58 and 59 show schematic illustrations of different variants of the separating plate for elucidating further aspects of the disclosure.

FIG. 58 illustrates by way of example a separating plate 134 having three regions $135_1$, $135_2$, $135_3$. The boundaries $144_{1,2}$, $144_{2,3}$ are piecewise linear in this variant.

FIG. 58 highlights the positions in the displacement direction 139 by circular symbols 155 at which the region $135_3$ in a direction perpendicular to the displacement direction 139 has precisely one third of the total extent of the separating plate 134. This corresponds precisely to the positions at which for the scanner $3_3$ as individual intensity of the individual output beam $10_3$ it has the value of the standard intensity, that is to say the value of the total intensity divided uniformly among all three scanners $3_1$, $3_2$, $3_3$. Three of these positions are advantageous because the boundary $144_{2,3}$ has no bend at these locations. These positions are identified by filled-in symbols. The regions for displacing the illumination region 137 that are therefore advantageously used in this variant are indicated by double-headed arrow symbols 156.

Figure 59:
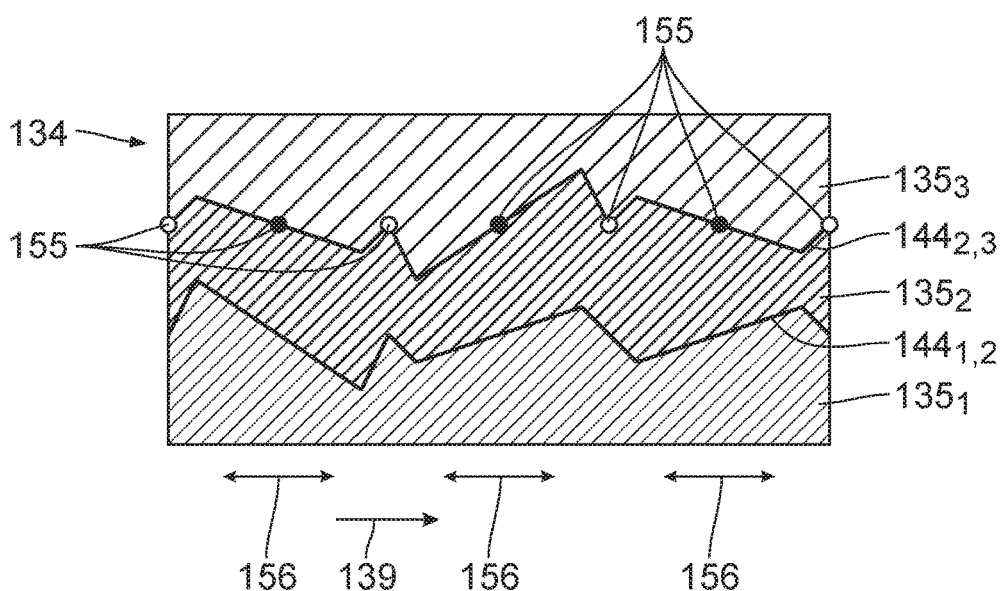

In order to make these regions as large as possible, provision can be made for steepening the non-advantageous regions. This is illustrated by way of example in FIG. 59. By changing the edge steepnesses, it was possible to considerably enlarge the advantageously used regions for displacing the illumination region 137 in the displacement direction 139.

Other aspects for setting the output coupling optical unit 9 are outlined below.

The considerations above assumed at least in part that the extensible parameter p is altered instantaneously at discrete points in time. This enabled general and nevertheless quantitative results to be derivable. In reality, the impingement position of the illumination radiation 5 on the separating plate 134, in particular the relative displacement position of the illumination region 137 with respect to the separating plate 134, are generally not be altered instantaneously, but rather continuously with time.

If the finite speed of the change of the parameter p is taken into account, then ultimately it is possible to move to significantly more different positions of the illumination region 137 within the period $T_{Var}$, although these positions are no longer selectable independently of one another. This can have the effect that a larger range of desired intensities $y_i$ can be set with a given lever m.

If the fact that the external parameter p can be altered only continuously with time is ignored, then the finite speed has the effect that the parameter p remains at a target position for a certain time before then subsequently moving to the next target position with finite speed.

All of the exemplary embodiments described fulfil the property that, for each region which results in an increase in the individual intensity of a specific one of the individual output beams $10_i$, there is a further region in which the individual intensity of the individual output beam $10_i$ is reduced. If the parameter p is therefore moved once over the entire movement region at constant speed, the net effect averages out.

The finite movement time has the effect, in particular, that the time at which the external parameter p has one of the desired values decreases. This has to be taken into account when determining the value to be set of the functions $f_i(p)$.

Furthermore, it has been recognized that the setting of the external parameter p is permitted to be rather inaccurate since the value of the parameter p is determined in a control loop. What is relevant to this is how many passes of the control loop take place within the time in which a point on the wafer $25_i$ passes through the scan slot. To a first approximation, the error of the division ratio averaged over the scan slot is given by the errors of the instantaneous division ratio divided by the root of the number of passes just described. The resulting relative error is advantageously less than ½ of the permitted relative error of the dose via which the wafer $25_i$ is exposed, in particular less than ¹⁄₁₀ of the permitted relative error of the dose.

The energy entering the individual scanners $3_i$, in particular the individual intensity of the different individual output beams $10_i$, can be measured very accurately and very rapidly via sensors, in particular via energy sensors or dose sensors. On the basis of these measurement values, it is possible to calculate what dose correction is desired. The total intensity of the illumination radiation 5 emitted by the radiation source 4, in particular the total intensity of the collective output beam 8, in particular depending on the target dose values $y_i$, can be controlled via the control device 33. It can be controlled by closed-loop control in particular with the aid of the sensors 132.

For the closed-loop control of the total intensity of the collective output beam 8, the following control loop can be passed:

Predefining a desired dose $\hat{s}_i$ for the i-th scanner $\mathbf{3}_i$, determining the present total intensity $\tilde{I}$ of the collective output beam $\mathbf{8}$. The present total intensity $\tilde{I}$ of the collective output beam $\mathbf{8}$ can be known from the previous pass of the control loop. It can also be measured in each case.

Determining the presently set relative dose variation $\tilde{y}_i$ averaged over the scanning duration. This value can be taken over from the previous passes of the control loop.

Measuring the actual dose $s_i$ of the i-th scanner $\mathbf{3}_i$, preferably as a moving average over time;

estimating what proportion of the total intensity of the collective output beam $\mathbf{8}$ reaches the reticle $\mathbf{22}_i$ of a specific scanner $\mathbf{3}_i$ as: $s_i/(\tilde{I}_i(1+\tilde{y}_i))$.

Solving the following system of equations $$\frac{I}{\tilde{I}} \cdot \frac{1+y_i}{1+\tilde{y}_1} \cdot s_i = \hat{s}_i$$

$$\sum_i y_i = 0$$

This system of equations always has a solution.

Adapting the total intensity of the collective output beam $\mathbf{8}$, in particular by adapting the power of the illumination radiation $\mathbf{5}$ emitted by the radiation source $\mathbf{4}$ depending on the determined solution for 1.

This control loop has to be passed through at least once in the time for a point on the wafer $\mathbf{25}_i$ to pass through the scan slot.

It can also be passed through multiply, in particular at least twice, in particular at least three times, in particular at least five times, in particular at least ten times.

The determined values for $y_i$ can be transferred to a second control loop in order to determine new predefined values of the external parameter $p_k$. New predefined values of the external parameter $p_k$ can also be determined directly from the determined values for $y_i$ and are then transferred to a second control loop.

The setting of the new predefined values $p_k$ advantageously takes place in a separate control loop. This is advantageous because new predefined values for the values $y_i$ can emerge from the measurements in the first control loop M at each point in time, but only exactly one value for the external parameter $p_k$ can be set at each point in time.

A sequence of the settings $p_k$ is a set in the second control loop. Between two different settings of the sequence, there is a wait during at least a time corresponding to the mechanical inertia of the means for setting the external parameter p. Advantageously, the duration of the wait is a maximum of 50 times as long, in particular a maximum of 20 times as long, in particular 5 times as long.

The spatial and temporal aspects explained above on the basis of different exemplary embodiments, in particular the division of the separating plane $\mathbf{39}$ into separate regions $\mathbf{43}_i$, that is to say the embodiment of the optical component $\mathbf{42}$, and the division of the collective output beam $\mathbf{8}$ into the individual output beams $\mathbf{10}_i$ via the separating plate $\mathbf{134}$ and $\mathbf{145}$, respectively, can also advantageously be combined with one another. It is possible, in particular, to provide the optical component $\mathbf{42}$ with the properties of the separating plate $\mathbf{134}$ and $\mathbf{145}$, respectively, in addition to the properties described above.

The optical component $\mathbf{42}$ can have in particular an embodiment corresponding to that described with reference to FIG. $\mathbf{17}$. A plan view of a corresponding variant of the optical component $\mathbf{42}$ or of the separating plate $\mathbf{134}$ is illustrated schematically in FIG. $\mathbf{66}$. A local coordinate system corresponding to that illustrated in FIG. $\mathbf{17}$ is used for clarifying positional relationships. In a departure from the above description of the separating plate $\mathbf{134}$, the direction parallel to the displacement direction $\mathbf{139}$ is designated as the y-direction in the description of this variant. The x-direction corresponds to the x-direction from the description of the aspects of how the separating plane $\mathbf{39}$ is divided into the regions $\mathbf{43}_i$ (see, for example, FIGS. 3A to 3F or FIGS. 7A, 7B).

A group of regions $\mathbf{43}_{i,j}=\mathbf{135}_{i,j}$ serves for reflecting a specific one of the individual output beams $\mathbf{10}_i$. The regions $\mathbf{43}_{i,j}=\mathbf{135}_{i,j}$ have in the y-direction an extent that is greater than the corresponding extent of the illumination region $\mathbf{137}$ in this direction. For details, reference should be made to the description above.

The regions $\mathbf{43}_{i,j}=\mathbf{135}_{i,j}$ have a variable extent in the x-direction. The extent of the regions $\mathbf{43}_{i,j}=\mathbf{135}_{i,j}$ in the x-direction varies, in particular, with the position in the y-direction. The extent of the regions $\mathbf{43}_{i,j}=\mathbf{135}_{i,j}$ in the x-direction corresponds at least at predefined positions in the y-direction, in particular over the entire extension thereof in the y-direction, to the above-described division of the separating plane $\mathbf{39}$ into the regions $\mathbf{43}_i$.

The variation of the x-extent of the regions $\mathbf{43}_{i,j}=\mathbf{135}_{i,j}$ with respect to the y-direction corresponds to the above-described variations of the regions $\mathbf{135}_i$ in the direction parallel to the displacement direction $\mathbf{139}$ of the illumination region $\mathbf{137}$.

Such an embodiment of the optical component $\mathbf{42}=\mathbf{134}$ makes it possible firstly to divide the individual output beams $\mathbf{10}_i$ into the separate partial beams $\mathbf{12}_{i,j}$ having different beam paths, and secondly to vary the ratio of the division of the collective output beam $\mathbf{8}$ into the individual output beams $\mathbf{10}_i$ by displacement of the illumination region $\mathbf{137}$ relative to the optical component $\mathbf{42}=\mathbf{134}$.

Further embodiments of a output coupling optical unit are described below on the basis of further exemplary embodiments. Firstly, the general constituent parts of a projection exposure apparatus $\mathbf{201}$ are presented again.

A projection exposure apparatus $\mathbf{201}$ for microlithography is part of a system including a plurality of projection exposure apparatuses, of which FIG. $\mathbf{67}$ illustrates one of the projection exposure apparatuses $\mathbf{201}$. The projection exposure apparatus $\mathbf{201}$ serves for producing a micro- or nano-structured electronic semiconductor component. A light or radiation source $\mathbf{202}$ common to all of the projection exposure apparatuses of the system emits EUV radiation in the wavelength range for example between 2 nm and 30 nm, in particular between 2 nm and 15 nm, for example at 13 nm. The light source $\mathbf{202}$ is embodied as a free electron laser (FEL). This involves a synchrotron radiation source or a synchrontron-radiation-based light source which generates coherent radiation having very high brilliance. Publications that describe such FELs are indicated in WO 2009/121 438 A1. A light source $\mathbf{202}$ which can be used, for example, is described in Uwe Schindler "Ein supraleitender Undulator mit elektrisch umschaltbarer Helizität" ["A superconducting undulator having electrically switchable helicitity"], Karlsruhe Research Centre in the Helmholtz Association, scientific reports, FZKA 6997, August 2004, in US 2007/0152171 A1 and in DE 103 58 225 B3.

In the case of the embodiment as an FEL, the light source $\mathbf{202}$ can have a peak power of 2000 to 2500 MW. The light source $\mathbf{202}$ can be operated in a pulsed fashion. A pulse power can be 280 MW. A pulse duration can be 2 ps (FWHM). A pulse energy can be 0.6 mJ. A pulse repetition rate can be 3 MHz. A cw power or an average pulse power can be 1.7 kW. A relative wavelength bandwidth $\Delta\lambda/\lambda$ can be 0.1%. A typical beam diameter can be in the region of 200 µm. A typical divergence angle of the FEL emission can be in the region of 20 µrad.

The light source 202 has an original etendue that is less than 0.1 mm² in a raw beam. The etendue is the smallest volume of a phase space which contains 90% of the light energy of an emission of a light source. Definitions of etendue that correspond thereto are found in EP 1 072 957 A2 and U.S. Pat. No. 6,198,793 B1, which indicate that the etendue is obtained by multiplication of the illumination data x, y and $NA^2$, where x and y are the field dimensions which span an illuminated illumination field and NA is the numerical aperture of the field illumination. Even smaller etendues of the light source than 0.1 mm² are possible, for example an etendue of less than 0.01 mm².

The EUV light source 202 has an electron beam supply device for generating an electron beam and an EUV generation device. The latter is supplied with the electron beam via the electron beam supply device. The EUV generation device is embodied as an undulator. The undulator can optionally include undulator magnets that are adjustable by displacement. The undulator can include electromagnets. A wiggler can also be provided in the case of the light source 202.

The light source 202 has an average power of 2.5 kW. The pulse frequency of the light source 202 is 30 MHz. Each individual radiation pulse then carries an energy of 83 µJ. Given a radiation pulse length of 100 fs, this corresponds to a radiation pulse power of 833 MW.

A repetition rate of the light source 202 can be in the kilohertz range, for example at 100 kHz, or in the relatively low megahertz range, for example at 3 MHz, in the medium megahertz range, for example at 30 MHz, in the upper megahertz range, for example at 300 MHz, or else in the gigahertz range, for example at 1.3 GHz.

A Cartesian xyz-coordinate system is used below in order to facilitate the illustration of positional relationships. The x-coordinate together with the y-coordinate in these illustrations regularly spans a beam cross section of the EUV illumination and imaging light 203. Correspondingly, the z-direction regularly runs in the beam direction of the illumination and imaging light 203. The x-direction runs vertically for example in FIGS. 67 and 68, that is to say perpendicularly to building planes in which the system of the projection exposure apparatuses 201 is accommodated.

Figure 67:
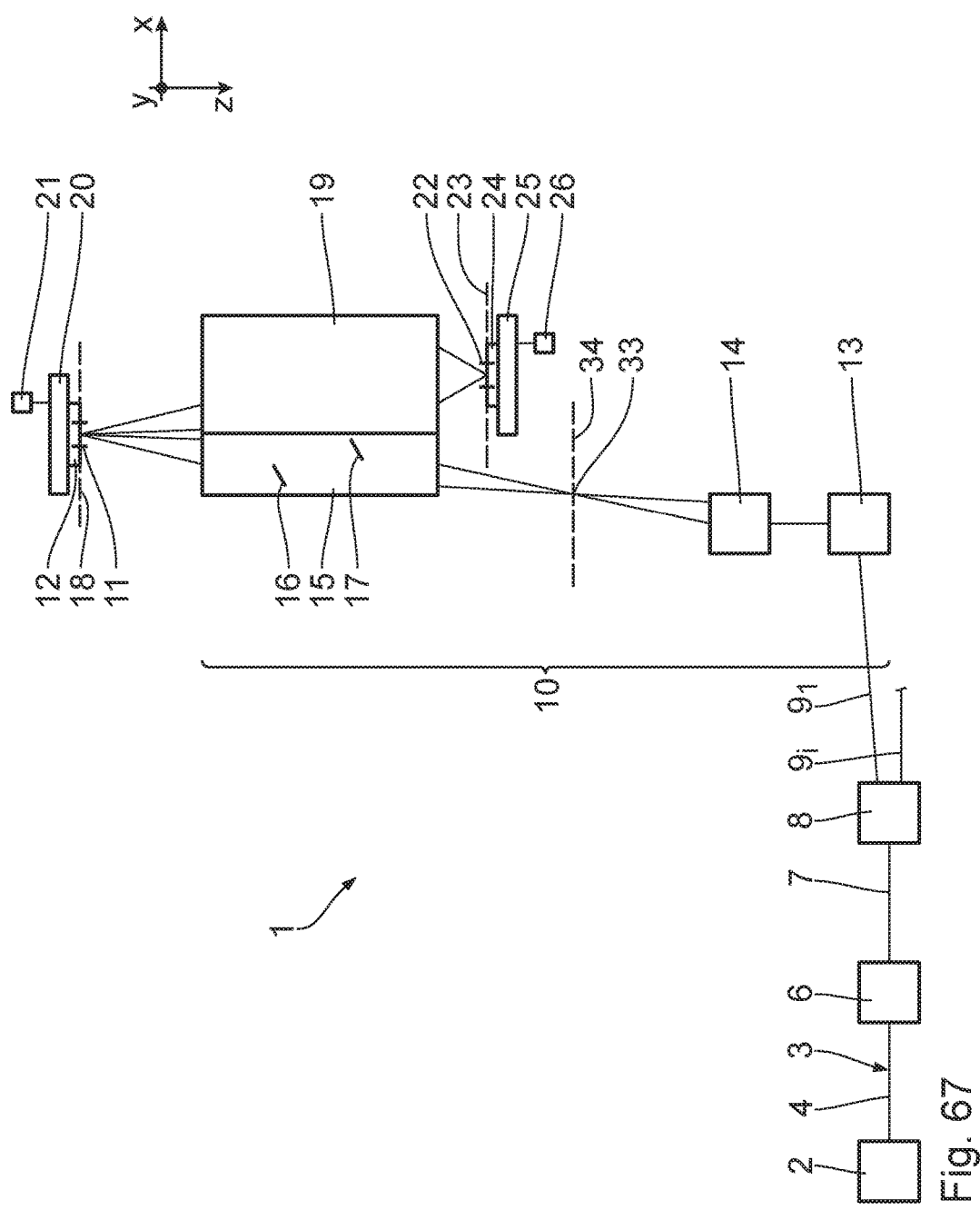

FIG. 67 shows main components of one of the projection exposure apparatuses 201 of the system highly schematically.

The light source 202 emits illumination and imaging light 203 in the form initially of an EUV raw beam 204. The raw beam 204 is generally present as a beam having a Gaussian intensity profile, that is to say as a beam that is round in cross section. The EUV raw beam 204 has a very small beam cross section and a very low divergence.

A beam shaping optical unit 206 (cf. FIG. 67) serves for generating an EUV collective output beam 207 from the EUV raw beam 204. This is illustrated very highly schematically in FIG. 67 and somewhat less highly schematically in FIG. 68. The EUV collective output beam 207 has a very low divergence. The EUV collective output beam 207 has the shape of a homogeneously illuminated rectangle. An x/y aspect ratio of the EUV collective output beam 207 can be N:1, wherein N is the number of projection exposure apparatuses 201 to be supplied by the light source 202 within the system.

Figure 68:
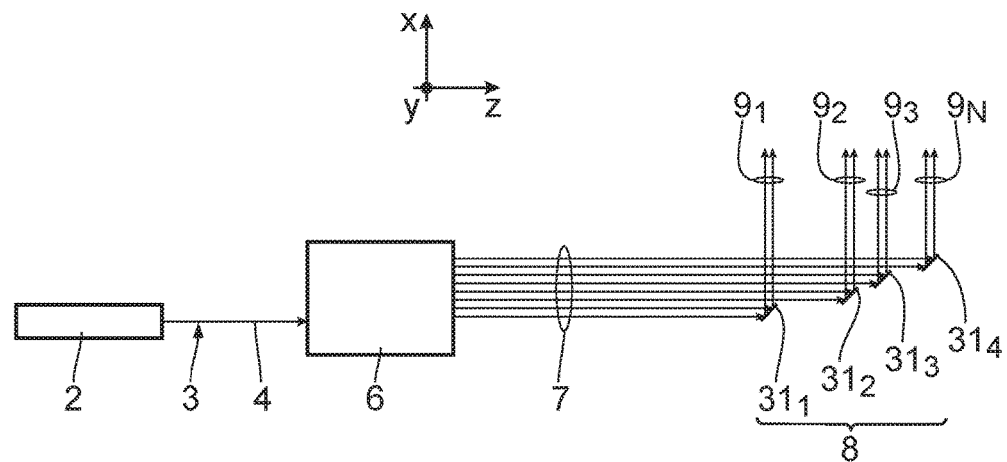

FIG. 68 indicates a system design where N=4, in which the light source 202 therefore supplies four projection exposure apparatuses according to the type of the projection exposure apparatus 201 according to FIG. 67, with the illumination light 203. For N=4, the x/y aspect ratio of the EUV collective output beam 207 is 4:1. Even a smaller aspect ratio N:1 is possible, for example $\sqrt{N}$:1. The number N of projection exposure apparatuses 201 can also be even greater and can be up to 210, for example.

An output coupling optical unit 208 (cf. FIGS. 67 and 68) serves for generating a plurality of, namely N, EUV individual output beams $209_1$ to $209_N$ (i=1, ... N) from the EUV collective output beam 207.

FIG. 67 shows the further guidance of exactly one of the EUV individual output beams 209, namely of the output beam $209_1$. The other EUV individual output beams $209_i$ generated by the output coupling optical unit 208, which is likewise indicated schematically in FIG. 67, are fed to other projection exposure apparatuses of the system.

Downstream of the output coupling optical unit 208, the illumination and imaging light 203 is guided by a beam guiding optical unit 210 (cf. FIG. 67) towards an object field 211 of the projection exposure apparatus 201, there being arranged in the object field a lithography mask 212 in the form of a reticle as object to be projected. Together with the beam guiding optical unit 210, the beam shaping optical unit 206 and the output coupling optical unit 208 constitute an illumination system for the projection exposure apparatus 201.

The beam guiding optical unit 210 includes, in the order of the beam path for the illumination light 203, that is to say for the EUV individual output beam $209_i$, a deflection optical unit 213, an input coupling optical unit in the form of a focusing assembly 214 and a downstream illumination optical unit 215. The illumination optical unit 215 includes a field facet mirror 216 and a pupil facet mirror 217, the function of which corresponds to that known from the prior art and which are therefore merely illustrated extremely schematically and without an associated EUV beam path in FIG. 67.

After reflection at the field facet mirror 216, the used radiation beam of the illumination light 203, the used radiation beam being divided into EUV sub-beams assigned to individual field facets (not illustrated) of the field facet mirror 216, impinges on the pupil facet mirror 217. Pupil facets (not illustrated in FIG. 67) of the pupil facet mirror 217 are round. One of the pupil facets is assigned to each sub-beam of the used radiation beam that is reflected from one of the field facets, such that a pair of facets impinged on and including one of the field facets and one of the pupil facets in each case predefines an illumination channel or beam guiding channel for the associated sub-beam of the used radiation beam. The channel-by-channel assignment of the pupil facets to the field facets is effected depending on a desired illumination by the projection exposure apparatus 201. The illumination light 203 is therefore guided for predefining individual illumination angles along the illumination channel sequentially via pairs including a respective one of the field facets and a respective one of the pupil facets. For driving respectively predefined pupil facets, the field facets of the field facet mirror 216 are in each case individually tilted.

Via the pupil facet mirror 217 and, if appropriate, via a downstream transfer optical unit consisting of, for example, three EUV mirrors (not illustrated), the field facets are imaged into the illumination or object field 211 in a reticle or object plane 218 of a projection optical unit 19 (likewise illustrated schematically in FIG. 67) of the projection exposure apparatus 201.

From the individual illumination angles that are brought about via all the illumination channels via an illumination of the field facets of the field facet mirror 216, there results an illumination angle distribution of the illumination of the object field 211 by the illumination optical unit 215.

In a further embodiment of the illumination optical unit 215, in particular given a suitable position of an entrance pupil of the projection optical unit 219, it is also possible to dispense with the mirrors of the transfer optical unit upstream of the object field 211, which leads to a corresponding increase in the transmission of the projection exposure apparatus 201 for the used radiation beam.

The reticle 212, which reflects the used radiation beam, is arranged in the object plane 218 in the region of the object field 211. The reticle 212 is carried by a reticle holder 220, which is displaceable in a manner driven via a reticle displacement drive 221.

The projection optical unit 219 images the object field 211 into an image field 222 in an image plane 223. During the projection exposure, a wafer 224 is arranged in the image plane 223, the wafer bearing a light-sensitive layer which is exposed during the projection exposure by the projection exposure apparatus 201. The wafer 224 is carried by a wafer holder 225, which is in turn displaceable in a manner controlled via a wafer displacement drive 226.

During the projection exposure, both the reticle 212 and the wafer 224 in FIG. 67 are scanned in a synchronized manner in the x-direction by corresponding driving of the reticle displacement drive 221 and of the wafer displaceable drive 226. The wafer is scanned at a scan rate of typically 600 mm/s in the x-direction during the projection exposure.

FIGS. 68 to 75 show examples of the output coupling optical unit for generating the EUV individual output beams 209 from the EUV collective output beam 207. The output coupling optical unit has, as output coupling components, a plurality of output coupling mirrors $231_1$, $231_2$, ..., which are assigned to the EUV individual output beams $209_1$, $209_2$, ... and couple the latter out from the EUV collective output beam 207.

FIG. 68 shows an arrangement of the output coupling mirrors 231 of the output coupling optical unit 208 such that the illumination light 203 is deflected by 90° via the output coupling mirrors 231 during the output coupling. Preference is given to an embodiment in which the output coupling mirrors 231 are operated with grazing incidence of the illumination light 203 as shown schematically in FIG. 69, for example. In the embodiment according to FIG. 69, an angle α of incidence of the illumination light 203 on the output coupling mirrors 231 is approximately 70°, but can also be even significantly above that and be in the region of 85°, for example, such that an effective deflection of the EUV individual output beam 209 by the respect output coupling mirror 231 in comparison with the direction of incidence of the EUV collective output beam 207 is 10°. The effective deflection can be at least 1° or else at least 5°, depending on the embodiment. The output coupling mirror 231 is therefore embodied as a GI mirror (grazing incidence mirror).

Each of the output coupling mirrors $231_i$ is thermally coupled to a heat sink (not illustrated in more detail).

Figure 69:
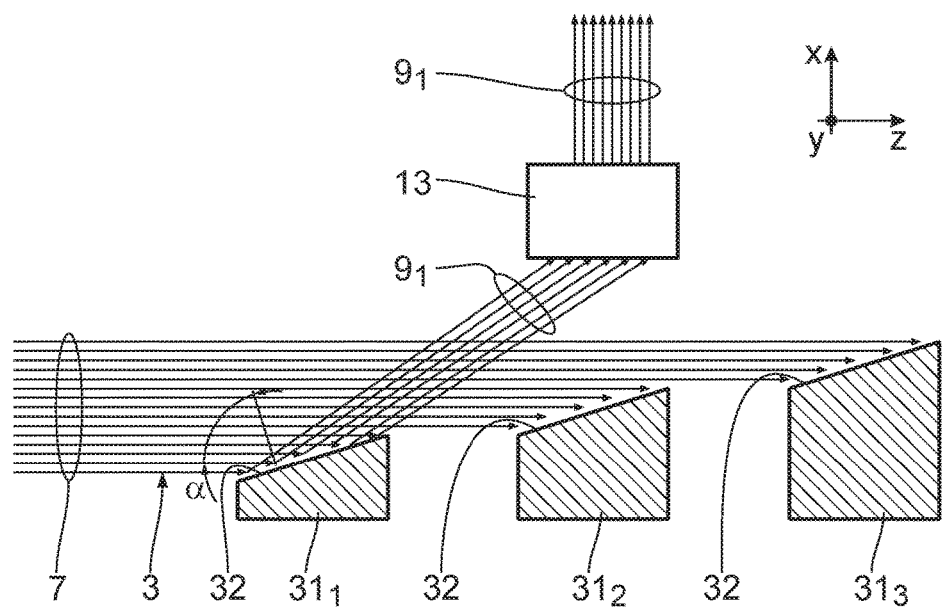
FIG. 69 shows less schematically than in FIGS. 67 and 68 an EUV beam path between the beam shaping optical unit and a deflection optical unit as part of a beam guiding optical unit for guiding the respective EUV individual output beam towards the object field, wherein the deflection optical unit is disposed downstream of the output coupling optical unit in the beam path of the EUV individual output beam.
Figure 70:
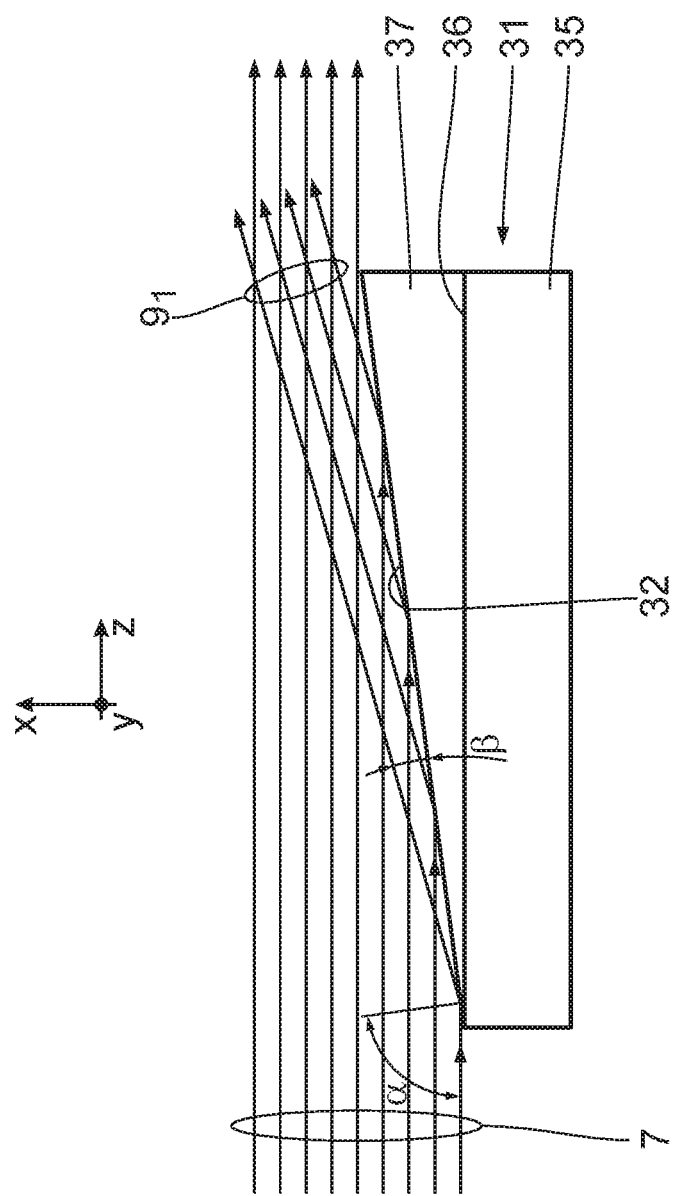
FIG. 70 shows one embodiment of the output coupling optical unit including an oscillation surface which is in embodied as a reflection surface and which is operatively connected to an oscillation drive, FIGS. 71 and 72 further embodiments of the output coupling optical unit including an oscillation surface embodied as a reflection surface.

FIG. 68 shows an output coupling optical unit 208 having a total of four output coupling mirrors $231_1$ to $231_4$. FIG. 69 shows a variant of the output coupling optical unit 208 having a total of three output coupling mirrors $231_1$ to $231_3$. FIG. 70 shows one of the output coupling mirrors 231 in a variant of the output coupling optical unit 208 having a total of two output coupling mirrors 231, one of which is illustrated. A different number N of output coupling mirrors 231 is also possible, depending on the number N of projection exposure apparatuses 1 to be supplied by the light source 202, for example N=2 or N≥4, in particular N≥8.

After the output coupling, each of the EUV individual output beams 209 has an x/y aspect ratio of, for example, 1:1. A different x/y aspect ratio, for example of √N:1, is also possible.

The output coupling mirrors $331_i$(i=1, 2, ...) are arranged in the beam path of the EUV collective output beam 207 in an offset manner one behind another in the beam direction of the EUV collective output beam 207 such that the respective closest output coupling mirror $231_i$ reflects a marginal cross-sectional proportion of the EUV collective output beam 207 and thereby couples out the cross-sectional proportion as EUV individual output beam $209_i$ from the remaining EUV collective output beam 207 flying past the output coupling mirror $231_i$. This output coupling from the edge is repeated by the following output coupling mirrors $231_{i+1}$, ..., until the last still remaining cross-sectional proportion of the EUV collective output beam 207 is coupled out.

Relative to the energy of the EUV collective output beam 207, the individual EUV individual output beams $209_i$ can carry a proportion of between 1% and 50% of this total energy.

In the cross section of the EUV collective output beam 207, a separation between the cross-sectional proportions assigned to the EUV individual output beams $209_i$ is carried out along separating planes running parallel to the yz-plane. The separation of the EUV individual output beams $209_i$ can be carried out in such a way that the cross-sectional proportion which is furthest away from the next optical component in the beam path, that is to say the next component of the deflection optical unit 213, is cut off in each case. This facilitates, inter alia, driving and/or cooling of the output coupling optical unit 208, in particular from a side opposite reflection surfaces 232 of the output coupling mirrors 231, that is to say from the rear side of the output coupling mirrors 231.

The deflection optical unit 213 situated downstream of the output coupling optical unit 208 in the beam path of the illumination light 203 serves firstly for deflecting the EUV individual output beams 209 in such a way that the latter in each case have a vertical beam direction downstream of the deflection optical unit 213, and secondly for adapting the x/y aspect ratio of the EUV individual output beams 209. The adapted x/y aspect ratio can be the aspect ratio of the rectangular or object-shaped object field 211, can be the aspect ratio of a first optical element of the illumination optical unit 215 or can be the aspect ratio of the aperture angles of the illumination light 203 at an intermediate focus 233 upstream of the illumination optical unit 215 in an intermediate focal plane 234 (cf. FIG. 67).

For the case where a vertical beam path of the EUV individual output beams 209 is already present downstream of the output coupling optical unit 208, a deflecting effect of the deflection optical unit 213 can be dispensed with and the adaptation effect with regard to the x/y aspect ratio of the EUV individual output beams 209 suffices.

The EUV individual output beams 209 downstream of the deflection optical unit 213 can pass in such a way that, if appropriate after passing through a focusing assembly 214, they are incident in the illumination optical unit 215 at an angle, wherein this angle allows an efficient folding of the illumination optical unit. Downstream of the deflection optical unit 213, the EUV individual output beam $209_i$ can pass at an angle of 0° to 10° with respect to the perpendicular, at an angle of 10° to 20° with respect to the perpendicular, or at an angle of 20° to 30° with respect to the perpendicular.

An optical surface of the output coupling mirror 231, that is to say the respective reflection surface 232 of the output coupling mirror 231 in the case of the embodiments of the output coupling optical unit 208 including a plurality of output coupling mirrors 231, is embodied as an oscillation surface. The reflection surface 232 of the respective output coupling mirror 231 is operatively connected to an oscillation drive, whereby the reflection surface 232 is caused to effect oscillations or vibrations.

FIG. 70 shows an embodiment of the output coupling mirror 231 in which the oscillation drive is embodied as a coupling body 235, which is coupled to a mirror body 237 of the output coupling mirror 231 via a coupling surface 236.

The angle α of incidence is 82° in the case of the output coupling mirror 231 according to FIG. 70. The mirror body 237 is of wedge-shaped design and has a wedge angle β of 8° corresponding to the angle α of incidence.

Depending on the embodiment of the output coupling mirror 231 according to FIG. 70, the coupling body 235 that constitutes the oscillation drive, can be embodied as a piezo-component or as an acousto-optical modulator.

During operation, the oscillation drive 235 brings about an oscillating deformation within the reflection surface 232, that is to say the oscillation surface. The oscillating deformation can be a standing wave and/or a travelling wave. The oscillation frequencies of the oscillating deformation of the oscillation surface 232 can be in the range of between 50 Hz and 10 kHz or higher and can be at least 100 Hz or else at least 1 kHz. An upper limit of the oscillation frequency is given, for example, by a repetition rate of the light source 202 and can be in the range of between 100 MHz and 1.3 GHz. An effective deflection angle for the EUV individual output beams 209 which is brought about by the oscillating deformation of the reflection surface 232 can be in the range of μrad to, for example, in the range of mrad.

Figure 71:
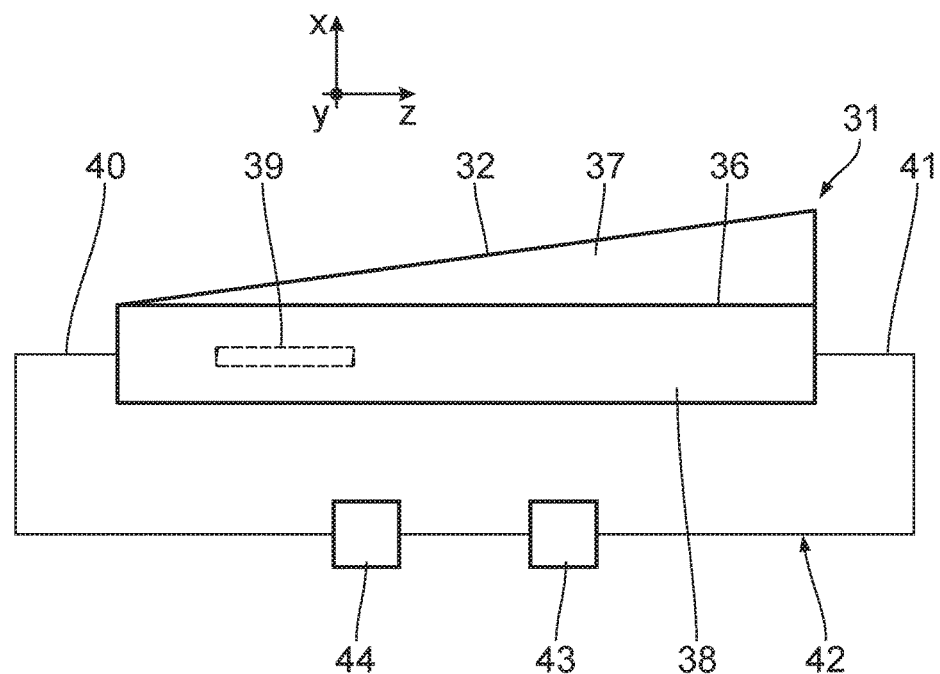

FIG. 71 shows a further embodiment for one of the output coupling mirrors 231 of the output coupling optical unit 208. Components corresponding to those which have been described above with reference to the embodiments already explained bear the same reference numerals and will not be discussed in detail again.

A heat sink 238 is coupled to the mirror body 237 of the output coupling mirror 231 according to FIG. 71 via the coupling surface 236. The heat sink includes a plurality of fluid channels 239, of which a channel section is merely indicated by dashed lines in FIG. 71. The heat sink 238 is connected to a fluid circuit 242 for a heat transfer fluid, for example for water, via a fluid feed line 240 and a fluid discharge line 241. A different liquid or a gas can also be used as heat transfer fluid. Furthermore, a heat exchanger 243 and a circulating pump 244 are arranged in the fluid circuit 242.

As a result of the circulation of the heat transfer fluid through the fluid circuit 242 and the flow of the heat transfer fluid through the fluid channels 239, the heat sink 238 is caused to oscillate in a targeted manner. Alternatively or additionally, pressure fluctuations or pressure waves in the heat transfer fluid can bring about a targeted oscillation of the heat sink 238. A frequency and an amplitude of the oscillation of the heat sink 238 can be predefined via a geometrical design of the fluid channels 239 and via a flow of the heat transfer fluid through the fluid channels 239. During the operation of the fluid circuit 242, therefore, via the heat sink 238 the mirror body 237 coupled thereto, and hence the reflection surface 232, is caused to oscillate. The explanation given above in connection with the embodiment according to FIG. 70 holds true for the oscillation frequencies.

In the case of the embodiment according to FIG. 71, the entire fluid circuit 242 is the oscillation drive for the reflection surface 232. The oscillation drive is formed by a hydraulic drive.

Figure 72:
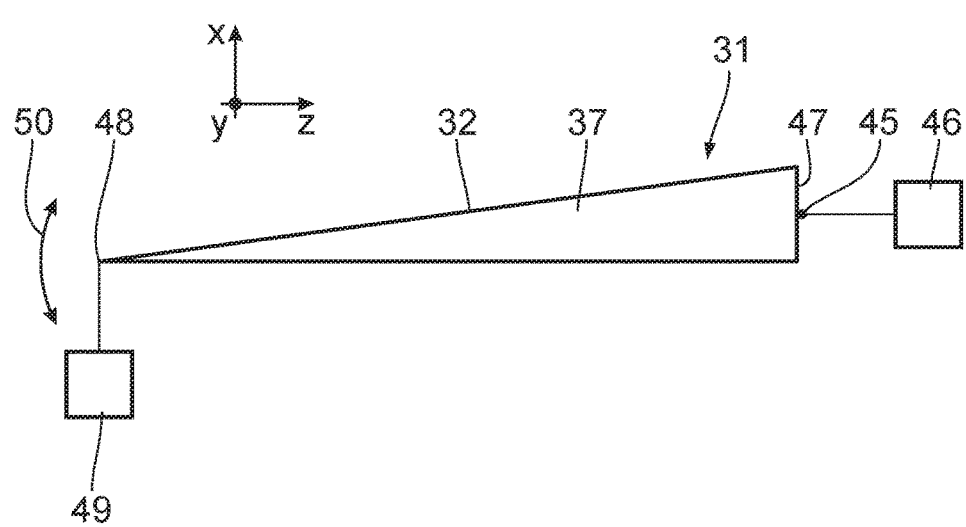

FIG. 72 shows a further variant of the output coupling mirror 231. Components corresponding to those which have been described above with reference to the embodiments already explained bear the same reference numerals and will not be discussed in detail again.

The mirror body 237 of the output coupling mirror 231 according to FIG. 72 is connected to a fixed frame body 246 in an articulated fashion via an articulated joint having an articulated joint axis 245 parallel to the y-direction. This articulated joint connection is effected via a cathetus surface 247 of the wedge-shaped mirror body 237. At the opposite wedge tip 248 of the mirror body 237, an oscillation body 249 is mechanically coupled to the mirror body 237. During the operation of the oscillation body 249, the entire mirror body 237 oscillates about the articulated joint axis 245, as indicated by a double-headed arrow 250 in FIG. 72. The articulated joint axis 245 thus represents a tilting axis for the mirror body 237.

Figure 73:
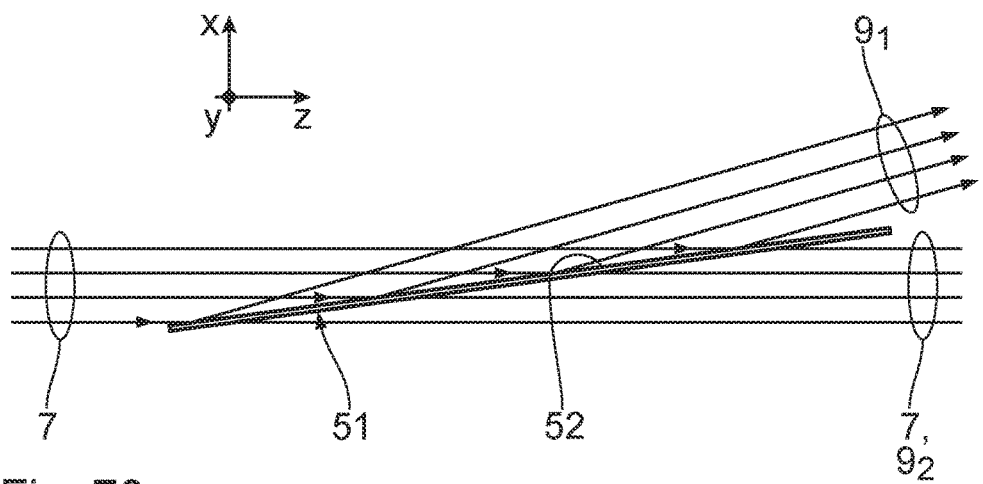
FIGS. 73 to 75 show further embodiments of the output coupling optical unit including an oscillation surface embodied as an refractive surface.

FIG. 73 shows a further embodiment of an output coupling element 51 which can be used instead of one of the output coupling mirrors 231 of the embodiments according to FIGS. 68 to 72. The output coupling element 251 is embodied in the manner of a beam splitter and splits the incident EUV collective output beam 207 into a reflected EUV individual output beam $209_1$ and a transmitted EUV output beam, which, depending on the embodiment of the output coupling optical unit to which the output coupling beam splitter 251 belongs, can be an EUV collective output beam 207 to be split even further or a further EUV individual output beam $209_2$ used without further output coupling.

The EUV individual output beam $209_1$ once again carries an energy in the range of between 1% and 50% of the entire EUV collective output beam 207.

A partial reflection surface 252 of the beam splitter output coupling element 251 is once again embodied as an oscillation surface that is operatively connected to an oscillation drive. In principle, use can be made here of those oscillation drives which have already been explained above in association with the output coupling mirror 231 with reference to FIGS. 70 to 72.

The respective oscillation drive once again brings about an oscillating deformation within the partial reflection surface 252, that is to say the oscillation surface. The oscillating deformation can be a standing wave and/or a travelling wave within the partial reflection surface 252.

Further exemplary embodiments of oscillation drives of the partial reflection surface 252 of the output coupling element 251 will be described with reference to FIGS. 74 and 75. Components corresponding to those which have been described above with reference to the embodiments already explained bear the same reference numerals and will not be discussed in detail again.

Figure 74:
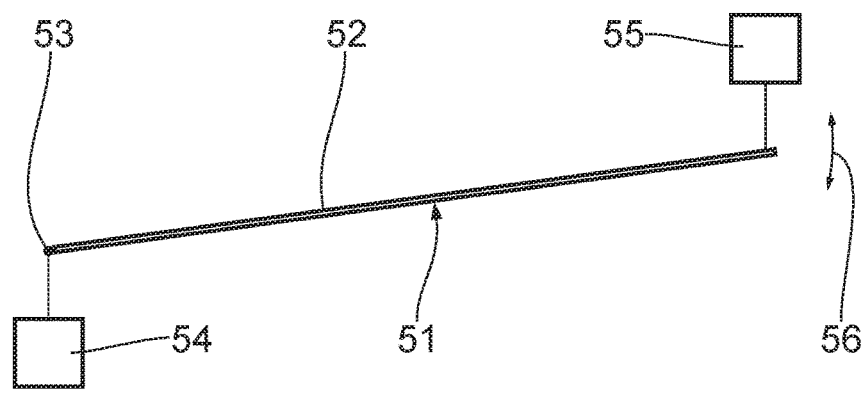

In the case of the oscillation drive according to FIG. 74, the output coupling element 251 is once again connected to a frame body 254 via an articulated joint having an articulated joint axis 253. In this case, the articulated joint 253 is arranged in the region of a leading end face of the output coupling element 251, such that neither the articulated joint 253 or the frame body 254 has a disturbing blocking effect for the incident EUV collective output beam 27.

An end region of the output coupling element 251 situated opposite the articulated joint 253 is mechanically operatively connected to an oscillation body 255. During the operation of the oscillation body 255, the entire output coupling element 251, that is to say including the partial reflection surface 252, is tilted about the articulated joint axis 253 in an oscillating manner, as indicated by a double-headed arrow 256 in FIG. 74.

Figure 75:
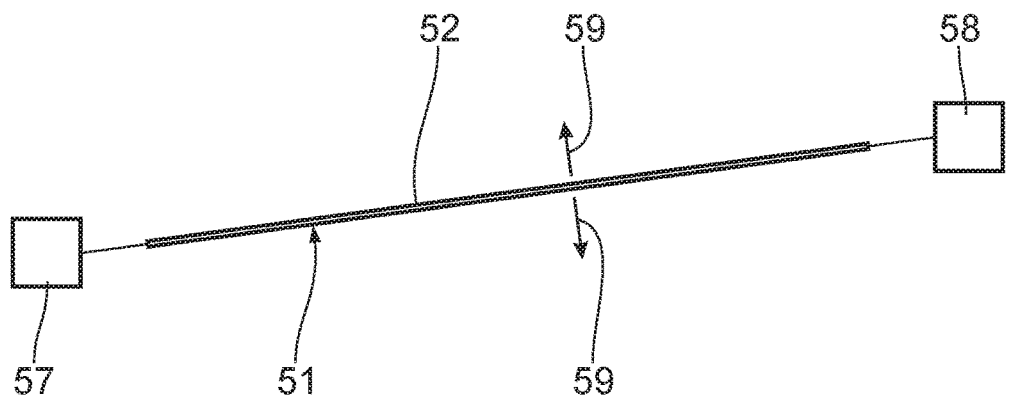

FIG. 75 shows a variant in which the output coupling element 251 is clamped in at the end side in each case between two bodies 257, 258. In this case, at least one of the bodies 257, 258 is an oscillation body for exciting oscillations of the beam splitter output coupling element 251, that is to say in particular of the partial reflection surface 52 thereof. Such oscillations are indicated by arrows 259 in FIG. 75. In this case, once again standing or travelling waves can be excited in the partial reflection surface 252 by at least one of the bodies 257, 258. In one embodiment according to FIG. 75, both of the bodies 257, 258 are oscillation bodies. In another embodiment, the body 257 is an oscillation body and the body 258 is a fixed frame body. In a third embodiment, the body 257 is a fixed frame body and the body 258 is an oscillation body.

On account of the oscillation of the oscillation surface 232 or 252, averaged over time this results in a beam homogenization during the illumination of the object field 211 and thus in a reduction of speckle with the use of a coherent EUV collective output beam 27.

Figure 76:
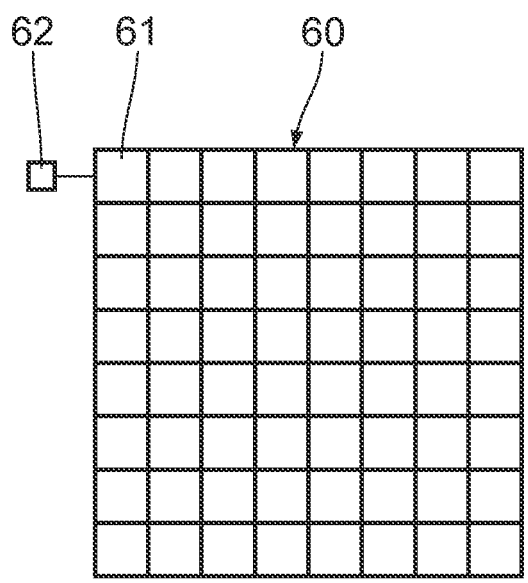
FIG. 76 shows a plan view of a further embodiment of an oscillation surface embodied as a reflection surface and including a plurality of individual mirrors.

FIG. 76 shows a further embodiment of an optical surface 260 embodied as an oscillation surface, the optical surface being embodied as a mirror array. The oscillation surface 260 can be used instead of the oscillation surfaces already explained above, for example instead of the oscillation surfaces 232 or 253.

The oscillation surface 260 is embodied as a mirror array including a plurality of individual mirrors 261. Each of the individual mirrors 261 is operatively connected to an individual actuator 262, which is indicated schematically for one of the individual mirrors 261 in FIG. 76. The actuators 262 for the individual mirrors 261 jointly constitute the oscillation drive for the oscillation surface 260. Single individual mirrors 261 driven in an oscillating fashion via their actuators 262 or else groups of individual mirrors 261 correspondingly driven in an oscillating fashion can be used for the oscillation drive of the oscillation surface 260. For this purpose, groups of individual mirrors 261 can be driven via a common oscillation drive. The oscillation surface 260 can therefore have at least one oscillating partial surface. The entire oscillation surface 260 with all the individual mirrors 261 can also be driven in an oscillating fashion via a common oscillation drive.

Embodiments of a mirror array, in particular as an MEMS array, and corresponding mirror drives are known from WO 2013/160 256 A1, from WO 2012/130 768 A2 and from WO 2009/100 856 A1.

The oscillation drives explained above can also be operated in combination.

During the production of a micro- or nanostructured component via the projection exposure apparatus 201, firstly the reticle 212 and the wafer 224 are provided. Afterwards, a structure on the reticle 212 is projected onto a light-sensitive layer of the wafer 224 with the aid of the projection exposure apparatus 201. Via the development of the light-sensitive layer, a micro- or nanostructure is produced on the wafer 224 and the micro- or nanostructured component is thus produced, for example a semiconductor component in the form of a memory chip.

All details of the different exemplary embodiments can be combined with one another in any desired manner. It is possible, in particular, to combine the details of the different oscillation drives with the different embodiments of the optical component 42 for coupling out at least one individual output beam $10_i$ and/or with a device for periodically varying the division ratio in the total intensity of the collective output beam 8 into the individual intensities of the individual output beams $10_i$.

What is claimed is:

1. An optical component configured to be used in a radiation source module of a projection exposure system, the projection exposure system comprising a plurality of scanners, the optical component configured to couple out from a collective output beam at least one individual output beam, the individual output beam comprising a plurality of spatially separated partial beams assigned to a specific scanner, the optical component comprising:
    a plurality of separate radiation-reflecting regions grouped so that, in a group of radiation-reflecting regions, the radiation-reflecting regions guide the partial beams of one of the individual output beams to a scanner,
    wherein, for each group, the radiation-reflecting regions of the group are non-connected.

2. The optical component of claim 1, wherein, in each case, at least two of the regions of a group have surface areas which differ by a factor of at least three.

3. The optical component of claim 2, wherein, for each group, the group comprises from three to 20 regions.

4. The optical component of claim 1, wherein, for each group, the group comprises from three to 20 regions.

5. The optical component of claim 1, wherein:
    at least two of the regions belong to different groups;
    the regions of different groups are configured to: i) couple out different individual output beams; and ii) to guide the different individual output beams to different scanners.

6. The optical component of claim 5, wherein, in each case, at least two of the regions of a group have surface areas which differ by a factor of at least three.

7. The optical component of claim 6, wherein, for each group, the group comprises from three to 20 regions.

8. The optical component of claim 5, wherein, for each group, the group comprises from three to 20 regions.

9. The optical component of claim 1, wherein, between at least two regions, there is an interspace that is transmissive to partial beams of at least one individual output beam.

10. The optical component of claim 1, wherein the regions are strip-shaped, and at least one region has an aspect ratio of at least 20:1.

11. A unit, comprising:
    an optical component according to claim 1,
    wherein the unit is an output coupling unit.

12. An illumination device configured to transfer illumination radiation to a plurality of separate object fields, the illumination device comprising:
    an output coupling unit comprising an optical component according to claim 1.

13. A module configured to supply a plurality of scanners of a projection exposure system with illumination radiation, the module comprising:
- a radiation source configured to generate a collective output beam; and
- an output coupling unit comprising an optical element according to claim 1.

14. The module of claim 13, wherein the output coupling optical unit is configured so that intensity distributions of all of the individual output beams which are guided in each case to different object fields, given a known fluctuation range of the collective output beam emitted by the radiation source, have fluctuations which are smaller than a predefined maximum value.

15. An illumination system for a projection exposure system which comprises a plurality of scanners, the illumination system comprising:
- a radiation source configured to generate a collective output beam; and
- an output coupling unit comprising an optical element according to claim 1.

16. The illumination system of claim 15, wherein the regions are configured so that fluctuations of an intensity of the individual output beams which can occur due to fluctuations of a nominal illumination generated by the collective output beam on the optical component are compensated for up to an order L.

17. A projection exposure system, comprising:
- an illumination system, comprising:
  - a radiation source configured to generate a collective output beam; and
  - an output coupling unit comprising an optical element according to claim 1; and
- a plurality of projection optical units.

18. A method, comprising:
using a projection exposure system to illuminate a reticle and to project at least a section of the illuminated reticle onto a light-sensitive material,
wherein the projection exposure system comprises:
- an illumination system, comprising:
  - a radiation source configured to generate a collective output beam; and
  - an output coupling unit comprising an optical element according to claim 1; and
- a plurality of projection optical units.

19. A method, comprising:
- providing an intensity profile of a collective output beam;
- determining a nominal intensity distribution associated with the intensity profile in a region of an optical component comprising a plurality of separate radiation-reflecting regions;
- defining maximum possible fluctuations of the intensity profile;
- determining changes in the intensity distribution associated with the maximum possible fluctuations of the intensity profile in the region of the optical component; and
- determining an embodiment of regions of groups of the radiation-reflection regions depending on the changes so that for each group a fluctuation of a total intensity reflected by the group, even upon an occurrence of the maximum possible fluctuations of the intensity profile, is at most of a magnitude as a predefined permissible maximum value.

20. A method, comprising:
- providing an intensity profile of a collective output beam;
- determining a nominal intensity distribution associated with the intensity profile in a region of an optical component comprising a plurality of separate radiation-reflecting regions;
- determining changes in the intensity distribution associated with possible fluctuations of the intensity profile in the region of the optical component;
- defining an order L which is to be corrected and up to which changes in the intensity distribution are to be corrected;
- determining first L derivatives of the intensity distribution in the region of the optical component depending on the fluctuations;
- determining a disjoint set of regions of groups of radiation-reflecting regions so that for each group an integral over each of the L derivatives over the set of the regions is at most of a magnitude as a predefined limit value $I_k, |I_k| < 0.1 \cdot k! \cdot 2^k I_0$,
wherein $I_k$ denotes an integral of the k-th derivative over all the regions of the i-th group, and $I_0$ denotes an integral of the intensity distribution over all the regions of the i-th group.

* * * * *